US010186638B2

(12) United States Patent
Kim et al.

(10) Patent No.: US 10,186,638 B2
(45) Date of Patent: Jan. 22, 2019

(54) LIGHT EMITTING ELEMENT

(71) Applicant: SEOUL VIOSYS CO., LTD., Ansan-si (KR)

(72) Inventors: Ye Seul Kim, Ansan-si (KR); Kyoung Wan Kim, Ansan-si (KR); Sang Hyun Oh, Ansan-si (KR); Duk Il Suh, Ansan-si (KR); Sang Won Woo, Ansan-si (KR); Ji Hye Kim, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 32 days.

(21) Appl. No.: 15/405,031

(22) Filed: Jan. 12, 2017

(65) Prior Publication Data

US 2017/0125640 A1  May 4, 2017

Related U.S. Application Data

(63) Continuation-in-part of application No. PCT/KR2016/004636, filed on May 3, 2016.

(30) Foreign Application Priority Data

May 13, 2015 (KR) .................. 10-2015-0066878
May 29, 2015 (KR) .................. 10-2015-0076455
Oct. 27, 2015 (KR) .................. 10-2015-0149532

(51) Int. Cl.
*H01L 33/44* (2010.01)
*H01L 33/06* (2010.01)
(Continued)

(52) U.S. Cl.
CPC ............ *H01L 33/44* (2013.01); *H01L 33/06* (2013.01); *H01L 33/145* (2013.01); *H01L 33/24* (2013.01);
(Continued)

(58) Field of Classification Search
USPC ........................................... 257/13, 48
See application file for complete search history.

(56) References Cited

U.S. PATENT DOCUMENTS 6,573,537 B1   6/2003  Steigerwald et al.
2010/0032694 A1*  2/2010  Kim ..................... H01L 33/42
                                                      257/88
(Continued)

FOREIGN PATENT DOCUMENTS

KR   1020040074328 A    8/2004
KR    100787171 B1    12/2007
(Continued)

OTHER PUBLICATIONS

Korean Intellectual Property Office, International Search Report, International Application No. PCT/KR2016/004636, dated Aug. 10, 2016, 2 pages.

*Primary Examiner* — Moazzam Hossain
*Assistant Examiner* — Lawrence C Tynes, Jr.
(74) *Attorney, Agent, or Firm* — Perkins Coie LLP

(57) ABSTRACT

A light-emitting element according to an embodiment of the present document has a transparent electrode having an opening, and the transparent electrode has a protrusion on a side surface of the opening. A second electrode pad is arranged on the opening of the transparent electrode, and abuts the protrusion. Accordingly, peeling of the second electrode pad can be prevented, thereby improving the reliability of the light-emitting element.

23 Claims, 54 Drawing Sheets

(51) Int. Cl.
*H01L 33/32* (2010.01)
*H01L 33/38* (2010.01)
*H01L 33/42* (2010.01)
*H01L 33/62* (2010.01)
*H01L 33/14* (2010.01)
*H01L 33/24* (2010.01)
*F21K 9/66* (2016.01)
*F21K 9/238* (2016.01)
*F21K 9/232* (2016.01)
*F21S 41/143* (2018.01)
*F21S 45/47* (2018.01)
*F21V 8/00* (2006.01)
*G02F 1/1335* (2006.01)
*H01L 27/15* (2006.01)
*H01L 33/22* (2010.01)
*F21S 45/43* (2018.01)

(52) U.S. Cl.
CPC .............. *H01L 33/32* (2013.01); *H01L 33/38* (2013.01); *H01L 33/42* (2013.01); *H01L 33/62* (2013.01); *F21K 9/232* (2016.08); *F21K 9/238* (2016.08); *F21K 9/66* (2016.08); *F21S 41/143* (2018.01); *F21S 45/43* (2018.01); *F21S 45/47* (2018.01); *G02B 6/0073* (2013.01); *G02F 1/133603* (2013.01); *G02F 1/133606* (2013.01); *H01L 27/156* (2013.01); *H01L 33/22* (2013.01)

(56) References Cited

U.S. PATENT DOCUMENTS

2014/0175465 A1* 6/2014 Lee .................. H01L 33/62
                                                    257/88
2014/0225062 A1* 8/2014 Weng ................ H01L 33/32
                                                    257/13

FOREIGN PATENT DOCUMENTS

KR   1020140146957 A   12/2014
KR   1020150004139 A   1/2015

* cited by examiner

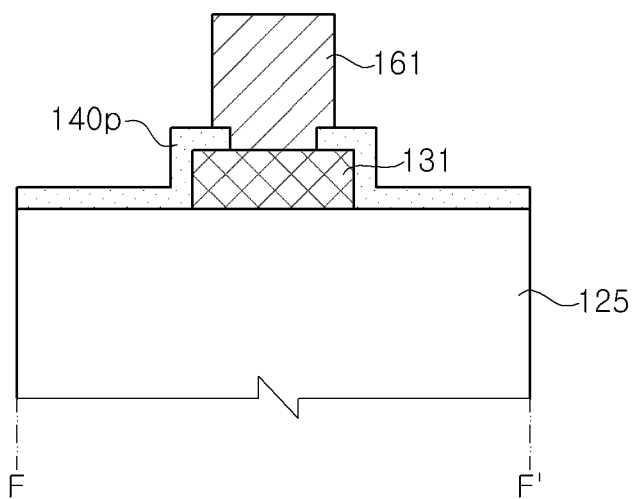
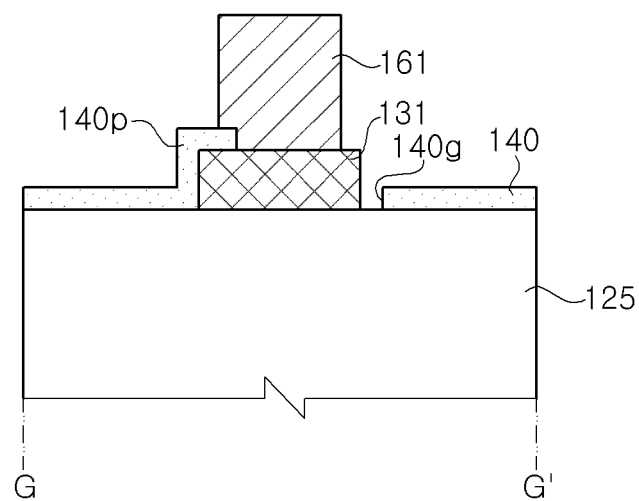

LIGHT EMITTING ELEMENT

CROSS-REFERENCE TO RELATED APPLICATIONS

This patent document is a continuation-in-part of and claims priorities to, and benefits of, International Patent Application No. PCT/KR2016/004636, filed on May 3, 2016, which claims priorities to, and benefits of, Korean Patent Application No. 10-2015-0066878, filed on May 13, 2015, Korean Patent Application No. 10-2015-0076455, filed on May 29, 2015, and Korean Patent Application No. 10-2015-0149532, filed on Oct. 27, 2015, which are hereby incorporated by reference for all purposes as if fully set forth herein.

TECHNICAL FIELD

Exemplary embodiments of the present disclosure relate to a light emitting element, and more particularly, a light emitting element including electrodes.

BACKGROUND

In a light emitting element using a nitride-based semiconductor, a nitride-based p-type semiconductor layer has lower electrical conductivity than an n-type semiconductor layer. As a result, electric current is not effectively spread in the p-type semiconductor layer in the horizontal direction, thereby causing current crowding at a specific portion of the semiconductor layer. If electric current is concentrated in the semiconductor layer, a light emitting diode can become susceptible to electrostatic discharge and can suffer from current leakage and efficiency drooping.

By uniformly distributing electric current in the entire light emitting region, the light emitting element can have improved luminous efficacy while reducing heat generation due to current crowding, thereby improving lifetime and reliability of the light emitting element.

Thus, a technique of forming a transparent electrode such as ITO and a current blocking layer on a p-type semiconductor layer in order to efficiently spread electric current has been disclosed in the related art. However, there is a limit in uniformly spreading electric current to the entire p-type semiconductor layer with only the current blocking layer and the transparent electrode. In addition, when a wire is bonded to a p-type electrode, the wire can be disconnected or the p-type electrode can be peeled off due to poor adhesion between the transparent electrode and the p-type electrode. As a result, the light emitting element has a high defect ratio due to defects around the p-type electrode and suffers from deterioration in reliability and production yield.

Moreover, various techniques have been disclosed for arranging a p-type electrode and an n-type electrode each having an electrode pad and an electrode extension in various ways in order to efficiently spread electric current upon operation of the light emitting element. However, due to light loss caused by absorption of light into the electrodes, there is a limitation in increasing current spreading efficiency through change of electrode arrangement.

SUMMARY

Exemplary embodiments of the present disclosure provide a light emitting element having a structure capable of uniformly spreading electric current throughout a light emitting region.

Exemplary embodiments of the present disclosure provide a light emitting element that can minimize reduction in reliability of the light emitting element due to defects in electrodes, particularly, electrode pads.

Exemplary embodiments of the present disclosure provide a light emitting element having high reliability against defects and electric short due to electrostatic discharge.

Exemplary embodiments of the present disclosure provide a light emitting element having a structure capable of uniformly spreading electric current throughout a light emitting region and capable of preventing light loss due to a structure for improving current spreading.

In accordance with one aspect of the present disclosure, a light emitting element includes: a first conductive type semiconductor layer; a mesa disposed on the first conductive type semiconductor layer and including an active layer and a second conductive type semiconductor layer disposed on the active layer; a current blocking layer partially disposed on the mesa; a transparent electrode disposed on the mesa to cover the current blocking layer and including an opening at least partially exposing the current blocking layer; an insulation layer partially disposed on the mesa; a first electrode disposed on the insulation layer to be insulated from the second conductive type semiconductor layer and including a first electrode pad and a first electrode extension extending from the first electrode pad; and a second electrode disposed on the current blocking layer and including a second electrode pad disposed on the opening of the transparent electrode and a second electrode extension extending from the second electrode pad, wherein the transparent electrode includes a non-protrusion portion and a protrusion protruding inwardly from a side surface of the opening as compared to the non-protrusion portion of the transparent electrode; at least part of the protrusion portion being interposed between the second electrode pad and the current blocking layer; wherein the mesa includes at least one groove formed on a side surface thereof such that the first conductive type semiconductor layer is partially exposed through the groove; the insulation layer at least partially covers a side surface of the groove; and wherein the first electrode extension includes an extension contact portion contacting the first conductive type semiconductor layer through the groove.

In some implementations, the insulation layer may cover a side surface of the active layer exposed through the groove.

In some implementations, the insulation layer may further cover a top surface of the active layer exposed through the groove.

In some implementations, the insulation layer may be spaced apart from the transparent electrode.

In some implementations, the at least one groove may include a plurality of grooves separated from one another and the plurality of grooves may be disposed on one side surface of the light emitting element.

In some implementations, the first electrode pad may include a pad contact portion contacting the first conductive semiconductor layer.

In some implementations, the pad contact portion and the at least one extension contact portion may be disposed on one side surface of the light emitting element.

In some implementations, the insulation layer may include at least one enlarged portion covering a side surface of the mesa around the first electrode pad.

In some implementations, a portion of the insulation layer disposed under the first electrode extension may be disposed within a region defined by the side surface of the mesa.

The first electrode pad may include a pad contact portion contacting the first conductive type semiconductor layer, the at least one enlarged portion may include a plurality of enlarged portions that are spaced apart from one another, and the pad contact portion may be disposed in a region between the plurality of enlarged portions.

In some implementations, the at least one groove may have an arc shape in a plan view.

In some implementations, the current blocking layer may include a pad current blocking layer disposed under the second electrode pad and an extension current blocking layer disposed under the second electrode extension, and the pad current blocking layer may be at least partially exposed through the opening of the transparent electrode.

In some implementations, the side surface of the opening of the transparent electrode may be disposed on the pad current blocking layer.

In some implementations, the side surface of the opening of the transparent electrode may be spaced apart from the pad current blocking layer.

In some implementations, the transparent electrode may be interposed between the second electrode extension and the extension current blocking layer.

In some implementations, an interface between the second electrode pad and the second electrode extension may be located in a first portion on at least one of x (+), x (−), y (+) and y (−) axes or first to fourth quadrants in a virtual coordinate system having an origin at a central portion of the pad current blocking layer and an x-axis and a y-axis that are perpendicular to each other, and the at least one protrusion is located in a different portion that is different from the first portion, the different portion being on the at least one of the x (+), x (−), y (+) and y (−) axes or the first to fourth quadrants excluding the first portion.

In some implementations, the interface may be located on the y (−) axis or the fourth quadrant, and the protrusions may be located on the x (+) axis, the x (−) axis and the y (+) axis.

In some implementations, the first electrode pad may be disposed adjacent to one side of the light emitting element and the first electrode extension may extend from the first electrode pad toward the other side of the light emitting element, and the second electrode pad may be disposed adjacent to the other side of the light emitting element and the second electrode extension may extend from the second electrode pad toward the one side of the light emitting element.

In accordance with another aspect of the present disclosure, a light emitting element is provided to include: a first conductive type semiconductor layer; a mesa disposed on the first conductive type semiconductor layer and including an active layer and a second conductive type semiconductor layer disposed on the active layer; a transparent electrode disposed on the mesa; an insulation layer partially disposed on the mesa; and a first electrode disposed on the insulation layer to be insulated from the second conductive type semiconductor layer and including a first electrode pad and a first electrode extension extending from the first electrode pad, wherein the mesa includes at least one groove formed on a side surface thereof such that the first conductive type semiconductor layer is partially exposed through the groove; the insulation layer at least partially covers a side surface of the groove to cover a side surface of the active layer exposed through the groove; and the first electrode extension includes an extension contact portion contacting the first conductive type semiconductor layer through the groove.

In some implementations, the insulation layer may further cover a periphery of an upper portion of the groove.

In some implementations, the insulation layer may be spaced apart from the transparent electrode.

In some implementations, the first electrode pad may include a pad contact portion contacting the first conductive semiconductor layer.

In accordance with a further aspect of the present disclosure, a light emitting element includes: a first conductive type semiconductor layer; a mesa disposed on the first conductive type semiconductor layer and including an active layer and a second conductive type semiconductor layer disposed on the active layer; a first electrode electrically connected to the first conductive type semiconductor layer; a second conductive oxide electrode disposed on the mesa; and a second electrode disposed on the second conductive oxide electrode, wherein the first electrode includes a first electrode pad and a first electrode extension extending from the first electrode pad; the first electrode extension includes a metal electrode extension and a first conductive oxide electrode extension, the metal electrode extension extending from one side surface of the first electrode pad, the first conductive oxide electrode extension extending from another side surface of the first electrode pad other than the one side surface of the first electrode pad.

In some implementations, the first conductive oxide electrode extension may include at least one of ZnO or ZnO containing a metal dopant, and the metal dopant may include Ga.

In some implementations, the first electrode extension may include a plurality of metal electrode extensions and/or a plurality of first conductive oxide electrode extensions.

In some implementations, the metal electrode extension and the first conductive oxide electrode extension may extend in opposite directions.

In some implementations, the metal electrode extension and the first conductive oxide electrode extension may have different line widths.

In some implementations, the line width of the metal electrode extension may be greater than that of the first conductive oxide electrode extension.

In some implementations, the line width of the first conductive oxide electrode extension may be greater than that of the metal electrode extension.

In some implementations, one side surface of the first conductive oxide electrode extension may be flush with one side surface of the first conductive type semiconductor layer.

In some implementations, the first electrode pad may include a metal electrode pad and a first conductive oxide electrode pad, and the first conductive oxide electrode extension may extend from the first conductive oxide electrode pad.

In some implementations, the metal electrode pad may be disposed on the first conductive oxide electrode pad and the first conductive oxide electrode pad may have a larger area than the metal electrode pad.

In some implementations, at least part of the first conductive oxide electrode extension may contact at least part of the metal electrode extension.

In some implementations, a portion of the first conductive oxide electrode extension may be disposed under the metal electrode extension.

In some implementations, a portion of the first conductive oxide electrode extension may be interposed between the first conductive type semiconductor layer and the metal electrode extension, and a portion of the first conductive oxide electrode extension may form ohmic contact with the first conductive type semiconductor layer.

In some implementations, the first conductive type semiconductor layer may include a region in which a portion of an upper surface of the first conductive type semiconductor layer formed around the mesa is exposed, and the first conductive oxide electrode extension may contact the first conductive type semiconductor layer exposed around the mesa.

In some implementations, the first conductive oxide electrode extension may at least partially surround the mesa.

In some implementations, the first conductive oxide electrode extension may form a closed curve surrounding the mesa.

In some implementations, the light emitting element may further include an insulation layer partially disposed on the mesa, wherein a portion of the metal electrode extension and at least part of the first electrode pad are disposed on the insulation layer and the metal electrode extension may include an extension contact portion contacting the first conductive type semiconductor layer.

In some implementations, the mesa may include at least one groove depressed from a side surface of the mesa, an upper surface of the first conductive type semiconductor layer may be partially exposed through the groove, and the insulation layer may include an opening exposing the upper surface of the first conductive type semiconductor layer exposed through the groove, and the extension contact portion may electrically contact the upper surface of the first conductive type semiconductor layer through the opening of the insulation layer.

In some implementations, the first conductive oxide electrode extension may partially surround the mesa and may not be disposed around the groove of the mesa.

In some implementations, a portion of the first conductive oxide electrode extension may be interposed between the upper surface of the first conductive type semiconductor layer exposed through the groove and a portion of the metal electrode extension, and the portion of the first conductive oxide electrode extension may form ohmic contact with the upper surface of the first conductive type semiconductor layer exposed through the groove.

According to exemplary embodiments of the present disclosure, the light emitting element has improved current spreading performance in the horizontal direction through a second electrode extension having an extension contact portion, and a side surface of an active layer exposed through a groove of a mesa is covered by an insulation layer, thereby preventing deterioration in luminous efficacy and failure due to electrostatic discharge. In addition, the light emitting element includes an extension of an insulation layer, thereby preventing electrical short around a first electrode pad. Furthermore, the light emitting element can improve structural stability of the second electrode pad, and particularly, can prevent failure around the second electrode pad due to ball bonding.

Exemplary embodiments of the present disclosure also provide a light emitting element that includes a first electrode having a first conductive oxide electrode extension in order to improve electrical and optical characteristics.

BRIEF DESCRIPTION OF DRAWINGS

FIGS. 5A, to 6B are enlarged plan views and enlarged cross-sectional views of a light emitting element according to a further exemplary embodiment of the present disclosure.

Figures 62, 63, 64:
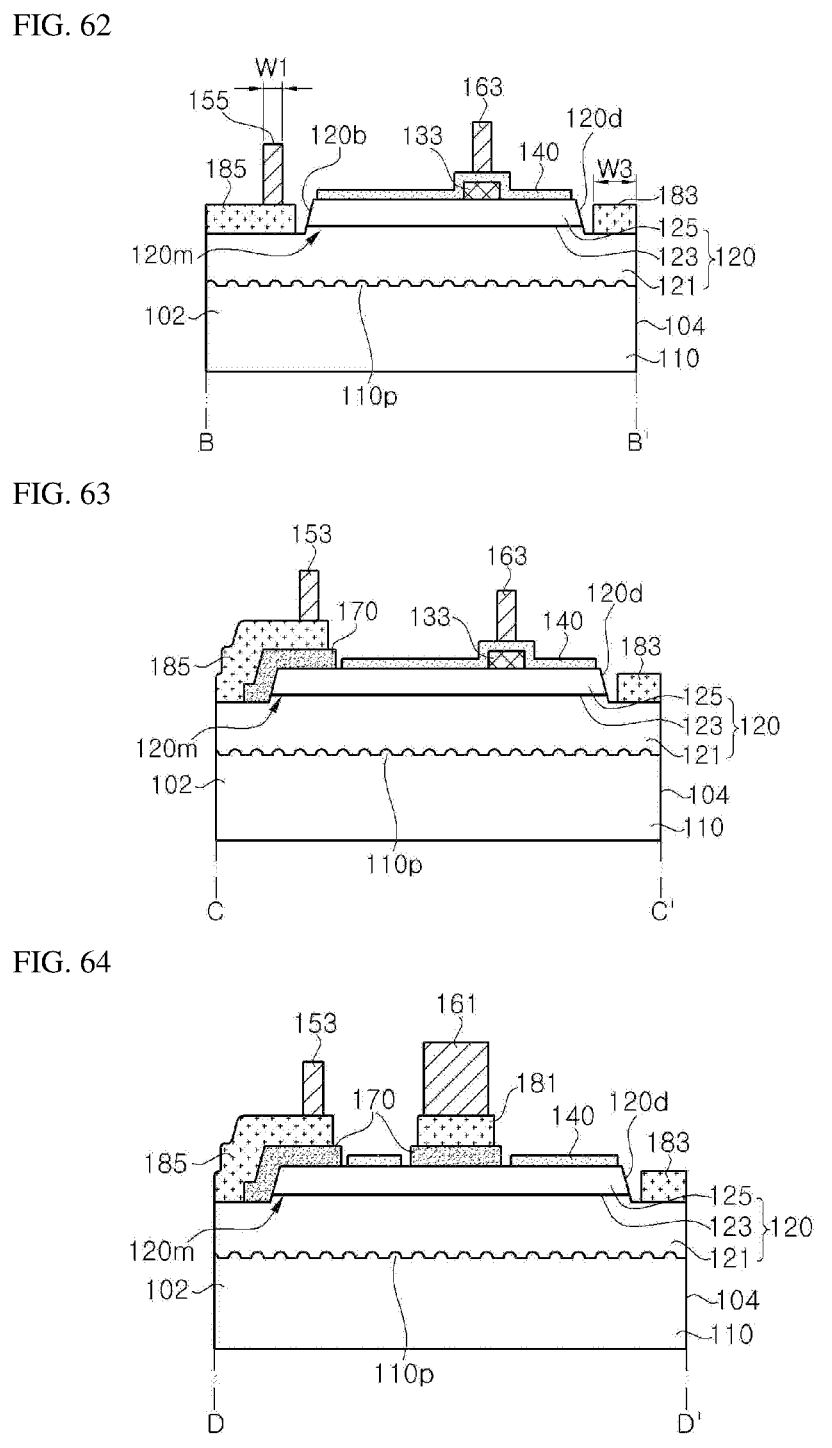

FIGS. 62 to 64 are sectional views of a light emitting element according to other exemplary embodiments of the present disclosure.

DETAILED DESCRIPTION

Figure 1A:
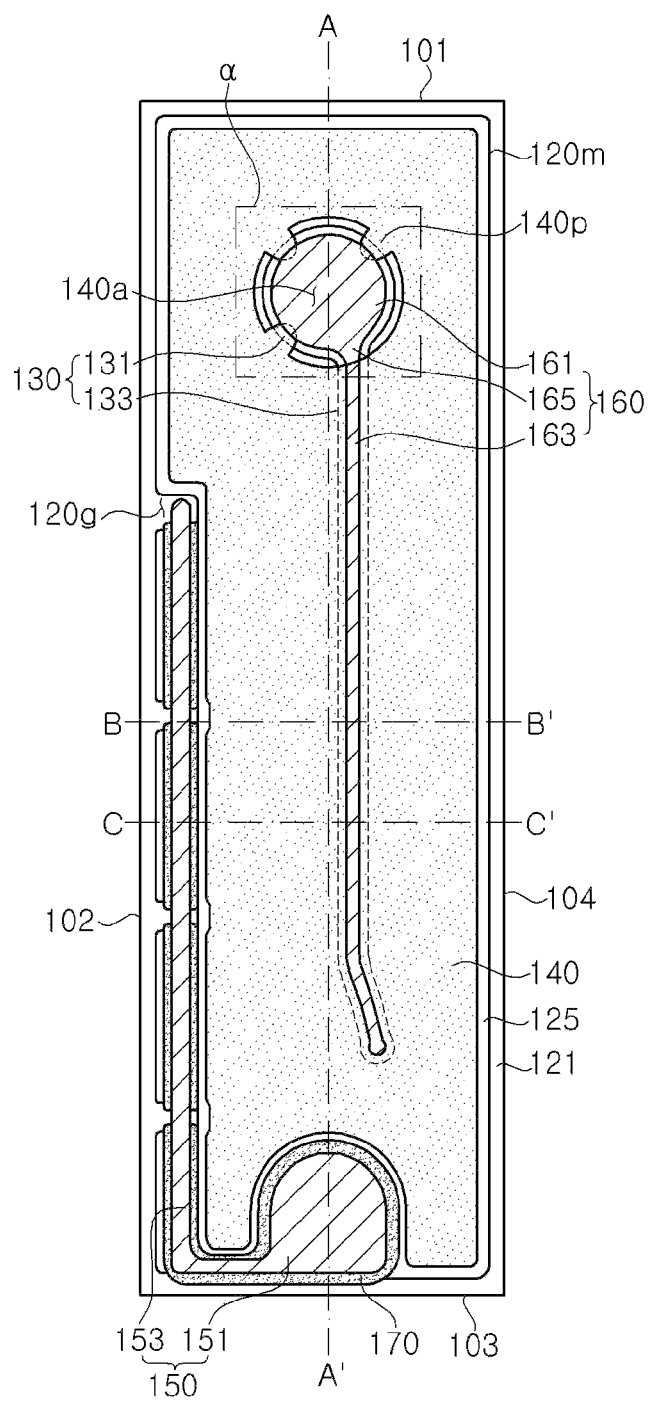
FIG. 1A is a plan view of a light emitting element according to one exemplary embodiment of the present disclosure.

Hereinafter, exemplary embodiments of the present disclosure will be described in detail with reference to the accompanying drawings. The following embodiments are provided by way of example so as to facilitate the understanding of the present disclosure to those skilled in the art to which the present disclosure pertains. Accordingly, the present disclosure is not limited to the embodiments disclosed herein and can also be implemented in different forms. When an element is referred to as being "disposed above" or "disposed on" another element, it can be directly "disposed above" or "disposed on" the other element, or intervening elements can be present. Throughout the specification, like reference numerals denote like elements having the same or similar functions. The term "exemplary" is used to mean "an example of" and does not necessarily mean an ideal or a best implementation.

The composition ratio, growth methods, growth conditions, and thicknesses of semiconductor layers described below are provided by way of example, and other implementations are also possible. For example, when represented by AlGaN, the composition ratio of Al and Ga may be applied in various ways by those skilled in the related art, as needed. In the following exemplary embodiments, a material referred to as ZnO may include single crystal ZnO having a predetermined crystal structure and may include, for example, ZnO having a wurtzite crystal structure. In addition, the single crystal ZnO can be a single crystal including a thermodynamic intrinsic defect and can also be a single crystal including a small a small number of defects that can occur in a manufacturing process, such as void defects, dislocations, grain boundaries, and the like. Further, the single crystal ZnO may be a single crystal containing a small amount of impurities or dopants. That is, both single crystal ZnO containing unintentional or unavoidable defects or impurities and single crystal ZnO containing dopants may be included in the single crystal ZnO referred to herein.

Figure 1B:
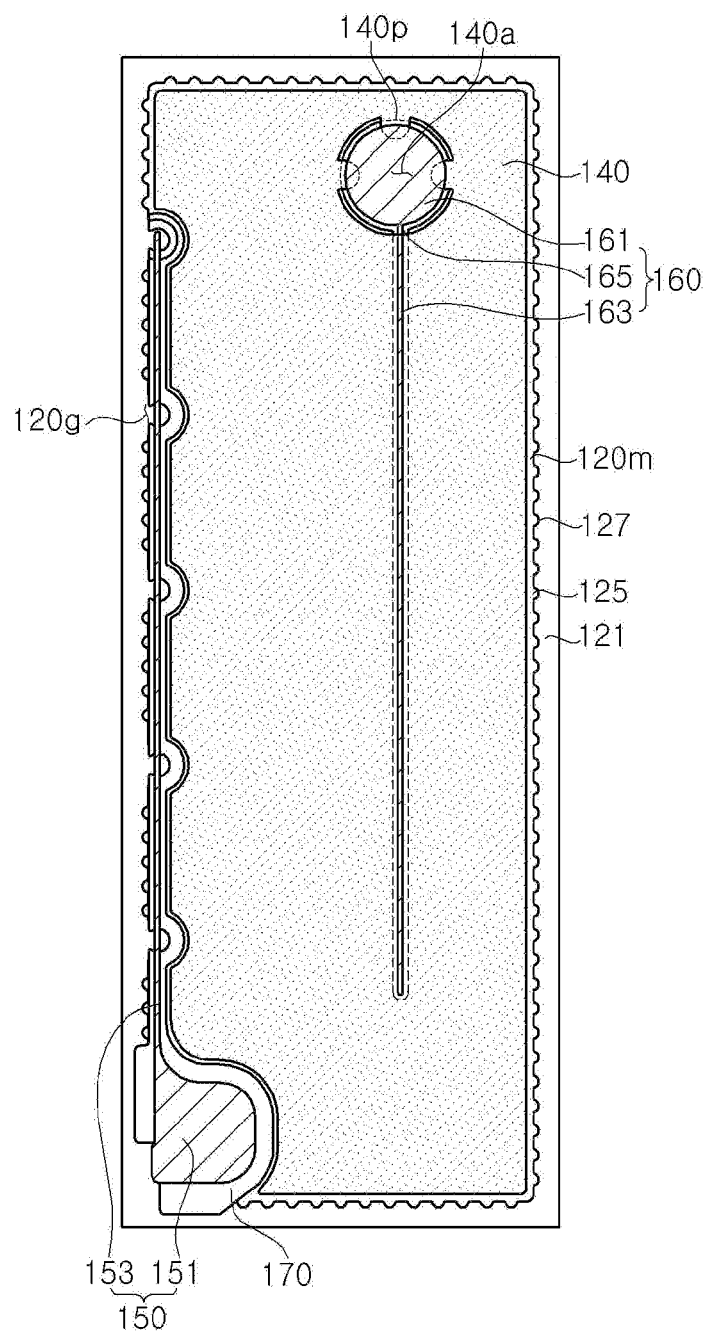
FIG. 1B is a plan view of a light emitting element according to another exemplary embodiment of the present disclosure.
Figure 2A:
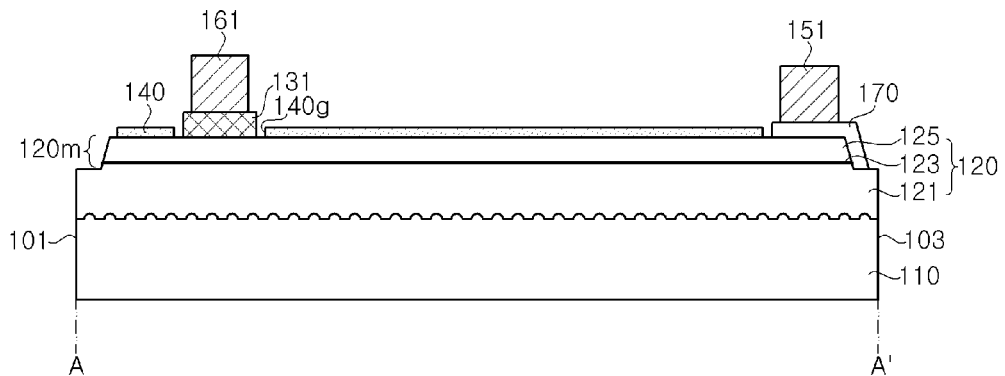
FIGS. 2A to 2C are cross-sectional views of the light emitting element according to the exemplary embodiment of the present disclosure.
Figure 2B:
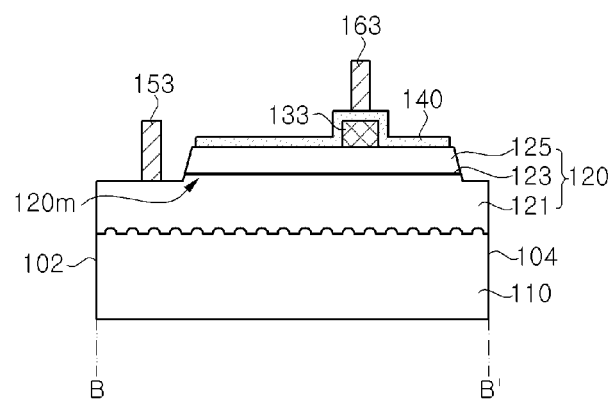
Figure 2C:
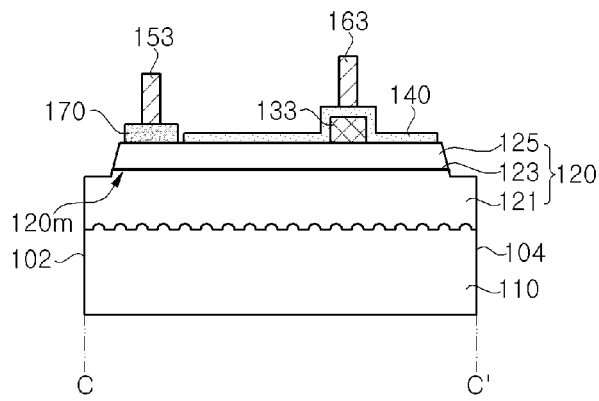
Figure 3A:
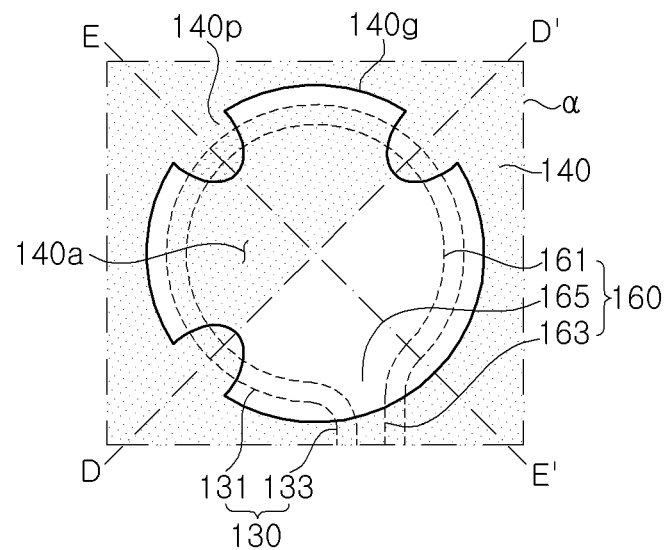
FIGS. 3A and 3B are enlarged plan views of the light emitting element according to the exemplary embodiment of the present disclosure.
Figure 3B:
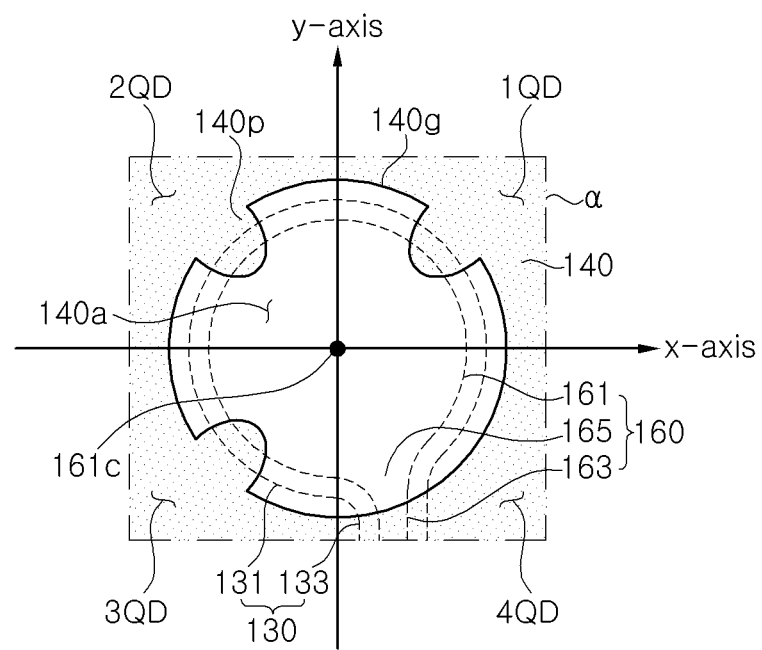
Figure 4A:
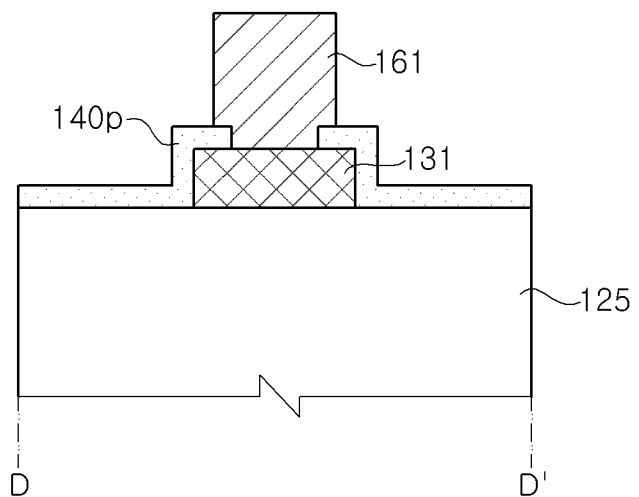
FIGS. 4A and 4B are enlarged cross-sectional views of the light emitting element according to the exemplary embodiment of the present disclosure.
Figure 4B:
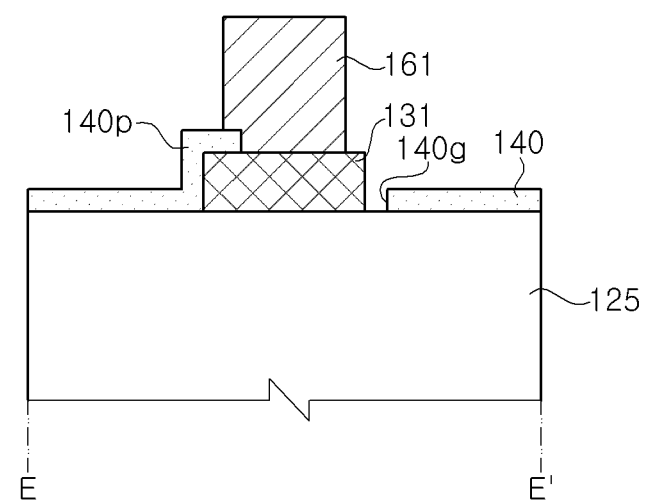

FIG. 1A and FIGS. 2A to 4B show a light emitting element according to one exemplary embodiment of the present disclosure. FIG. 1A is a plan view of a light emitting element according to one exemplary embodiment of the present disclosure, FIGS. 2A, 2B and 2C are cross-sectional views taken along line A-A', line B-B', and line C-C', respectively. In addition, FIGS. 3A and 3B are enlarged plan views of Region α of FIG. 1, and FIG. 4A and 4B are enlarged cross-sectional views taken along line D-D' and E-E' of FIG. 3A, respectively.

Referring to FIG. 1A and FIGS. 2A to 4B, the light emitting element includes a light emitting structure 120, a transparent electrode 140, a first electrode 150, and a second electrode 160. In addition, the light emitting element may further include a substrate 110 and a current blocking layer 130. The light emitting element may include first to fourth sides 101, 102, 103, 104.

The substrate 110 may be an insulating or conductive substrate. In addition, the substrate 110 may be a growth substrate for growing the light emitting structure 120, and may include a sapphire substrate, a silicon carbide substrate, a silicon substrate, a gallium nitride substrate, an aluminum nitride substrate, or the like. However, it should be understood that other implementations are also possible and the substrate 110 may be a secondary substrate for supporting the light emitting structure 120. For example, the substrate 110 may be a sapphire substrate, and in particular, may be a patterned sapphire substrate (PSS) having a patterned upper surface. When the substrate 110 is a patterned sapphire substrate, the substrate 110 may include a plurality of protrusions 110*p* on the upper surface thereof.

Although the first conductive type semiconductor layer 121 is described as being disposed on the substrate 110 in this exemplary embodiment, when the substrate 110 is a growth substrate capable of growing the semiconductor layers 121, 123, 125 thereon, the substrate 110 may be separated and removed by physical and/or chemical methods after growth of the semiconductor layers 121, 123, 125 thereon.

The light emitting structure 120 may include a first conductive type semiconductor layer 121, a second conductive type semiconductor layer 125 disposed on the first conductive type semiconductor layer 121, and an active layer 123 interposed between the first conductive type semiconductor layer 121 and the second conductive type semiconductor layer 125. In addition, the light emitting structure 120 may include a mesa 120*m* disposed on the first conductive type semiconductor layer 121 and including the active layer 123 and the second conductive type semiconductor layer 125.

The first conductive type semiconductor layer 121, the active layer 123 and the second conductive type semiconductor layer 125 may be grown in a chamber using a well-known method such as MOCVD. In addition, the first conductive type semiconductor layer 121, the active layer 123 and the second conductive type semiconductor layer 125 may include Group III-V based nitride semiconductors, for example, nitride semiconductors such as (Al, Ga, In)N. The first conductive type semiconductor layer 121 may include n-type dopants (for example, Si, Ge, Sn) and the second conductive type semiconductor layer 125 may include p-type dopants (for example, Mg, Sr, or Ba), or vice versa. The active layer 123 may include a multiple quantum well (MQW) structure and the composition ratio of the nitride based semiconductors may be adjusted to emit light having a desired wavelength. In particular, in this exemplary embodiment, the second conductive type semiconductor layer 125 may be a p-type semiconductor layer.

The mesa 120m is disposed in some region of the first conductive type semiconductor layer 121 such that the surface of the first conductive type semiconductor layer 121 can be exposed in a region in which the mesa 120m is not formed. The mesa 120m may be formed by partially etching the second conductive type semiconductor layer 125 and the active layer 123. The mesa 120m may be formed, for example, along a side surface of the first conductive type semiconductor layer 121, as shown in FIGS. 1A and 1B, without being limited thereto. The mesa 120m may have an inclined side surface, or may have a side surface perpendicular to an upper surface of the first conductive type semiconductor layer 121. Further, in this exemplary embodiment, the mesa 120m may include at least one groove 120g depressed from a side surface thereof. As described below, the groove 120g may provide a region in which a first electrode 150 electrically contacts the first conductive type semiconductor layer 121.

In addition, the mesa 120m may further include a concavo-convex pattern 127 formed on a side surface thereof, as shown in FIG. 1B. With this structure, the light emitting element can have improved light extraction efficiency.

However, it should be understood that other implementations are also possible and the exposed region of the first conductive type semiconductor layer 121 may not be formed. When the light emitting element has other structures (for example, a vertical type structure) instead of the horizontal type structure as shown in the drawings, the upper surface of the first conductive type semiconductor layer 121 may not be exposed.

The current blocking layer 130 is at least partially disposed on the second conductive type semiconductor layer 125. The current blocking layer 130 may be disposed on the second conductive type semiconductor layer 125 corresponding to the location of the second electrode 160. The current blocking layer 130 may include a pad current blocking layer 131 and an extension current blocking layer 133. The pad current blocking layer 131 and the extension current blocking layer 133 may be disposed corresponding to the locations of a second electrode pad 161 and a second electrode extension 163, respectively. Thus, as shown in the drawings, the pad current blocking layer 131 is disposed adjacent to the first side 101 of the light emitting element and the extension current blocking layer 133 extends from the first side 101 towards the third side 103.

The current blocking layer 130 can prevent electric current supplied to the second electrode 160 from being directly transmitted to the semiconductor layer, thereby preventing current crowding. Thus, the current blocking layer 130 may have insulating properties, may include an insulation material, and may be composed of a single layer or multiple layers. For example, the current blocking layer 130 may include $SiO_x$ or $SiN_x$, or may include a distributed Bragg reflector in which insulation material layers having different indices of refraction are stacked one above another. That is, the current blocking layer 130 may have light transmittance, light reflectivity, or selective light reflectivity.

In addition, the current blocking layer 130 may have a larger area than the second electrode 160 formed on the current blocking layer 130. Thus, the second electrode 160 may be disposed within a region in which the current blocking layer 130 is formed.

The transparent electrode 140 may be disposed on the second conductive type semiconductor layer 125 and may cover a portion of an upper surface of the second conductive type semiconductor layer 125 and a portion of the current blocking layer 130. The transparent electrode 140 may include an opening 140a that partially exposes the pad current blocking layer 131. In addition, the transparent electrode 140 includes a protrusion portion 140p and a non-protrusion portion. The protrusion portion 140p protrudes toward at least one of the second electrode pad 161 or the pad current blocking layer 131 as compared to the non-protrusion portion of the transparent electrode. The protrusion portion 140p has a side surface formed inwardly from a side surface 140g of the opening 140a to be further away from an edge of the light emitting element. The side surface 140g of the opening 140a may be separated from the current blocking layer 130 and may be formed along a side surface of the current blocking layer 130. The protrusion 140p may partially contact the current blocking layer 130 and may cover a portion of the side and upper surface of the current blocking layer 130. The protrusion 140p may be formed in plural. The transparent electrode 140 may include a material having light transmittance and electrical conductivity, and may include at least one of a conductive oxide, such as ITO, ZnO and IZO, and a light-transmitting metal layer, such as Ni/Au. In addition, the transparent electrode 140 may form ohmic contact with the second conductive type semiconductor layer 125. Since the second electrode 160 does not directly contact the second conductive type semiconductor layer 125, electric current can be more effectively spread through the transparent electrode 140. The transparent electrode 140 will be described below in more detail with reference to FIGS. 3A to 4B.

The first electrode 150 may be disposed on the first conductive type semiconductor layer 121 and may be electrically connected to the first conductive type semiconductor layer 121. The first electrode 150 may include a first electrode pad 151 and a first electrode extension 153. The first electrode 150 forms ohmic contact with the upper surface of the first conductive type semiconductor layer 121, which is exposed by partially removing the second conductive type semiconductor layer 125 and the active layer 123, and thus can be electrically connected to the first conductive type semiconductor layer 121.

In this exemplary embodiment, the first electrode pad 151 and a portion of the first electrode extension 153 may be disposed on the mesa 120m, with an insulation layer 170 interposed between the mesa 120m and a portion of the first electrode 150. The first electrode pad 151 may be disposed adjacent to the third side 103 of the light emitting element and the first electrode extension 153 may extend along the third side 103 and the second side 102. On the other hand, the insulation layer 170 may be disposed under the first electrode pad 151 and a portion of the first electrode extension 153 disposed on the upper surface of the mesa 120m. Accordingly, the first electrode 150 and the second conductive type semiconductor layer 125 are insulated from each other. The groove 120g of the mesa 120m may be exposed instead of being covered by the insulation layer 170 and the portion of the first electrode type semiconductor layer 121 exposed through the groove 120g may electrically contact the first electrode extension 153. Thus, the first electrode pad 151 does not directly contact the first conductive type semiconductor layer 121 and a portion of the first electrode extension 153 contacts the first conductive type semiconductor layer 121 to form electrical connection therewith, whereby electric current can be efficiently spread in the horizontal direction during operation of the light emitting element. On the other hand, the arrangement of the first electrode 150 is not limited thereto and may be modified and changed in various ways according to the shape of the light emitting element.

The first electrode 150 may serve to supply external power to the first conductive semiconductor layer 121 and may be formed of a metal, such as Ti, Pt, Au, Cr, Ni, and the like. In addition, the first electrode 150 may be composed of a single layer or multiple layers.

The second electrode 160 is disposed on the second conductive type semiconductor layer 125 and at least part of the second electrode 160 is disposed on a region in which the current blocking layer 130 is disposed. The second electrode 160 includes a second electrode pad 161 and a second electrode extension 163, which may be disposed on the pad current blocking layer 131 and the extension current blocking layer 133, respectively. Thus, a portion of the transparent electrode 140 may be interposed between the second electrode 160 and the current blocking layer 130.

In particular, the second electrode pad 161 may be disposed on the opening 140a of the transparent electrode 140. The second electrode pad 161 may be spaced apart from the side surface 140g of the opening 140a and at least part of the protrusion 140p of the transparent electrode 140 may be interposed between the second electrode pad 161 and the pad current blocking layer 131. Thus, the second electrode pad 161 and the protrusion 140p of the transparent electrode 140 contact each other to be electrically connected to each other. The second electrode pad 161 may have, for example, a substantially circular shape, as shown in the drawings, but is not limited thereto. Accordingly, the pad current blocking layer 131 of the current blocking layer 130 may be formed in a circular shape similar to the shape of the second electrode pad 161, and the opening 140a of the transparent electrode 140 may be formed in a substantially similar circular shape. However, it should be understood that other implementations are also possible. Although not particularly limited, the location of the second electrode pad 161 may be determined so as to allow light to be emitted through the entire surface of the active layer 123 of the light emitting element by efficient spreading electric current. For example, as shown in the drawings, the second electrode pad 153 may be disposed adjacent to the first side 101 opposite to the third side 103, adjacent to which the first electrode pad 151 is disposed.

The second electrode extension 163 extends from the second electrode pad 161. In this exemplary embodiment, the second electrode extension 163 may extend from the second electrode pad 161 toward the third side 103. In addition, the extension direction of the second electrode extension 163 may be changed. For example, a distal end of the second electrode extension 163 may be bent toward a portion between the third side 103 and the fourth side 104 of the light emitting element. This structure can be designed in various ways in consideration of the distance between the first electrode pad 151 and the second electrode extension 163. The transparent electrode 140 is interposed between at least part of the second electrode extension 163 and the extension current blocking layer 133, whereby the second electrode extension 163 is electrically connected to the transparent electrode 140.

The arrangement of the second electrode 160 is not limited thereto and may be modified and changed in various ways according to the shape of the light emitting element.

The second electrode 160 may include a conductive material and may include a metallic material such as Ti, Pt, Au, Cr, Ni, Al, and Mg, and may be composed of a single layer or multiple layers. In the structure wherein the second electrode 160 is composed of multiple layers, the second electrode 160 may include at least one of metal stack structures of Ti/Au layers, Ti/Pt/Au layers, Cr/Au layers, Cr/Pt/Au layers, Ni/Au layers, Ni/Pt/Au layers, and Cr/Al/Cr/Ni/Au layers.

As described above, the transparent electrode 140 is interposed between a portion of the second electrode 160 and the current blocking layer 130 such that electric current can flow through a contact region between the second electrode 160 and the transparent electrode 140. Accordingly, the contact region between the second electrode 160 and the transparent electrode 140 may be adjusted so as to allow electric current to be effectively spread and this structure will be described with reference to FIGS. 3A to 4B. Further, light emitting elements according to various exemplary embodiments of the present disclosure will be described with reference to FIGS. 5A to 11B.

First, comparative examples will be described with reference to the structure around the second electrode pad. FIGS. 18A to 18F show the structure around the second electrode pad according to the comparative examples.

Figure 18A:
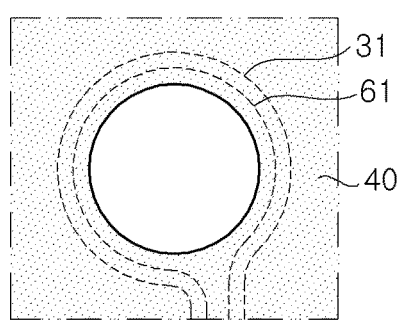
FIGS. 18A to 18F show a structure around a second electrode pad according to Comparative Examples.
Figure 18B:
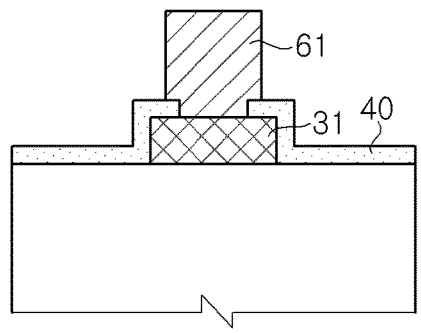

FIGS. 18A and 18B show the structure of the second electrode pad 61 according to Comparative Example 1. Referring to FIGS. 18A and 18B, the opening of the transparent electrode 40 is formed on the pad current blocking layer 31 and thus the transparent electrode 40 continuously contacts the second electrode pad 61 along the periphery thereof. According to the structure of Comparative Example 1, peeling of the second electrode pad 61 easily occurs at a portion where the transparent electrode 40 contacts the second electrode pad 61, thereby deteriorating reliability of the light emitting element. Particularly, since the entire periphery of the second electrode pad 61 contacts the transparent electrode 40, there is no portion capable of suppressing peeling of the second electrode pad 61. Furthermore, when ball bonding is performed on an upper surface of the second electrode pad 61, the second electrode pad 61 is more likely to be peeled off and thus this structure has a low BST (Ball Shear Test) value.

Figure 18C:
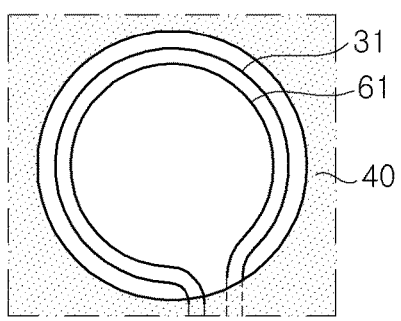
Figure 18D:
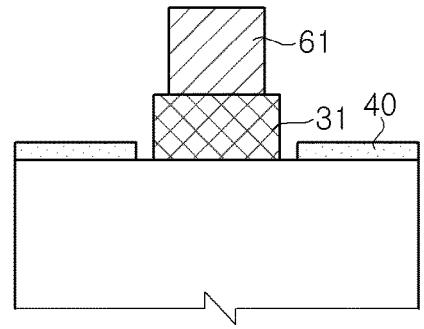

FIGS. 18C and 18D show the structure of the second electrode pad 61 according to Comparative Example 2. Referring to FIGS. 18C and 18D, the transparent electrode 40 is spaced apart from the pad current blocking layer 31 and the second electrode pad 61 is disposed on the pad current blocking layer 31. According to the structure of Comparative Example 2, since the transparent electrode 40 and the second electrode pad 61 do not contact each other, this structure can have a higher BST value than that of Comparative Example 1. However, since the second electrode pad 61 does not contact the transparent electrode 40, current spreading in a region around the second electrode pad 61 is not efficient.

Figure 18E:
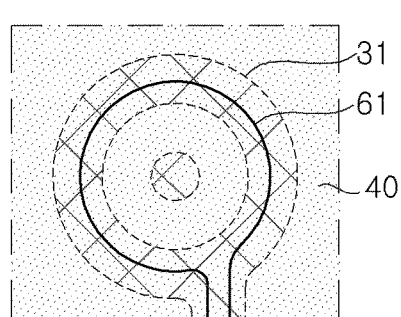
Figure 18F:
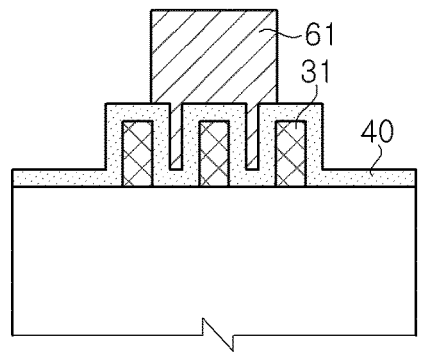

FIGS. 18E and 18F show the structure of the second electrode pad 61 according to Comparative Example 3.

Referring to FIGS. 18E and 18F, the pad current blocking layer 31 has an opening and the transparent electrode 40 covers the pad current blocking layer 31. The second electrode pad 61 is located on the pad current blocking layer 31. According to the structure of Comparative Example 3, a concavo-convex pattern is formed on the surface of the transparent electrode 40 on the pad current blocking layer 31, whereby peeling of the second electrode pad 61 can be suppressed by the concavo-convex pattern. Thus, the structure of Comparative Example 3 can have a higher BST value than that of Comparative Example 1. However, since the second electrode pad 61 is directly connected to the second conductive type semiconductor layer through the transparent electrode 40, static electricity can directly flow to the second conductive type semiconductor layer. Therefore, the structure of Comparative Example 3 has low electrostatic discharge (ESD) resistance, thereby deteriorating reliability of the light emitting element having the structure of Comparative Example 3.

Hereinafter, the structure around the second electrode pad 161 according to the exemplary embodiment will be described with reference to FIGS. 3A to 4B. FIGS. 3A and 3B are enlarged plan views of Region α in FIGS. 1A and 1B, and FIGS. 4A and 4B are cross-sectional views taken along line D-D' and line E-E' of FIG. 3A, respectively. In the enlarged plan views of FIGS. 3A and 3B, the transparent electrode 140 is indicated by a solid line and the current blocking layer 130 and the second electrode 160 are indicated by broken lines for convenience of description.

Referring to FIG. 3A and FIGS. 4A and 4B, the opening 140a of the transparent electrode 140 includes a side surface 140g, and the side surface 140g is separated from the pad current blocking layer 131. The opening 140a of the transparent electrode 140 is formed along a side surface of the pad current blocking layer 131 and has a shape substantially corresponding to the shape of the side surface of the pad current blocking layer 131. With this structure, the transparent electrode 140 contacts the second conductive type semiconductor layer 125 excluding a space between the pad current blocking layer 131 and the transparent electrode 140, whereby electric current can be evenly spread on the second conductive type semiconductor layer 125 in the horizontal direction.

The transparent electrode 140 includes at least one protrusion portion 140p and a non-protrusion portion. The protrusion portion 140p protrudes toward at least one of the second electrode pad 161 or the pad current blocking layer 131 as compared to the non-protrusion portion of the transparent electrode. The protrusion portion 140p has a side surface formed inwardly from the side surface of the opening 140a to be further away from an edge of the light emitting element. The protrusion 140p partially covers the side surface and an upper surface of the pad current blocking layer 131, as shown in FIGS. 4A and 4B, and is interposed between the pad current blocking layer 131 and the second electrode pad 161. Accordingly, the second electrode pad 161 and the protrusion 140p are electrically connected to each other such that electric current can flow through the second electrode pad 161 and the protrusion 140p. Thus, current injection into a region in which the protrusion 140p is disposed can be efficiently performed. Since the second electrode extension 163 of the second electrode 160 contacts the transparent electrode 140, current injection into the second conductive type semiconductor layer 125 is performed through the second electrode extension 163. Accordingly, the number and locations of the protrusions 140p can be adjusted according to the location of the second electrode extension 163.

Specifically, this structure will be described with reference to FIG. 3B. First, assuming an imaginary plane having an x-axis and a y-axis with a central portion 161c of the second electrode pad 161 defined as the origin. The imaginary plane includes a first quadrant 1QD, a second quadrant 2QD, a third quadrant 3QD, and a fourth quadrant 4QD. With reference to the imaginary plane, a portion of the second electrode extension 163 extending from the second electrode pad 161, that is, an interface 165 between the second electrode pad 161 and the second electrode extension 163, is located on at least one of the x (+) axis, the x (−) axis, the y (+) axis, the y (−) axis, and the first to fourth quadrants 1QD, 2QD, 3QD, 4QD. At least one protrusion 140p may be located on at least one of the remaining x (+), x (−), y (+) and y (−) axes and the first to fourth quadrants 1QD, 2QD, 3QD, 4QD except for the region in which the interface 165 is located. For example, in this exemplary embodiment, the interface 165 between the second electrode pad 161 and the second electrode extension 163 is located in the fourth quadrant 4QD and three protrusions 140p are located in the first, second and third quadrants 1QD, 2QD, 3QD, respectively. Thus, electric current can be injected into a region corresponding to the fourth quadrant 4QD through the second electrode extension 163 and can be injected into regions corresponding to the first, second and third quadrants 1QD, 2QD, 3QD through the protrusions 140p.

On the other hand, a contact area between a lower surface of the second electrode pad 161 and the transparent electrode 140 may be 1% to 20% of the entire area of the lower surface of the second electrode pad 161, specifically 1.5% to 13%, more specifically 3% to 5%. Within this range of the contact area between the lower surface of the second electrode pad 161 and the transparent electrode 140, a contact area between the second electrode pad 161 and the pad current blocking layer 131 can be set to be relatively large. Therefore, peeling of the second electrode pad 161 can be effectively prevented at a contact portion between the second electrode pad 161 and the transparent electrode 140.

In addition, the protrusions 140p may have various shapes and may have, for example, a circular arc shape or an elliptical arc shape, as shown in the drawings.

As in this exemplary embodiment, the transparent electrode 140 is disposed only in some region of the interface between the second electrode pad 161 and the pad current blocking layer 131, whereby the second electrode pad 161 can be effectively prevented from being peeled off the transparent electrode 140. Particularly, due to the structure of the second electrode pad 161 wherein most of the periphery of the lower surface of the second electrode pad 161 adjoins the current blocking layer 131 and only a small portion of the periphery thereof adjoins the transparent electrode 140, the second electrode pad 161 can be prevented from being peeled off and the light emitting element can have a high BST value. In addition, since the second electrode pad 161 contacts the protrusions 140p of the transparent electrode 140, the light emitting element can relieve current crowding that can occur due to separation of the second electrode pad 161 from the transparent electrode 140 while allowing electric current to be efficiently spread to regions in which the second electrode extension 163 is not disposed. With the structure of allowing efficient current spreading in the horizontal direction, the light emitting element can provide high power while lowering forward voltage Vf. Furthermore, since the second electrode pad 161 and the second conductive type semiconductor layer 125 are not directly connected to each other through the transparent electrode 140, the light emitting element can prevent failure or breakage due to static electricity, thereby securing high resistance to electrostatic discharge. In other words, the light emitting element according to this exemplary embodiment can prevent the second electrode pad 161 from being peeled off the transparent electrode, thereby providing high reliability and high current spreading efficiency, and has high resistance to electrostatic discharge, thereby overcoming the problems of Comparative Examples 1 to 3.

In the light emitting element according to this exemplary embodiment, the shapes and locations of the first electrode 150, the second electrode 160 and the protrusions 140p may be changed in various ways, as needed. For example, the locations and shapes of the first electrode 150 and the second electrode 160 may be changed, as shown in FIG. 1B, and the locations of the projections 140p may also be changed according to the locations and shapes of the first electrode 150 and the second electrode 160. According to this exemplary embodiment, the interface 165 between the second electrode pad 161 and the second electrode extension 163 is located on the y (−) axis and three protrusions 140p are located on the x (+) axis, the x (−) axis, and the y (+) axis, respectively. FIGS. 5A to 11B are plan views and cross-sectional views of the structure around the second electrode pad 161 according to other exemplary embodiments.

Figure 5A:
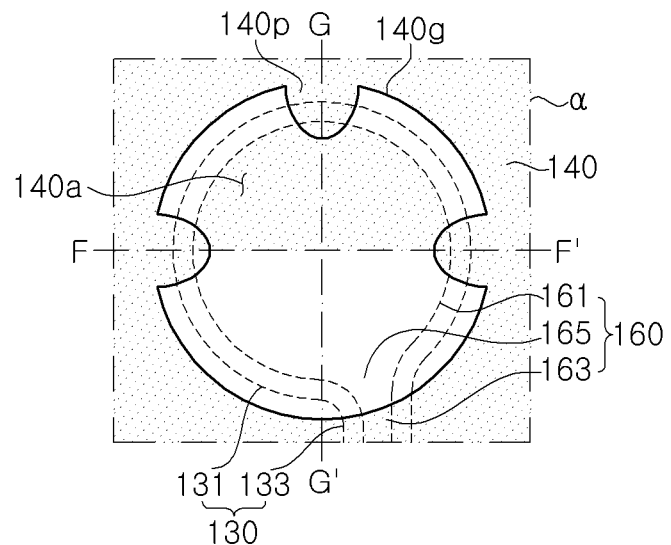
Figure 5B:
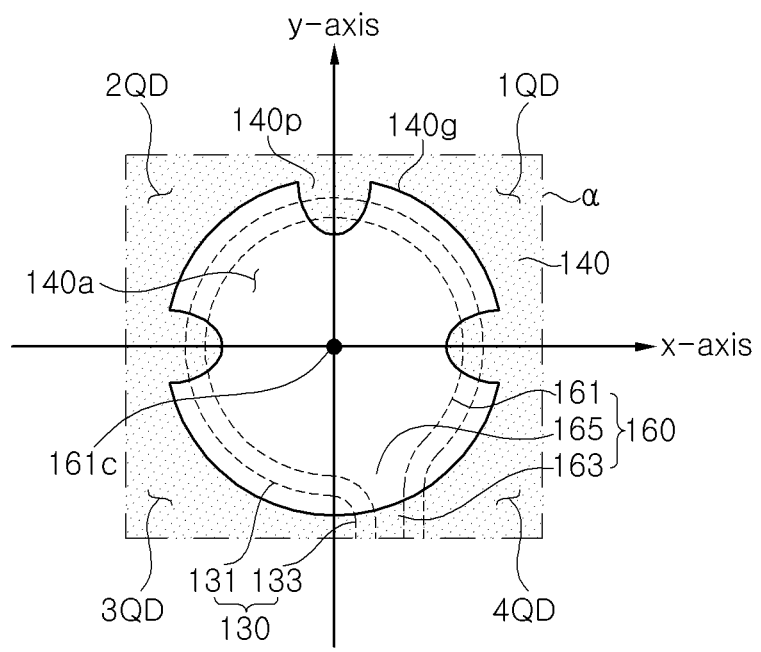

First, FIGS. 5A and 5B are enlarged plan views of Region α in FIGS. 1A and 1B, and FIGS. 6A and 6B are cross-sectional views taken along line F-F and line G-G' of FIG. 5A, respectively. In the enlarged plan views of FIGS. 5A and 5B, the transparent electrode 140 is indicated by a solid line and the current blocking layer 130 and the second electrode 160 are indicated by broken lines for convenience of description. Referring to FIGS. 5A to 6B, the locations of the protrusions 140p may be modified in various ways, as described above, and may be adjusted as in another exemplary embodiment according to FIGS. 5A to 6B.

As shown in FIG. 6B, assuming an imaginary plane having an x-axis and a y-axis with the central portion 161c of the second electrode pad 161 defined as the origin. With reference to the imaginary plane, a portion of the second electrode extension 163 extending from the second electrode pad 161, that is, the interface 165 between the second electrode pad 161 and the second electrode extension 163 165, is located on at least one of the x (+) axis, the x (−) axis, the y (+) axis, the y (−) axis, and the first to fourth quadrants 1QD, 2QD, 3QD, 4QD. At least one protrusion 140p may be formed on at least one of the remaining x (+), x (−), y (+) and y (−) axes and the first to fourth quadrants 1QD, 2QD, 3QD, 4QD except for the region in which the interface 165 is located. For example, in this exemplary embodiment, the interface 165 between the second electrode pad 161 and the second electrode extension 163 is located in the fourth quadrant 4QD and three protrusions 140p are located on the x (+), x (−) and y (+) axes, respectively. Therefore, electric current can be injected into a region corresponding to the fourth quadrant 4QD through the second electrode extension 163 and can be injected into regions corresponding to the x (+), x (−) and y (+) axes through the protrusions 140p.

The exemplary embodiment shown in FIGS. 5A to 6B differs from the exemplary embodiment shown in FIGS. 1A to 4B in terms of the region into which electric current is injected through the protrusions 140p. Such a change in the location of the protrusions 140p may be determined in consideration of reduction in horizontal current spreading efficiency of the transparent electrode 140 (electrical resistance in the horizontal direction within the transparent electrode 140) and horizontal current spreading efficiency of the semiconductor layers of the light emitting structure 120. For example, the transparent electrode 140 may be formed by a method such as sputtering or e-beam evaporation and electrical resistance of the transparent electrode 140 in the horizontal direction can vary depending on the manufacturing method and can also vary depending on the thickness of the transparent electrode 140. In addition, electrical resistance of the second conductive type semiconductor layer 125 in the horizontal direction can vary depending on a crystal growth surface, crystal quality, and internal structure thereof. In the structure which allows relatively smooth current spreading in the horizontal direction, it is desirable that the protrusions 140p be disposed so as to allow electric current to be injected into the entire surface of the active layer 123, and thus, when the protrusions 140p are formed as shown in FIGS. 5A to 6B, current injection into a portion opposite to the second electrode extension 163 becomes smooth, thereby providing relatively high light emitting power. On the other hand, in the structure which allows relatively less smooth current spreading in the horizontal direction, the protrusions 140p disposed close to the first electrode extension 151 have a more positive influence on luminous efficacy. Accordingly, with the structure of the protrusions 140p according to the exemplary embodiment as shown in FIGS. 1A to 4B, the light emitting element has relatively high light emitting power. That is, the number and locations of the protrusions 140p can be changed in various ways according to the characteristics of the light emitting element, such as the structure and material thereof, as in the above exemplary embodiments.

Figure 7A:
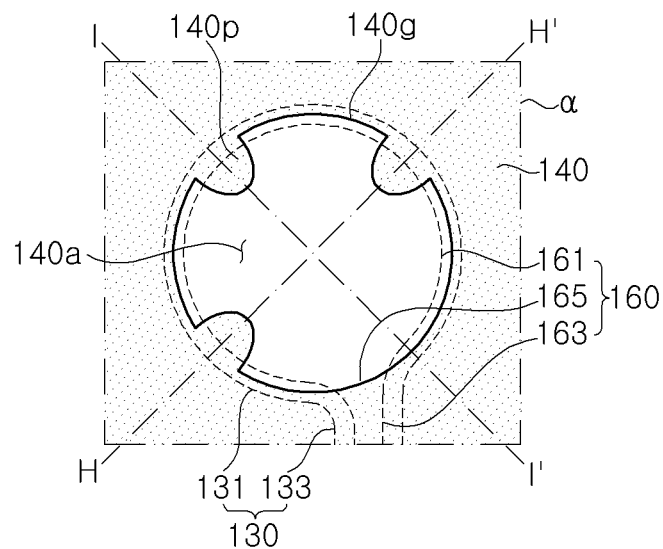
FIGS. 7A to 8B are enlarged plan views and enlarged cross-sectional views of a light emitting element according to yet another exemplary embodiment of the present disclosure.
Figure 7B:
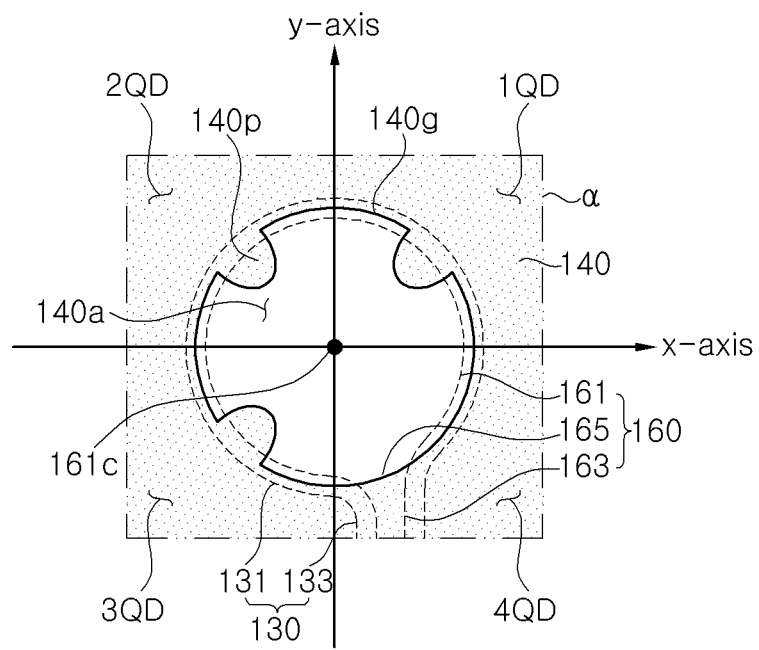
Figure 8A:
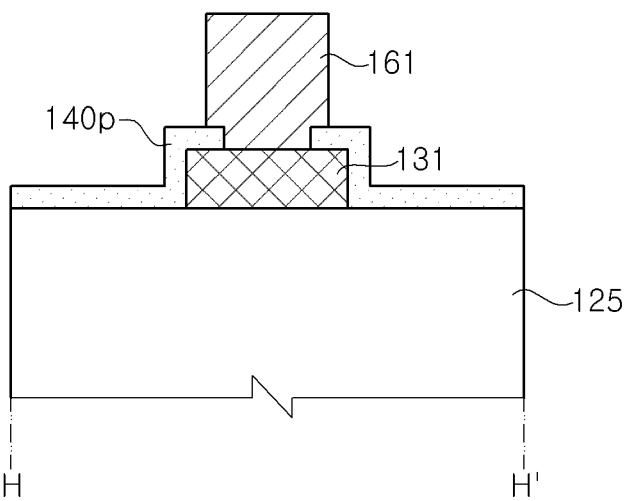
Figure 8B:
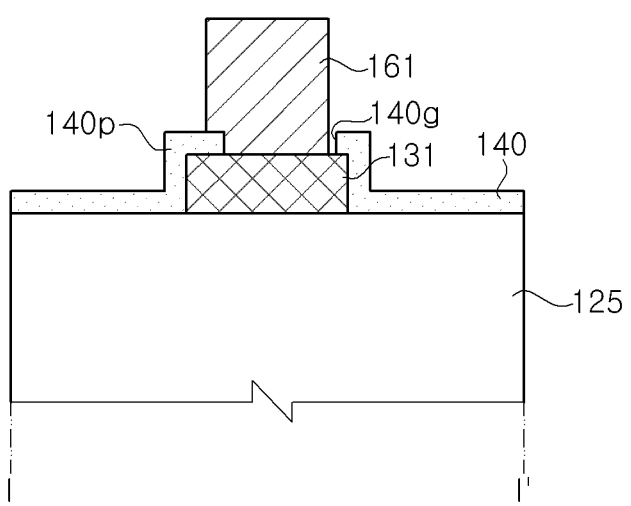

Next, FIGS. 7A and 7B are enlarged plan views of Region α in FIGS. 1A and 1B, and FIGS. 8A and 8B are cross-sectional views taken along line H-H' and line I-I' of FIG. 7A, respectively. In the enlarged plan views of FIGS. 7A and 7B, the transparent electrode 140 is indicated by a solid line and the current blocking layer 130 and the second electrode 160 are indicated by broken lines for convenience of description.

Referring to FIGS. 7A to 8B, the side surface 140g of the opening 140a may be disposed on the pad current blocking layer 131. Accordingly, unlike the exemplary embodiment shown in FIGS. 1A to 4B, according to this exemplary embodiment, the surface of the second conductive type semiconductor layer 125 exposed between the pad current blocking layer 131 and the side surface 140g of the opening 140a of the transparent electrode 140 may be covered. Thus, the second conductive type semiconductor layer 125 disposed under the opening 140a can be protected from the outside. However, the side surface 140g of the opening 140a disposed on the pad current blocking layer 131 is spaced apart from the second electrode pad 161, and thus, according to this exemplary embodiment, it is also possible to effectively suppress peeling of the second electrode pad 161. In addition, in this exemplary embodiment, the number and locations of the protrusions 140p can be adjusted in various ways, and for example, as shown in FIG. 7B, the interface 165 between the second electrode pad 161 and the second electrode extension 163 165 may be located in the fourth quadrant 4QD and the three protrusions 140p may be located in the first, second and third quadrants 1QD, 2QD, 3QD, respectively.

Figure 9A:
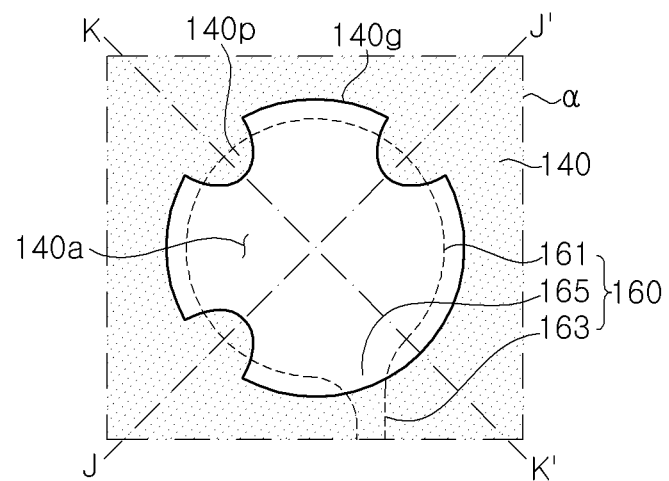
FIGS. 9A to 10B are enlarged plan views and enlarged cross-sectional views of a light emitting element according to yet another exemplary embodiment of the present disclosure.
Figure 9B:
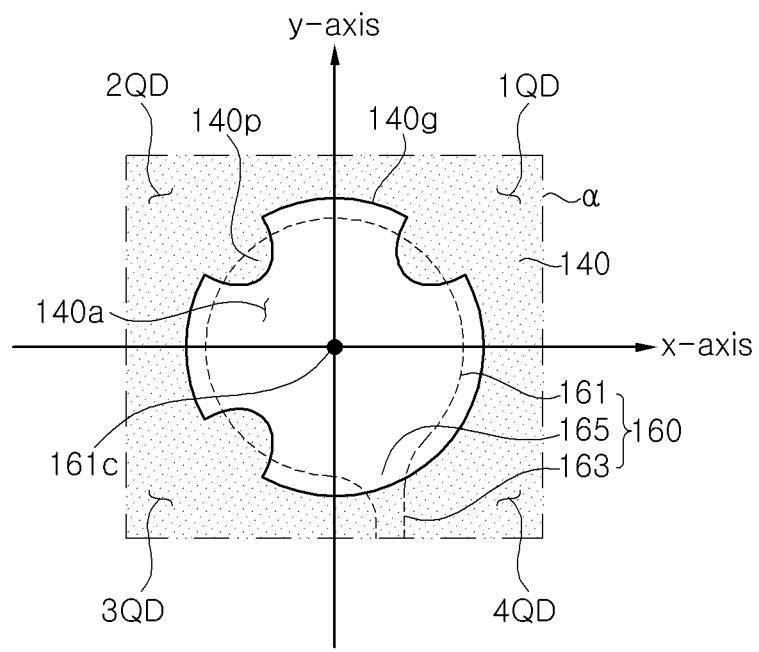
Figure 10A:
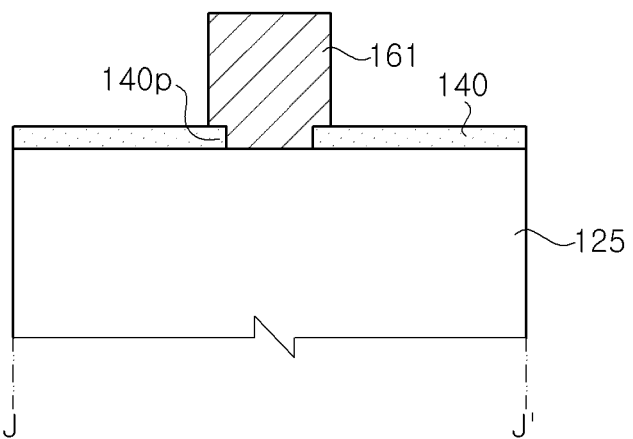
Figure 10B:
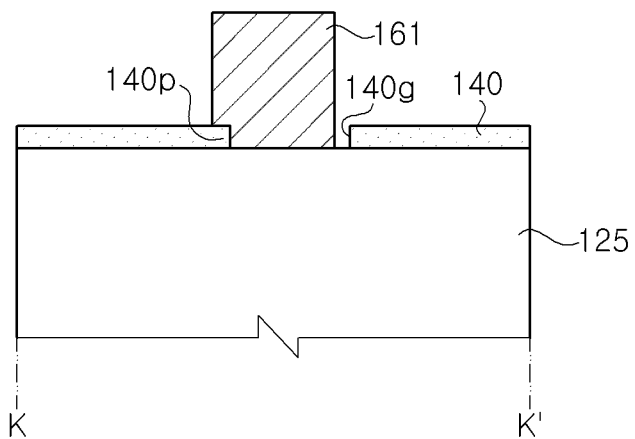

Next, FIGS. 9A and 9B are enlarged plan views of Region α in FIGS. 1A and 1B, and FIGS. 10A and 10B are cross-sectional views taken along line J-J' and line K-K' of FIG. 9A, respectively. In the enlarged plan views of FIGS.

9A and 9B, the transparent electrode 140 is indicated by a solid line and the current blocking layer 130 and the second electrode 160 are indicated by broken lines for convenience of description.

In the light emitting element according to this exemplary embodiment, the current blocking layer 130 is omitted unlike the light emitting element of FIGS. 1A to 4B. Thus, a portion of the lower surface of the second electrode pad 161 contacts the second conductive type semiconductor layer 125 and the side surface 140*g* of the transparent electrode 140 is spaced apart from the second electrode pad 161. In addition, at least part of the protrusion 140*p* of the transparent electrode 140 is interposed between the second conductive type semiconductor layer 125 and the second electrode pad 161. Here, contact resistance between the second electrode pad 161 and the second conductive type semiconductor layer 125 may be higher than the contact resistance between the second electrode pad 161 and the transparent electrode 140. In addition, the second electrode pad 161 and the second conductive type semiconductor layer 125 may form Schottky contact with each other. Therefore, when the second conductive type semiconductor layer 125 is a p-type semiconductor layer, the second electrode pad 161 forms Schottky contact with the second conductive type semiconductor layer 125, so that electric current substantially does not flow from the second electrode pad 161 to the second conductive type semiconductor layer 125. Accordingly, in this case, an effect similar to the case where the current blocking layer 130 is disposed under the second electrode pad 161 can be obtained. Further, in this exemplary embodiment, the number and locations of the protrusions 140*p* can be adjusted in various ways, and for example, as shown in FIG. 9B, the interface 165 between the second electrode pad 161 and the second electrode extension 163 165 may be located in the fourth quadrant 4QD and the three protrusions 140*p* may be located in the first, second and third quadrants 1QD, 2QD, 3QD, respectively.

Figure 11A:
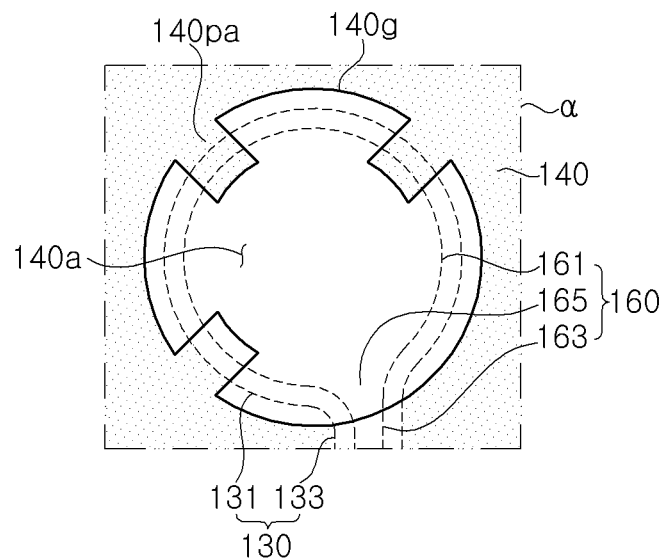
FIGS. 11A and 11B are enlarged plan views of a light emitting element according to other exemplary embodiments of the present disclosure.
Figure 11B:
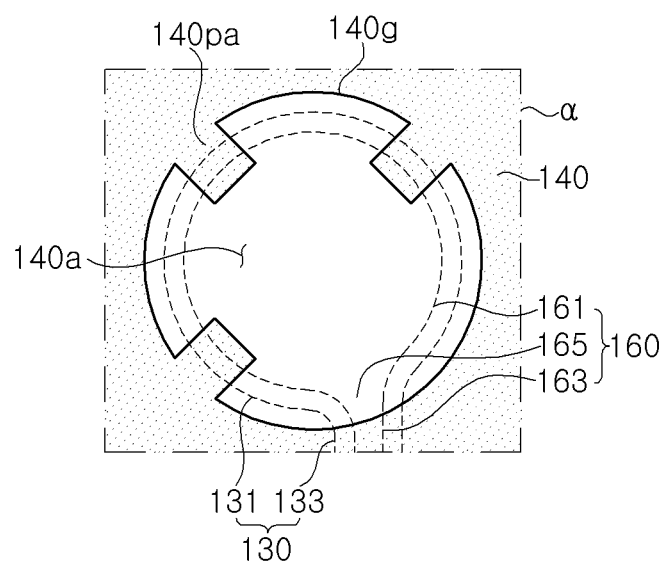

Next, FIGS. 11A and 11B are enlarged plan views of Region α in FIGS. 1A and 1B. According to this exemplary embodiment, the shape of the protrusion 140*p* may be modified in various ways, as compared with the exemplary embodiment of FIGS. 1A to 4B. In the enlarged plan views of FIGS. 11A and 11B, the transparent electrode 140 is indicated by a solid line and the current blocking layer 130 and the second electrode 160 are indicated by broken lines for convenience of description. For example, as shown in FIGS. 11A and 11B, protrusions 140*pa* or 140*pb* may have a polygonal shape, in particular, a rectangular shape, and may have a combined shape of a straight line and a curved line.

The transparent electrode 140 including the protrusions 140*p* described in the above embodiments may be applied to light emitting elements having various structures. Hereinafter, a light emitting element according to another exemplary embodiment will be described with reference to the drawings, and detailed descriptions of the same components will be omitted.

Figure 12:
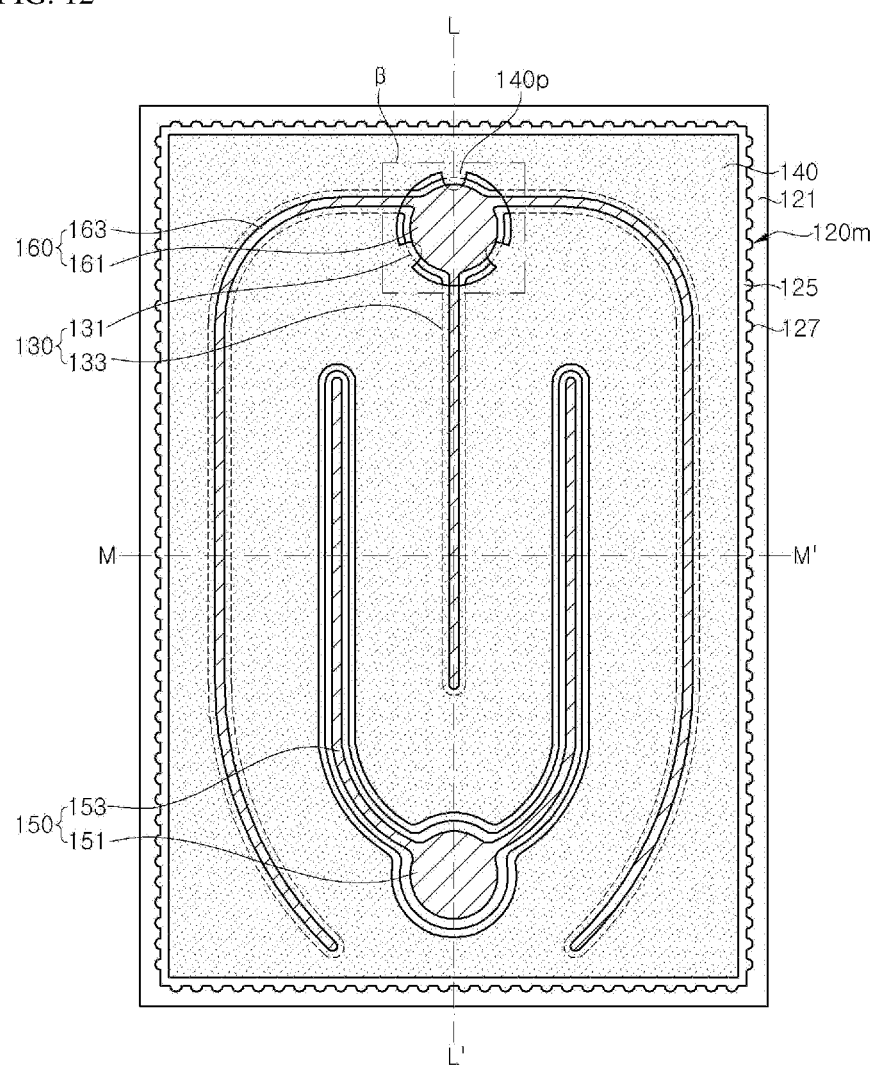
FIGS. 12 to 14B are a plan view, cross-sectional views, and enlarged plan views of a light emitting element according to other exemplary embodiments of the present disclosure.
Figure 13A:
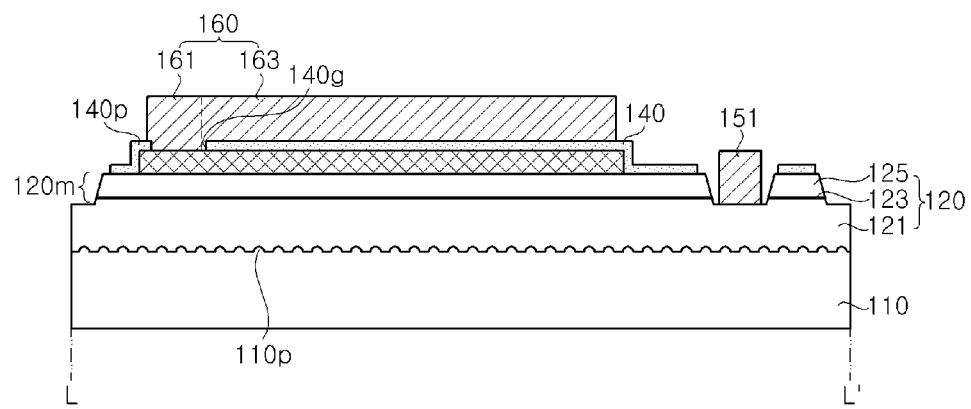
Figure 13B:
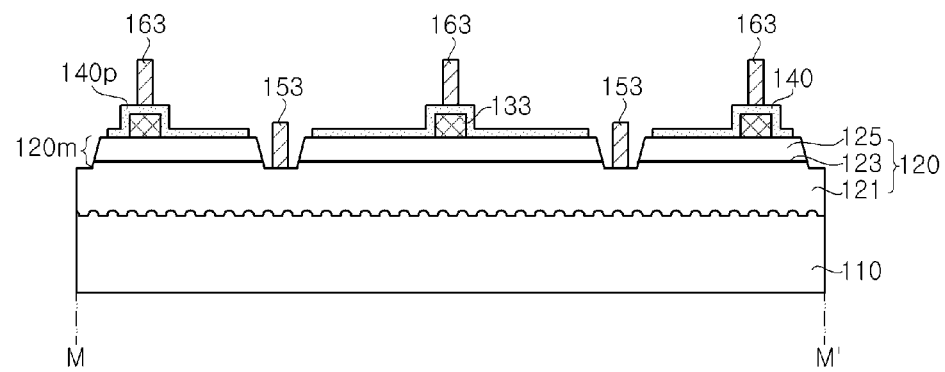
Figure 14A:
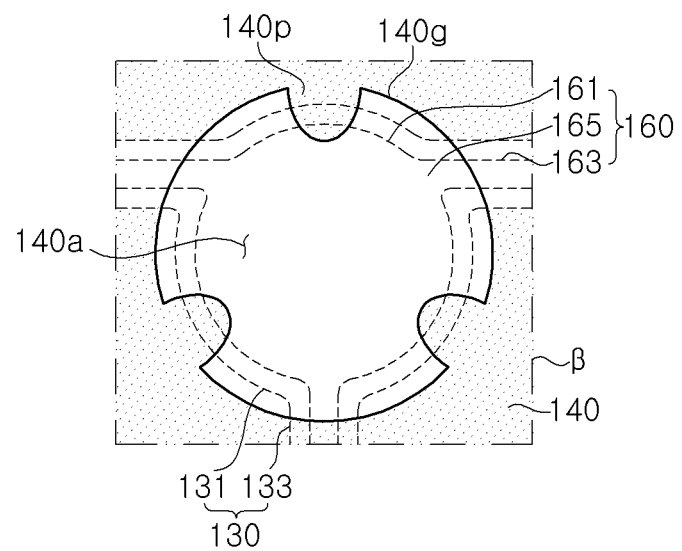
Figure 14B:
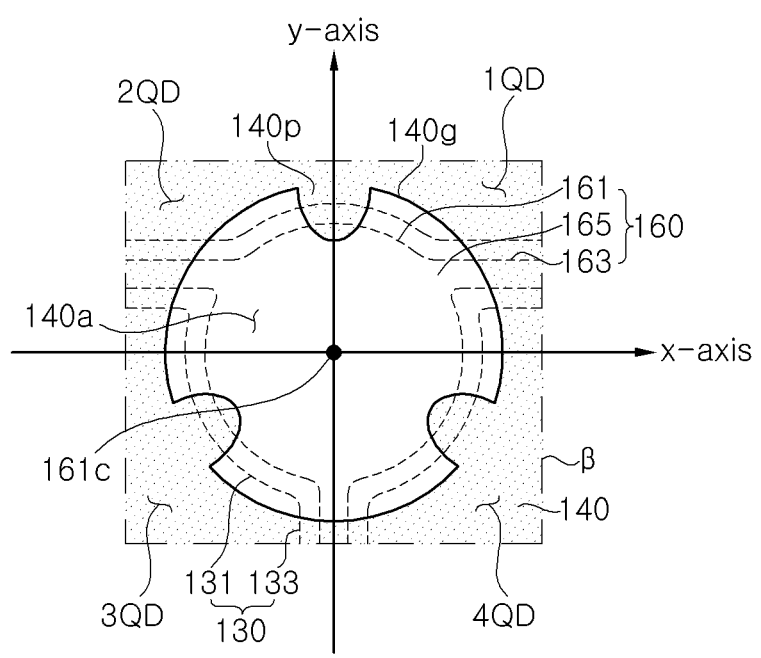

FIGS. 12 to 14B are views of a light emitting element according to another exemplary embodiment of the present disclosure. FIG. 12 is a plan view of the light emitting element according to this embodiment and FIGS. 13A and 13B are cross-sectional views taken along lines L-L' and M-M', respectively. In addition, FIGS. 14A and 14B are enlarged plan views of Region β in FIG. 12, and in the enlarged plan views of FIG. 12, a transparent electrode 140 is indicated by a solid line and a current blocking layer 130 and a second electrode 160 are indicated by broken lines for convenience of description.

Referring to FIGS. 12 to 14B, the light emitting element according to this exemplary embodiment includes a light emitting structure 120, a transparent electrode 140, a first electrode 150, and a second electrode 160. In addition, the light emitting element may further include a substrate 110 and a current blocking layer 130.

The light emitting structure 120 may be disposed on the substrate 110 and may include a mesa 120*m* including the second conductive type semiconductor layer 125 and the active layer 123. An exposed portion of the first conductive semiconductor layer 121 may be formed around the mesa 120*m* and may provide at least some region in which the first electrode 150 is disposed. For example, in this exemplary embodiment, the mesa 120*m* includes a groove through which the first conductive type semiconductor layer 121 is partially exposed, and the first electrode 150 may be disposed in the groove. In addition, the mesa 120*m* may include a concavo-convex pattern 127 formed on a side surface thereof, thereby improving light extraction efficiency of the light emitting element.

At least part of the current blocking layer 130 is disposed on the second conductive type semiconductor layer 125. The current blocking layer 130 may be disposed on the second conductive type semiconductor layer 125 corresponding to the location of the second electrode 160. The current blocking layer 130 may include a pad current blocking layer 131 and an extension current blocking layer 133. The transparent electrode 140 may be disposed on the second conductive type semiconductor layer 125 and may cover a portion of an upper surface of the second conductive type semiconductor layer 125 and a portion of the current blocking layer 130. The transparent electrode 140 may include an opening 140*a* that partially exposes the pad current blocking layer 131. In addition, the transparent electrode 140 includes protrusions 140*p* protruding inwardly toward at least one of the second electrode pad 161 or the pad current blocking layer 131 from a side surface 140*g* of the opening 140*a*.

The first electrode 150 may be disposed on the first conductive type semiconductor layer 121 and may be electrically connected to the first conductive type semiconductor layer 121. In particular, the first electrode 150 may form ohmic contact with the first conductive type semiconductor layer 121 through the surface of the first conductive type semiconductor layer 121 exposed through the groove of the mesa 120*m*. The first electrode 150 may include a first electrode pad 151 and a first electrode extension 153.

The first electrode pad 151 may be disposed adjacent to one side of the light emitting element and the first electrode extension 153 may extend toward the other side of the light emitting element. In addition, the first electrode extension 153 may be formed in plural and may be composed of, for example, two first electrode extensions 153, as shown in the drawings. The second electrode 160 is disposed on the second conductive type semiconductor layer 125 and at least part of the second electrode 160 is disposed in a region in which the current blocking layer 130 is disposed. The second electrode 160 includes a second electrode pad 161 and a second electrode extension 163, which are disposed on the pad current blocking layer 131 and the extension current blocking layer 133, respectively. Therefore, part of the transparent electrode 140 may be interposed between the second electrode 160 and the current blocking layer 130.

In particular, the second electrode pad 161 may be disposed on the opening 140*a* of the transparent electrode 140.

The second electrode pad 161 may be spaced apart from the side surface 140g of the opening 140a and at least part of the protrusion 140p of the transparent electrode 140 may be interposed between the second electrode pad 161 and the pad current blocking layer 131. Thus, the second electrode pad 161 and the protrusions 140p of the transparent electrode 140 contact each other to be electrically connected to each other. The second electrode extension 163 extends from the second electrode pad 161. In this exemplary embodiment, the second electrode extension 163 may extend from the second electrode pad 161 toward the first electrode pad 151. In addition, the second electrode extension 163 may be formed in plural and may be composed of three second electrode extensions 163. The second electrode extension 163 may be interposed between the first electrode extensions 153 and at least one of the first electrode extensions 153 may be interposed between the second electrode extensions 163. With this structure, the light emitting element can have improved current spreading efficiency.

In this exemplary embodiment, with reference to an imaginary plane having an x-axis and a y-axis with a central portion 161c of the second electrode pad 161 defined as the origin, the protrusions 140p of the transparent electrode 140 may be located on at least one of the x (+), x (−), y (+) and y (−) axes and first to fourth quadrants 1QD, 2QD, 3QD, 4QD except for a region in which an interface 165 is located. Referring to FIG. 14B, the interface 165 between the second electrode pad 161 and the second electrode extension 163 is located in the first quadrant 1QD, the second quadrant 2QD, and the y(−) axis. The protrusions 140p are located on the y (+) axis, the third quadrant 3QD and the fourth quadrant 4QD instead of the region in which the interface 165 is located.

Figure 15:
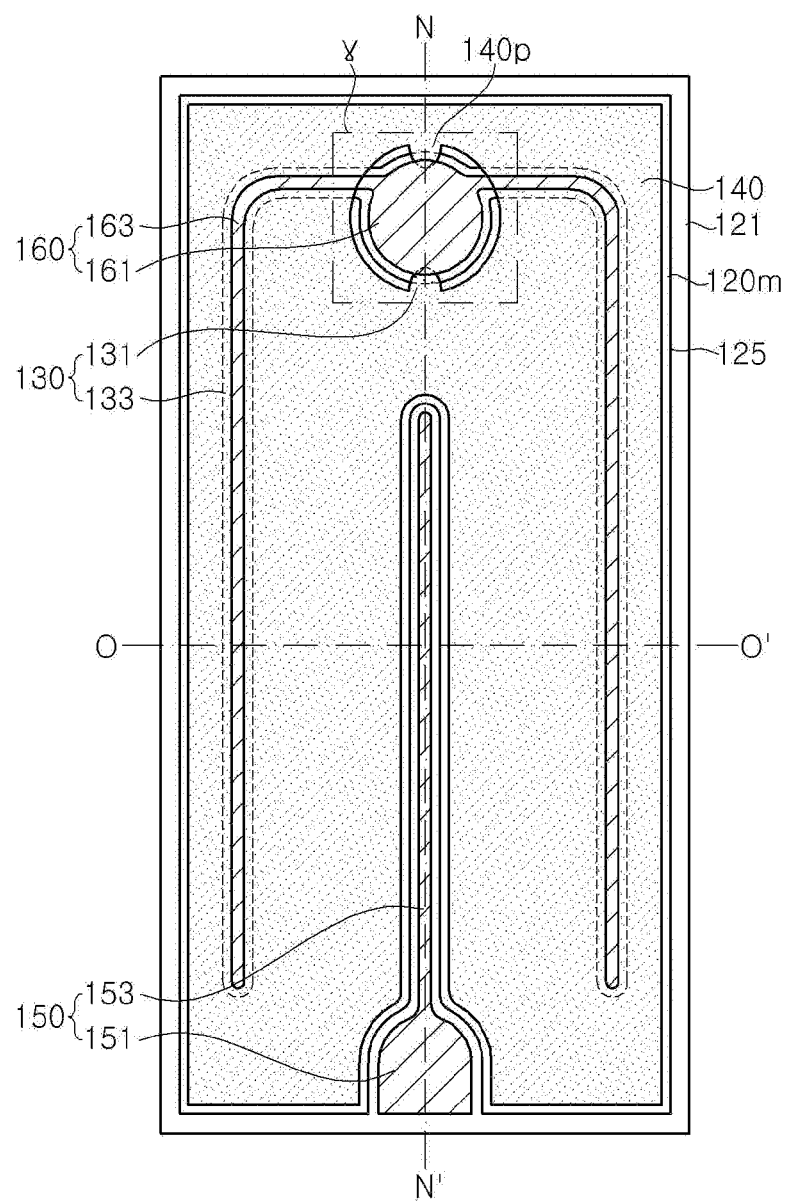
FIGS. 15 to 17B are a plan view, cross-sectional views, and enlarged plan views of a light emitting element according to other exemplary embodiments of the present disclosure.
Figure 16A:
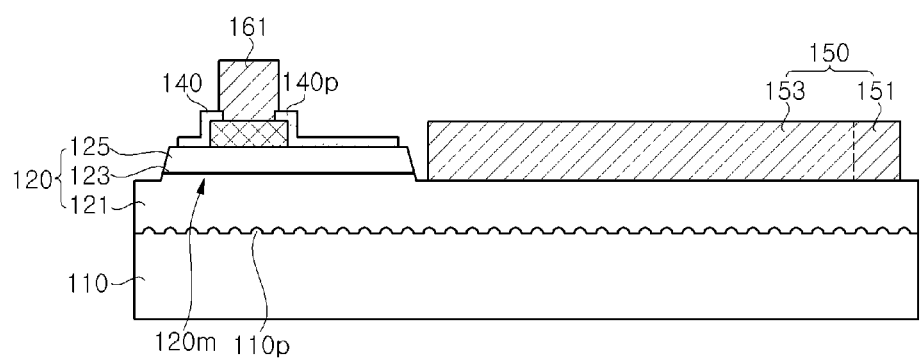
Figure 16B:
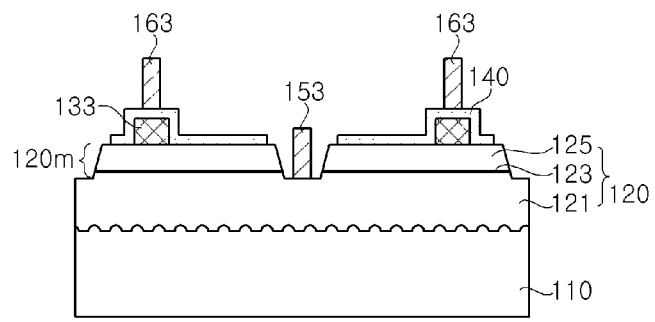
Figure 17A:
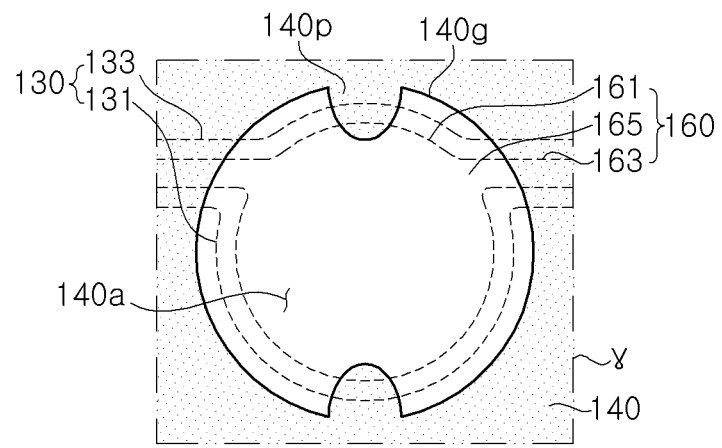
Figure 17B:
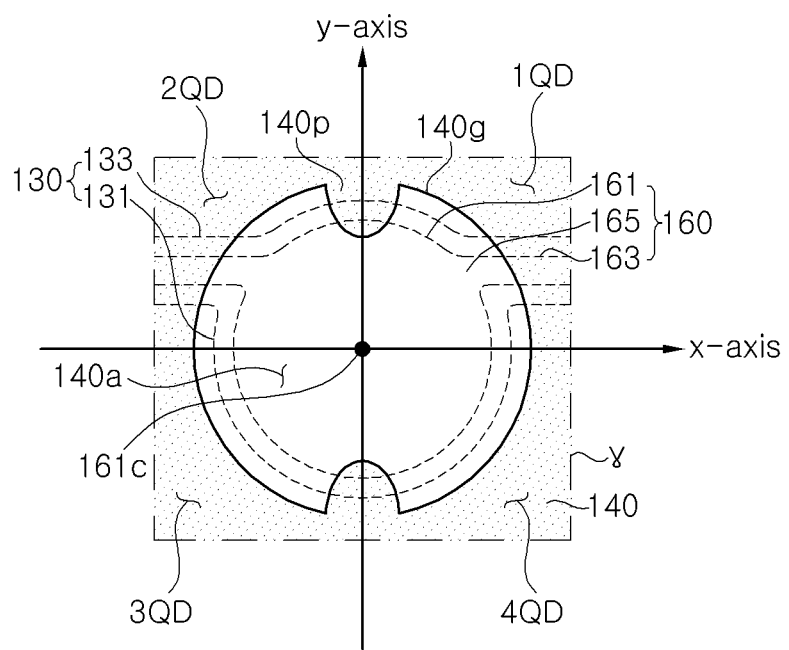

FIGS. 15 to 17B are views of a light emitting element according to a further exemplary embodiment of the present disclosure. FIG. 15 is a plan view of the light emitting element according to this embodiment and FIGS. 16A and 16B are cross-sectional views taken along lines N-N' and O-O', respectively. In addition, FIGS. 17A and 17B are enlarged plan views of Region γ in FIG. 15, and in the enlarged plan views of FIG. 15, a transparent electrode 140 is indicated by a solid line and a current blocking layer 130 and a second electrode 160 are indicated by broken lines for convenience of description.

Referring to FIGS. 15 to 17B, the light emitting element according to this exemplary embodiment includes a light emitting structure 120, a transparent electrode 140, a first electrode 150, and a second electrode 160. The light emitting element may further include a substrate 110 and a current blocking layer 130.

The light emitting structure 120 may be disposed on the substrate 110 and may include a mesa 120m including the second conductive type semiconductor layer 125 and the active layer 123. An exposed portion of the first conductive semiconductor layer 121 may be formed around the mesa 120m and may provide at least some region in which the first electrode 150 is disposed. For example, in this exemplary embodiment, the mesa 120m includes a groove through which the first conductive type semiconductor layer 121 is partially exposed, and the first electrode 150 may be disposed in the groove.

At least part of the current blocking layer 130 is disposed on the second conductive type semiconductor layer 125. The current blocking layer 130 may be disposed on the second conductive type semiconductor layer 125 corresponding to the location of the second electrode 160. The current blocking layer 130 may include a pad current blocking layer 131 and an extension current blocking layer 133. The transparent electrode 140 may be disposed on the second conductive type semiconductor layer 125 and may cover a portion of an upper surface of the second conductive type semiconductor layer 125 and a portion of the current blocking layer 130. The transparent electrode 140 may include an opening 140a that partially exposes the pad current blocking layer 131. In addition, the transparent electrode 140 includes protrusions 140p protruding inwardly toward at least one of the second electrode pad 161 or the pad current blocking layer 131 from a side surface 140g of the opening 140a.

The first electrode 150 may be disposed on the first conductive type semiconductor layer 121 and may be electrically connected to the first conductive type semiconductor layer 121. In particular, the first electrode 150 may form ohmic contact with the first conductive type semiconductor layer 121 through the surface of the first conductive type semiconductor layer 121 exposed through the groove of the mesa 120m. The first electrode 150 may include a first electrode pad 151 and a first electrode extension 153.

The first electrode pad 151 may be disposed adjacent to one side of the light emitting element and the first electrode extension 153 may extend toward the other side of the light emitting element. In addition, the first electrode extension 153 may be formed in plural. The second electrode 160 is disposed on the second conductive type semiconductor layer 125 and at least part of the second electrode 160 is disposed in a region in which the current blocking layer 130 is disposed. The second electrode 160 includes a second electrode pad 161 and a second electrode extension 163, which are disposed on the pad current blocking layer 131 and the extension current blocking layer 133, respectively. Therefore, a portion of the transparent electrode 140 may be interposed between the second electrode 160 and the current blocking layer 130.

In particular, the second electrode pad 161 may be disposed on the opening 140a of the transparent electrode 140. The second electrode pad 161 may be spaced apart from the side surface 140g of the opening 140a and at least part of the protrusion 140p of the transparent electrode 140 may be interposed between the second electrode pad 161 and the pad current blocking layer 131. Thus, the second electrode pad 161 and the protrusions 140p of the transparent electrode 140 contact each other to be electrically connected to each other. The second electrode extension 163 extends from the second electrode pad 161. In this exemplary embodiment, the second electrode extension 163 may extend from the second electrode pad 161 toward the first electrode pad 151. In addition, the second electrode extension 163 may be formed in plural and may be composed of two second electrode extensions 163. The second electrode extension 163 may be interposed between the second electrode extensions 163. With this structure, the light emitting element can have improved current spreading efficiency.

In this exemplary embodiment, with reference to an imaginary plane having an x-axis and a y-axis with a central portion 161c of the second electrode pad 161 defined as the origin, the protrusions 140p of the transparent electrode 140 may be located on at least one of the x (+), x (−), y (+) and y (−) axes and first to fourth quadrants 1QD, 2QD, 3QD, 4QD except for a region in which an interface 165 is located. Referring to FIG. 17B, the interface 165 between the second electrode pad 161 and the second electrode extension 163 is located in the first quadrant 1QD and the second quadrant 2QD. The protrusions 140p are located on the y (+) axis and the y (−) axis instead of the region in which the interface 165 is located.

Figure 19:
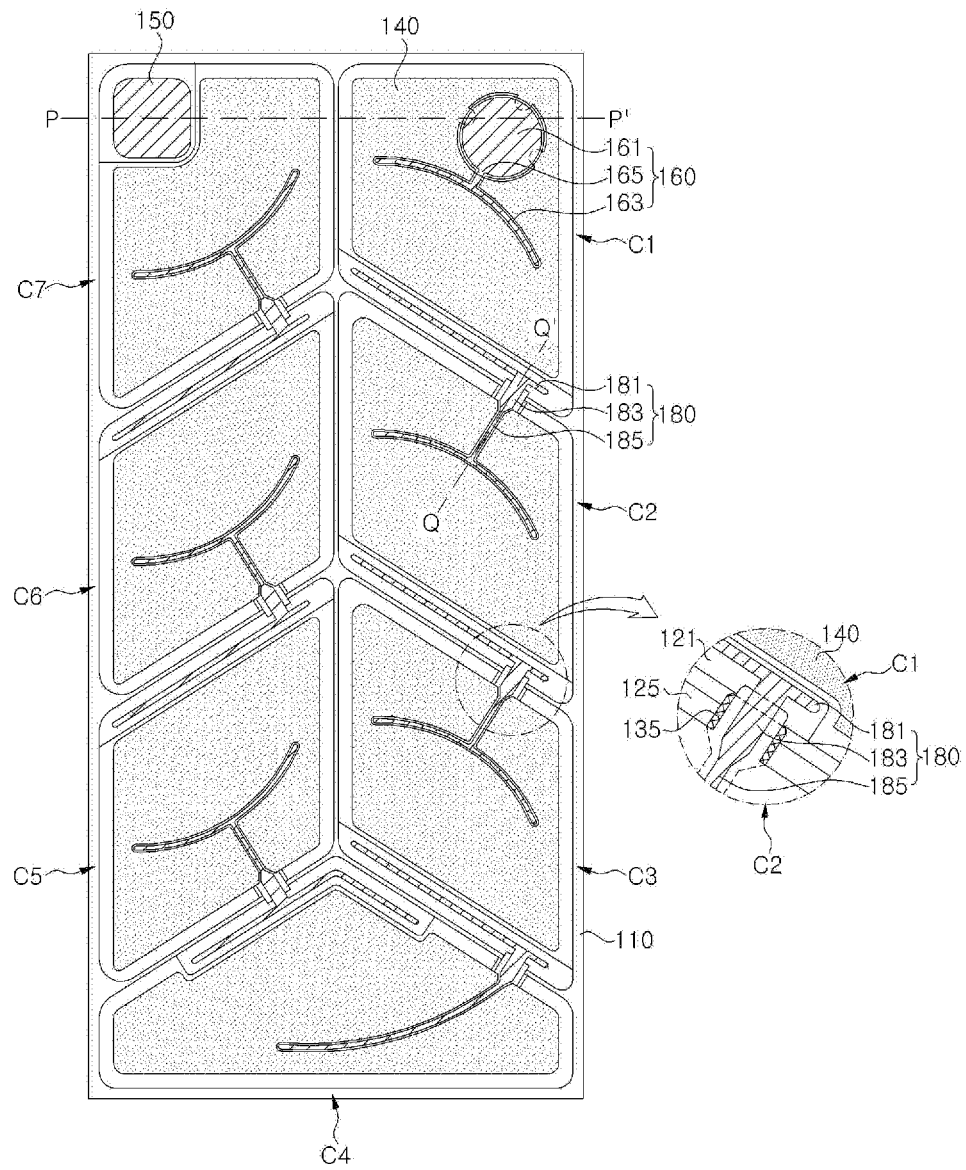
FIGS. 19 to 21B are a plan view, cross-sectional views, and enlarged plan views of a light emitting element according to other exemplary embodiments of the present disclosure.
Figure 20A:
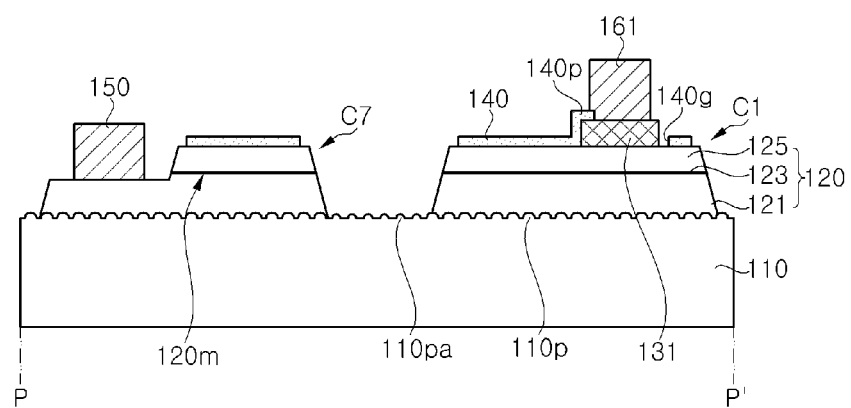
Figure 20B:
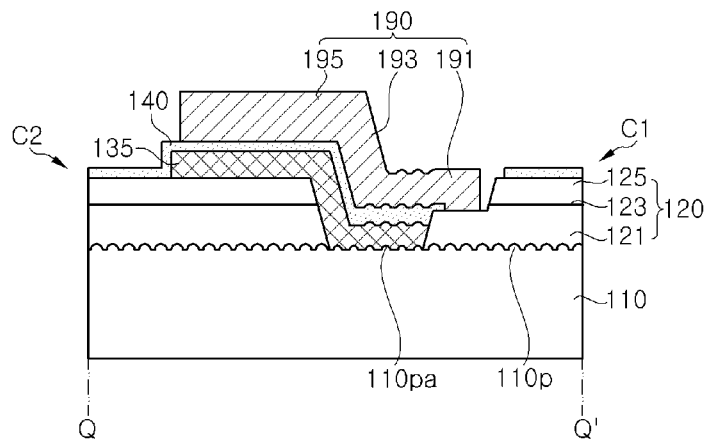
Figure 21A:
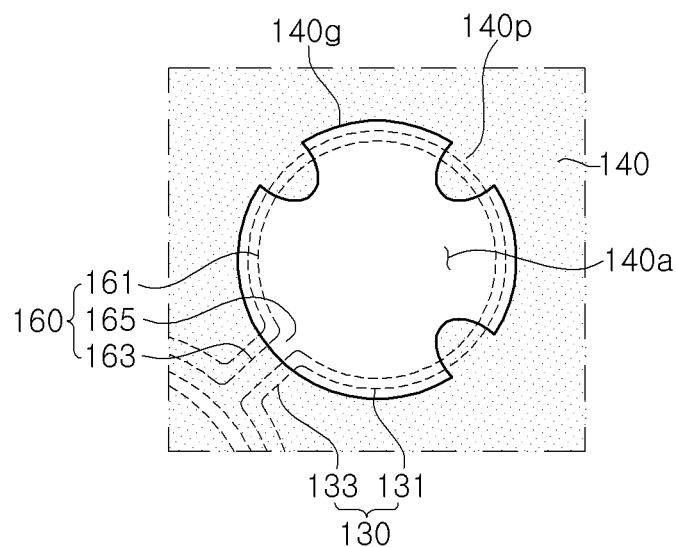
Figure 21B:
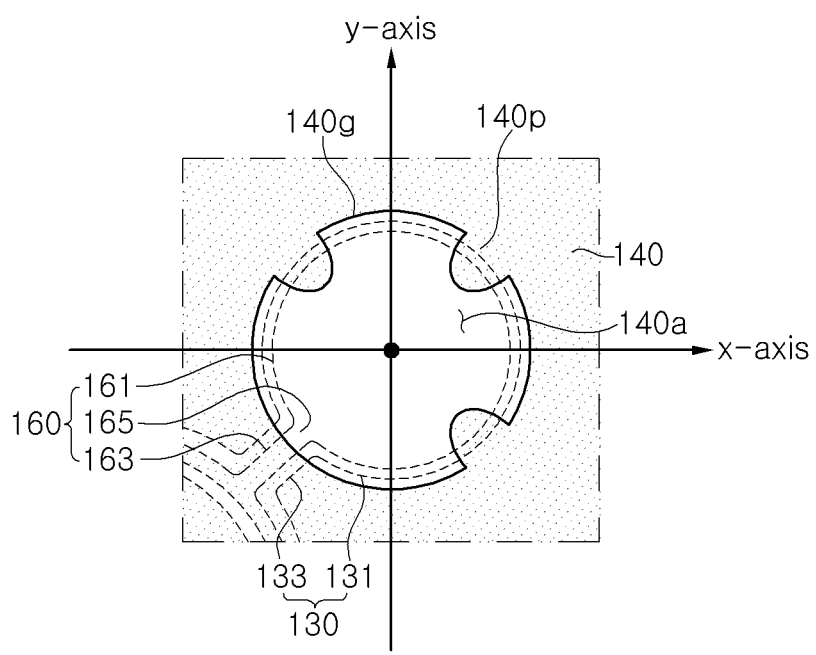

FIGS. 19 to 21B are a plan view, cross-sectional views, and enlarged plan views of a light emitting element according to yet another exemplary embodiment of the present disclosure. FIG. 19 is a plan view of the light emitting element according to this embodiment, and FIGS. 20A and 20B are cross-sectional views taken along line P-P' and line Q-Q' of FIG. 19. FIGS. 21A and 21B are enlarged plan views of a region around the second electrode pad 161 in FIG. 19, and in the enlarged plan views of FIG. 19, a transparent electrode 140 is indicated by a solid line and a current blocking layer 130 and a second electrode 160 are indicated by broken lines for convenience of description.

The light emitting element according to the exemplary embodiment of FIGS. 19 to 21B differs from the light emitting element of FIGS. 1A to 4B in that the light emitting element according to this exemplary embodiment includes a plurality of light emitting cells C1 to C7. The following description will focus on different features of the light emitting element according to this exemplary embodiment and detailed descriptions of the same components will be omitted. Referring to FIGS. 19 to 21B, the light emitting element includes a plurality of light emitting cells C1 to C7 each including a light emitting structure 120, a first electrode 150, a second electrode 160, and a connection electrode 190. Each of the light emitting cells C1 to C7 may include a transparent electrode 140 and the light emitting element may further include a substrate 110 and a current blocking layer 130. The current blocking layer 130 may include a pad current blocking layer 131, an extension current blocking layer 133, and a connection electrode current blocking layer 135.

The plurality of light emitting cells C1 to C7 may be disposed on the substrate 110 and may include a mesa 120m including a second conductive type semiconductor layer 125 and an active layer 123. An exposed portion of the first conductive semiconductor layer 121 may be formed around the mesa 120m and may provide at least some region in which the first electrode 150 is disposed and a region to which the connection electrode 190 is connected.

The first electrode 150 may be disposed on at least one of the plural light emitting cells C1 to C7 and the second electrode 160 may be disposed on at least one of the plural light emitting cells C1 to C7. For example, as shown in the drawings, the second electrode 160 may be disposed on a first light emitting cell C1 and the first electrode 150 may be disposed on a seventh light emitting cell C7.

The plurality of light emitting cells C1 to C7 may be electrically connected to each other so as to form at least one electrical connection among series connection, parallel connection and reverse-parallel connection. In this exemplary embodiment, the light emitting cells C1 to C7 are connected to one another in series. As shown in the drawings, a portion of the first light emitting cell C1 through which the first conductive type semiconductor layer 121 is exposed is electrically connected to the transparent electrode 140 of the second light emitting cell C2 through the connection electrode 190, and the first and second light emitting cells C1 and C2 are connected to each other in series by the connection electrode 190. Similarly, the second to sixth light emitting cells C2 to C7 may be connected in series to adjacent light emitting cells, respectively. Accordingly, the light emitting element according to this exemplary embodiment includes a structure in which the first to seventh light emitting cells C1 to C7 are connected to one another in series. However, it should be understood that other implementations are also possible and at least some of the light emitting cells C1 to C7 may be connected in parallel or in reverse-parallel.

Although the shapes of the light emitting cells C1 to C7 are not particularly limited, the light emitting cells C1 to C7 may have a parallelogram shape and a pentagon shape in this exemplary embodiment. The light emitting cells C1 to C7 have substantially the same area and thus the areas of effective light emitting surfaces of the light emitting cells C1 to C7, from which light is emitted, may also be substantially the same.

The connection electrode 190 electrically connects adjacent light emitting cells C1 to C7 to one another, and may include a first contact portion 191, a connection portion 193 and a second contact portion 195. Referring to the enlarged views of FIG. 19 and FIG. 20B, the first contact portion 191 may be electrically connected to the first conductive type semiconductor layer 121 of the first light emitting cell C1, and the second contact portion 195 may be electrically connected to the transparent electrode 140 of the second light emitting cell C2 so as to be electrically connected to the second conductive type semiconductor layer 125 of the second light emitting cell C2. In addition, the connection portion 193 electrically connects the first contact portion 191 and the second contact portion 195 to each other such that the first light emitting cell C1 and the second light emitting cell C2 can be connected to each other in series.

A connection electrode current blocking layer 135 may be disposed at least in some region below the connection electrode 190. The connection electrode current blocking layer 135 may be disposed below the second contact portion 195 and the transparent electrode 140 of the second light emitting cell C2 may be interposed between the connection electrode current blocking layer 135 and the second contact portion 195. In addition, the connection electrode current blocking layer 135 may extend to a side surface of the second light emitting cell C2 so as to be at least partially disposed below the connection portion 193, and may also be disposed in a region between first light emitting cell C1 and the second light emitting cell C2. Accordingly, the connection portion 193 contacts the first conductive type semiconductor layer 121 of the second light emitting cell C2 through the side surface of the second light emitting cell C2 to prevent electrical short. The connection electrode current blocking layer 135 disposed below the connection portion 193 may have a greater width than the connection portion 193 in order to more effectively prevent electrical short along the connection portion 193. In addition, the transparent electrode 140 of the second light emitting cell C2 may extend toward the first light emitting cell C1 so as to be interposed between the connection electrode current blocking layer 135 and the connecting portion 193. Furthermore, the transparent electrode 140 extending towards the first light emitting cell C1 may contact the first conductive type semiconductor layer 121 of the first light emitting cell C1. Thus, not only the connection electrode 190 but also the transparent electrode 140 extending from the second light emitting cell C2 may form electrical connection between the first light emitting cell C1 and the second light emitting cell C2. The width of the transparent electrode 140 disposed under the connection portion 193 may be greater than the width of the connection portion 193 and may be smaller than the width of the connection electrode current blocking layer 135.

On the other hand, among a plurality of protrusions 110p formed on an upper surface of the substrate 110, protrusions 110pa disposed in regions separated from the light-emitting cells C1 to C7 may have a smaller size than the protrusions 110p disposed under the light emitting cells C1 to C7. The exposed protrusions 110pa may have a relatively small size by etching the upper surface of the substrate 110 during a process of isolating the light emitting cells. The connection electrode current blocking layer 135, the transparent electrode 140 and the connecting portion 193 formed on the exposed protrusions 110pa having such a relatively small size may have curved surfaces along the profile of the surfaces of the protrusions 110pa. As the connecting portion 193 is formed on the protrusions 110pa having a relatively small size, the connecting portion 193 can be more stably formed than the case where the connecting portion 193 is formed on the protrusion 110p of the substrate 110, thereby improving reliability of the connection electrode 190. That is, when the connection electrode 190 is formed on the protrusions 110pa having a relatively small size, a possibility of peeling or disconnection of the connection electrode 190 can be reduced, thereby preventing failure of the light emitting element caused by failure of the connection electrode 190, as compared with the case where the connection electrode 190 is formed on the protrusions 110p having a relatively large size. Therefore, the light emitting element can be manufactured in improved yield and can have high reliability.

The connection structure of the connection electrode 190 may be similarly applied to electrical connection between the other light emitting cells C2 to C7. In addition, in one of the light emitting cells C1 to C7, the location of the connection electrode 190 may be changed in various ways and the location and shape of the connection electrode 190 may be changed. For example, as shown in the drawings, in the second light emitting cell C2, the second contact portion 195 is disposed adjacent to one side surface of the second light emitting cell C2 and extends toward other sides adjacent to the one side. In addition, the first contact portion 191 (connected to the third light emitting cell C3) disposed on the second light emitting cell C2 is disposed adjacent to the other side opposite to the one side and extends toward other sides adjacent to the other side. However, it should be understood that other implementations are also possible.

The first electrode 150 may be disposed on the first conductive type semiconductor layer 121 and may be electrically connected to the first conductive type semiconductor layer 121. In particular, the first electrode 150 may form ohmic contact with the first conductive type semiconductor layer 121 through the surface of the first conductive type semiconductor layer 121 exposed through the groove of the mesa 120m of the seventh light emitting cell C7. The first electrode 150 may further include an electrode extension (not shown).

The second electrode 160 may include a second electrode pad 161 and a second electrode extension 163 and may be disposed on the first light emitting cell C1. The second electrode pad 161 may be disposed on the opening 140a of the transparent electrode 140. The second electrode pad 161 may be spaced apart from the side surface 140g of the opening 140a and at least part of the protrusion 140p of the transparent electrode 140 may be interposed between the second electrode pad 161 and the pad current blocking layer 131. Thus, the second electrode pad 161 and the protrusions 140p of the transparent electrode 140 contact each other to be electrically connected to each other. The second electrode extension 163 extends from the second electrode pad 161. In this exemplary embodiment, the shape and location of the second electrode extension 163 may be similar to those of the second contact portion 195 disposed on the other light emitting cells (second to seventh light emitting cells).

In this exemplary embodiment, with reference to an imaginary plane having an x-axis and a y-axis with a central portion 161c of the second electrode pad 161 defined as the origin, the protrusions 140p of the transparent electrode 140 may be located on at least one of the x (+), x (−), y (+) and y (−) axes and first to fourth quadrants 1QD, 2QD, 3QD, 4QD except for a region in which an interface 165 is located. Referring to FIG. 21B, the interface 165 between the second electrode pad 161 and the second electrode extension 163 is located in the third quadrant 3QD. The protrusions 140p are located in the first quadrant 1QD, the second quadrant 2QD and the fourth quadrant 4QD instead of the region in which the interface 165 is located.

Figure 22:
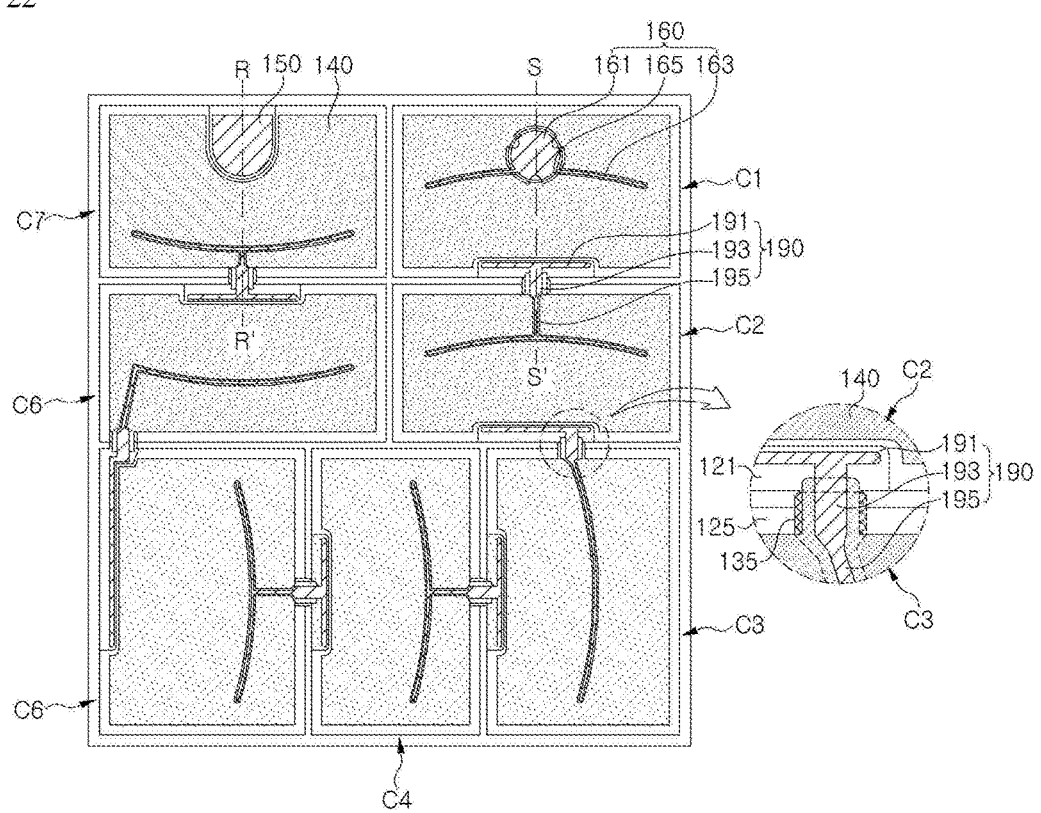
FIGS. 22 to 24B are a plan view, cross-sectional views, and enlarged plan views of a light emitting element according to other exemplary embodiments of the present disclosure.
Figure 23A:
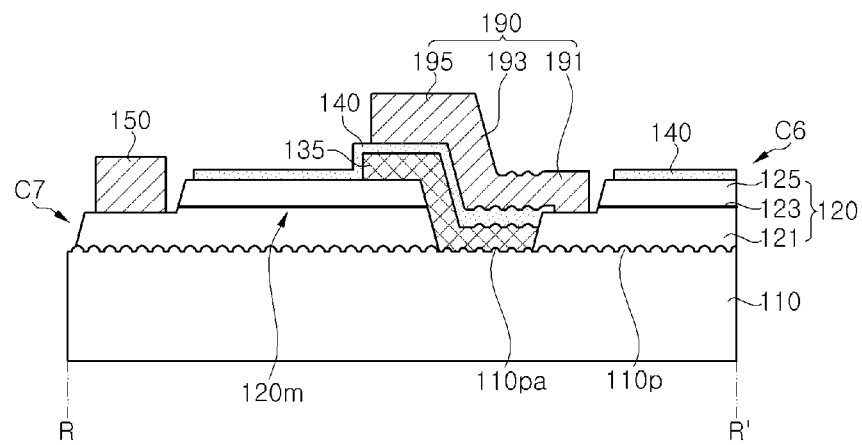
Figure 23B:
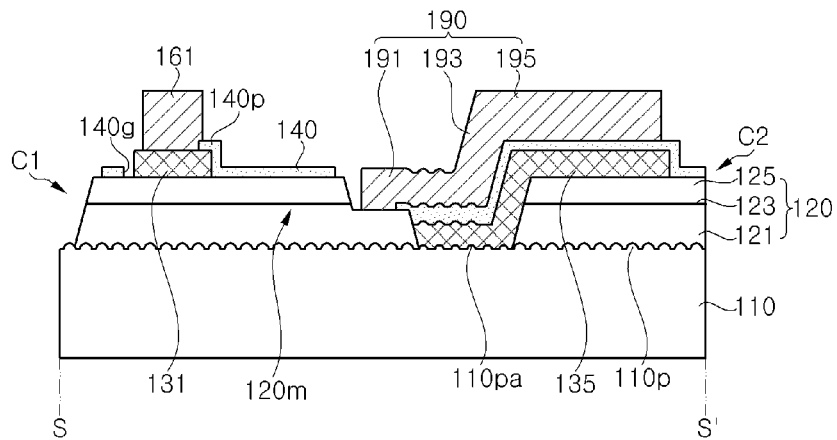
Figure 24A:
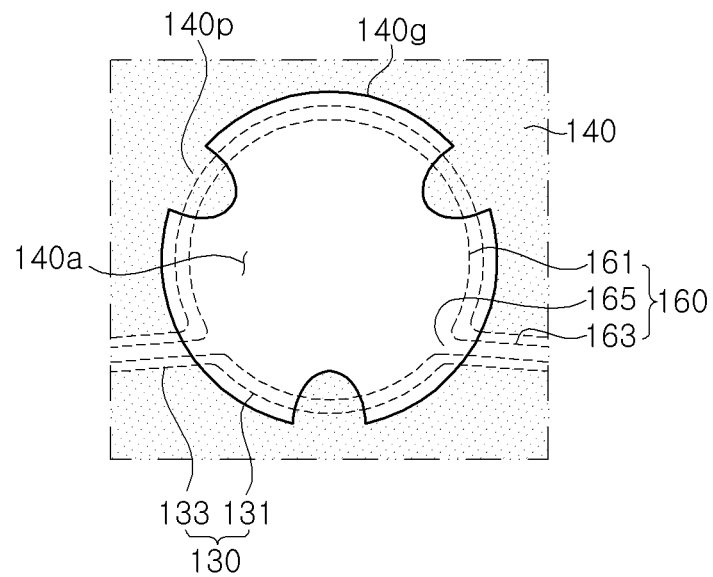
Figure 24B:
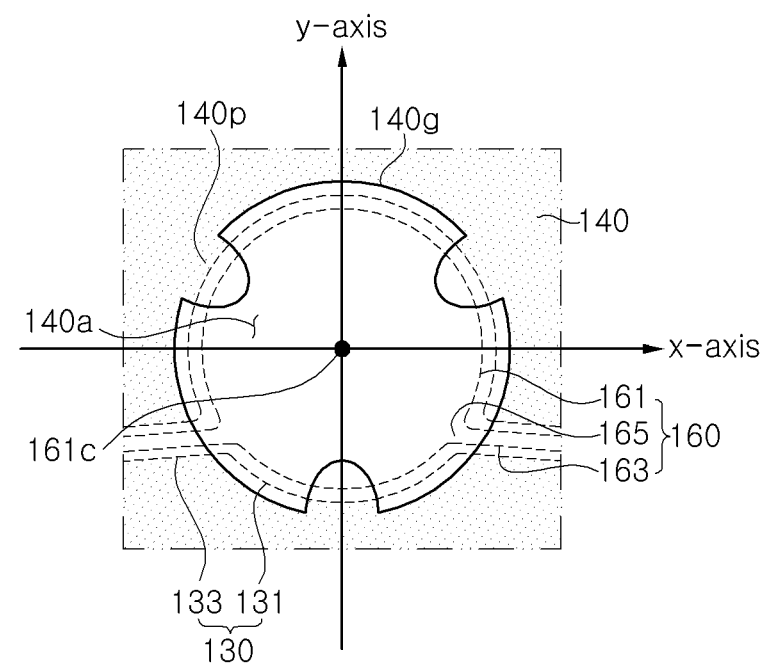

FIGS. 22 to 24B are a plan view, cross-sectional views, and enlarged plan views of a light emitting element according to yet another exemplary embodiment of the present disclosure. FIG. 22 is a plan view of the light emitting element according to this embodiment, and FIGS. 23A and 23B are cross-sectional views taken along line R-R' and line S-S' of FIG. 22. FIGS. 24A and 24B are enlarged plan views of a region around a second electrode pad 161 in FIG. 22, and in the enlarged plan views of FIGS. 24A and 24B, a transparent electrode 140 is indicated by a solid line and a current blocking layer 130 and a second electrode 160 are indicated by broken lines for convenience of description.

The light emitting element according to the exemplary embodiment of FIGS. 22 to 24B differs from the light emitting element of FIGS. 19 to 21B in terms of arrangement of the plural light emitting cells C1 to C7. The following description will focus on different features of the light emitting element according to this exemplary embodiment and detailed descriptions of the same components will be omitted. Referring to FIGS. 22 to 24B, the light emitting element includes a plurality of light emitting cells C1 to C7 each including a light emitting structure 120, a first electrode 150, a second electrode 160, and a connection electrode 190. Each of the light emitting cells C1 to C7 includes a transparent electrode 140 and the light emitting element may further include a substrate 110 and a current blocking layer 130. In this exemplary embodiment, the current blocking layer 130 may include a pad current blocking layer 131, an extension current blocking layer 133, and a connection electrode current blocking layer 135.

The light emitting cells C1 to C7 according to this exemplary embodiment have a substantially rectangular shape and may be connected to each other in series, similar to the exemplary embodiment shown in FIGS. 19 to 21B. The arrangement of the first electrode 150, the second electrode 160, and the connection electrode 190 may be modified according to an arrangement relationship of the light emitting cells C1 to C7 according to this exemplary embodiment. Referring to FIG. 24B, an interface 165 between the second electrode pad 161 and the second electrode extension 163 is disposed on the third quadrant 3QD and the fourth quadrant 4QD. The protrusions 140p may be located in the first quadrant 1QD, the second quadrant 2QD, and the y (−) axis instead of the region in which the interface 165 is located.

In the above exemplary embodiments, the light emitting element has seven light emitting cells connected to each other in series, but other implementations are also possible. The number, shape, and electrical connection relationship of the light emitting cells are not limited thereby and may be modified in various ways.

EXAMPLE 1

Figure 25:
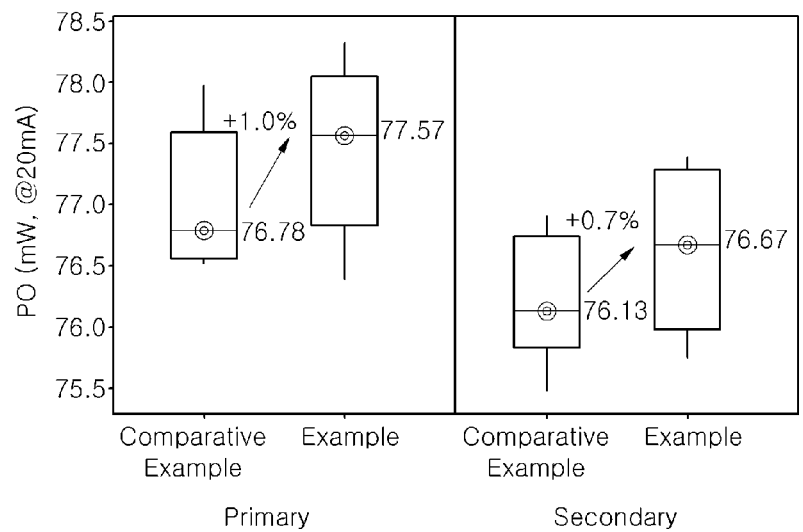
FIGS. 25 to 27 are graphs showing example values for comparing light emitting elements according to exemplary embodiments with a light emitting element of Comparative Example.
Figure 26:
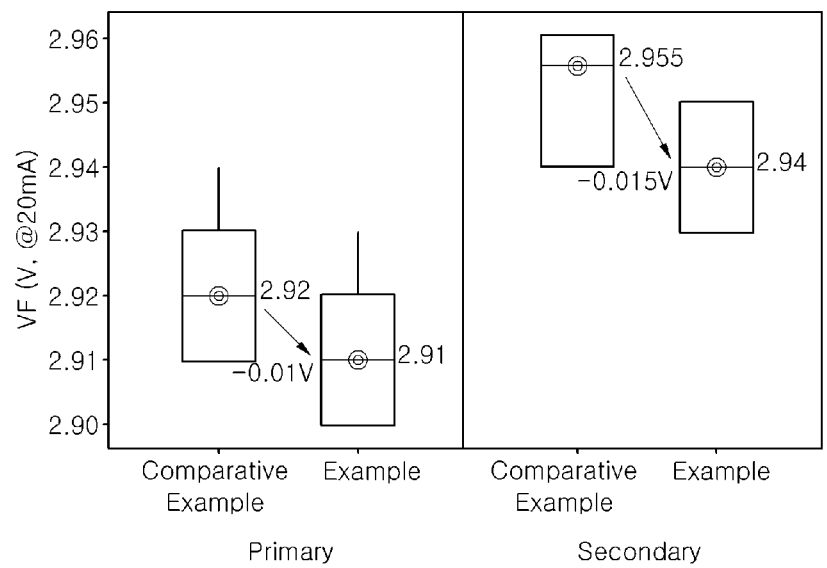

FIGS. 25 and 26 are graphs showing example values for comparing a light emitting element of one example with a light emitting element of a comparative example. In this example, the light emitting elements of the example and the comparative example have substantially similar structures to those of the light emitting element according to the exemplary embodiment shown in FIGS. 1A to 4B. However, the light emitting element of the example has a transparent electrode 140 including protrusions 140p as in the exemplary embodiment shown in FIGS. 1A to 4B, and the light emitting element of the comparative example does not include the protrusions 140p as in the structure shown in FIGS. 18C and 18D.

FIGS. 25 and 26 are graphs comparing optical power and forward voltage at 20 mA for each of the light emitting elements of the example and the comparative example, in which different light emitting elements having the same structure were compared twice. As shown in FIGS. 25 and 26, the light emitting element of the example had higher optical power and lower forward voltage than the light emitting element of the comparative example. In other words, it can be seen that the light emitting element of the example allows smoother current spreading in the horizontal direction than the light emitting element of the comparative example, thereby relatively improving optical power while relatively lowering forward voltage.

EXAMPLE 2

Figure 27:
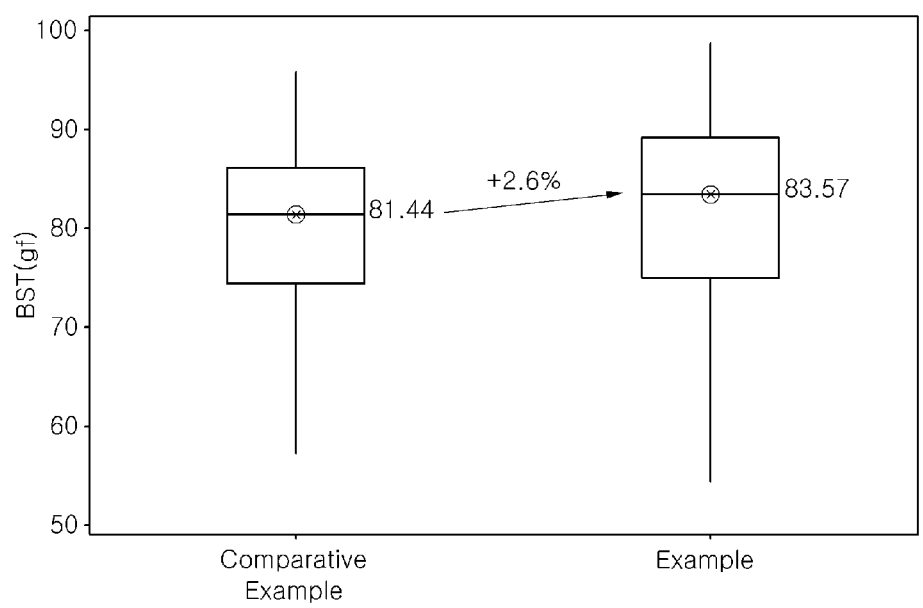

FIG. 27 is a graph depicting BST measurement data for each of light emitting elements of one example and a comparative example. In this example, the light emitting elements of the example and the comparative example have substantially similar structures to those of the light emitting element according to the exemplary embodiment shown in FIGS. 1A to 4B. However, the light emitting element of the example has a transparent electrode 140 including protrusions 140p as in the exemplary embodiment shown in FIGS. 1A to 4B, and the light emitting element of the comparative example includes the transparent electrode disposed along the entire periphery of a second electrode pad as in the structure shown in FIGS. 18A and 18B. As shown in FIG. 27, the light emitting element of the example has a BST value about 2.6% higher than that of the comparative example. That is, it can be seen that the light emitting element of the example suppresses peeling of the second electrode pad, as compared with the light emitting element of the comparative example, and thus has improved reliability.

Figure 28A:
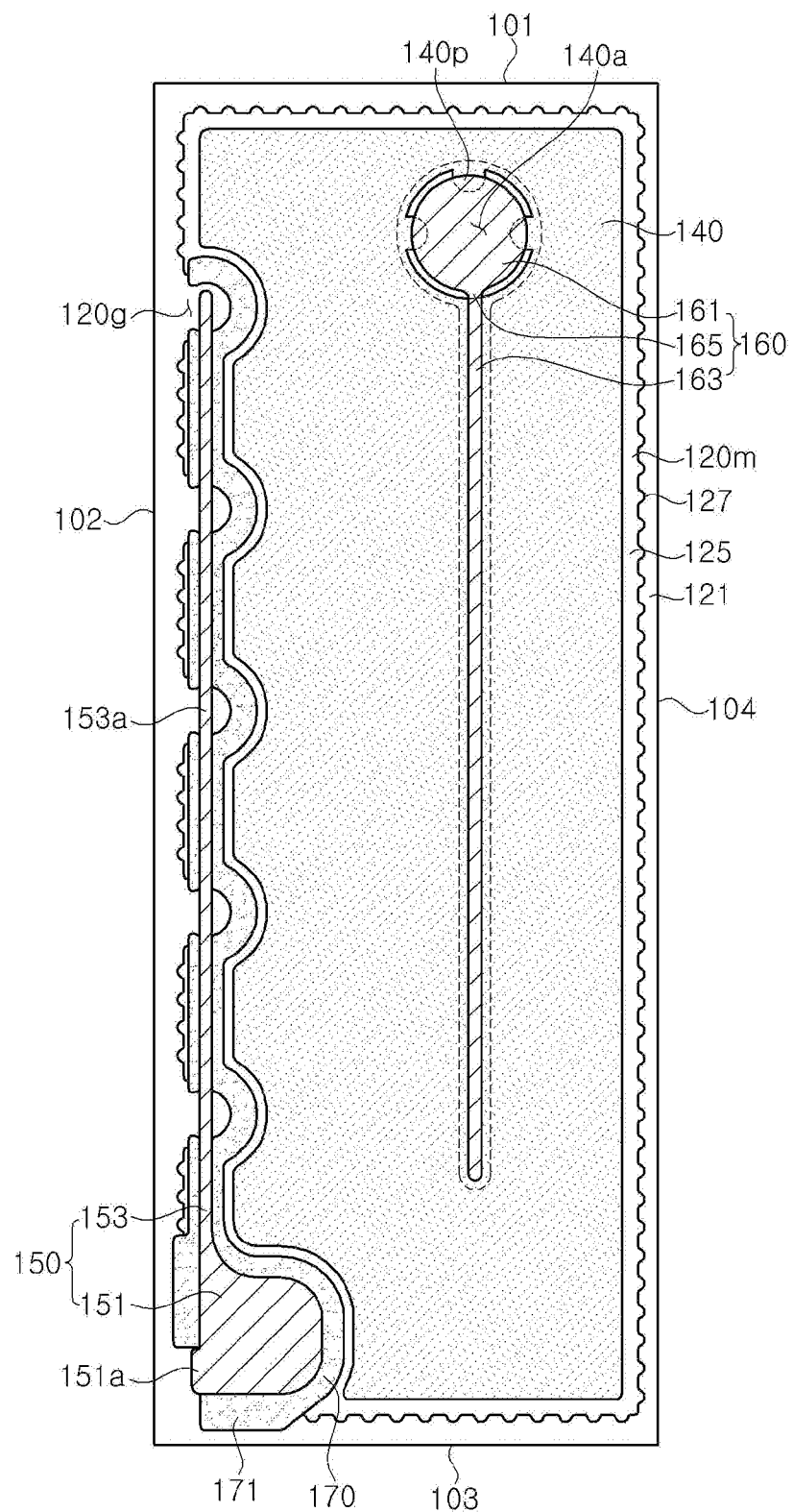
FIGS. 28A to 38 are plan views, enlarged plan views, cross-sectional views, and enlarged cross-sectional views of a light emitting element according to other exemplary embodiments of the present disclosure.
Figure 28B:
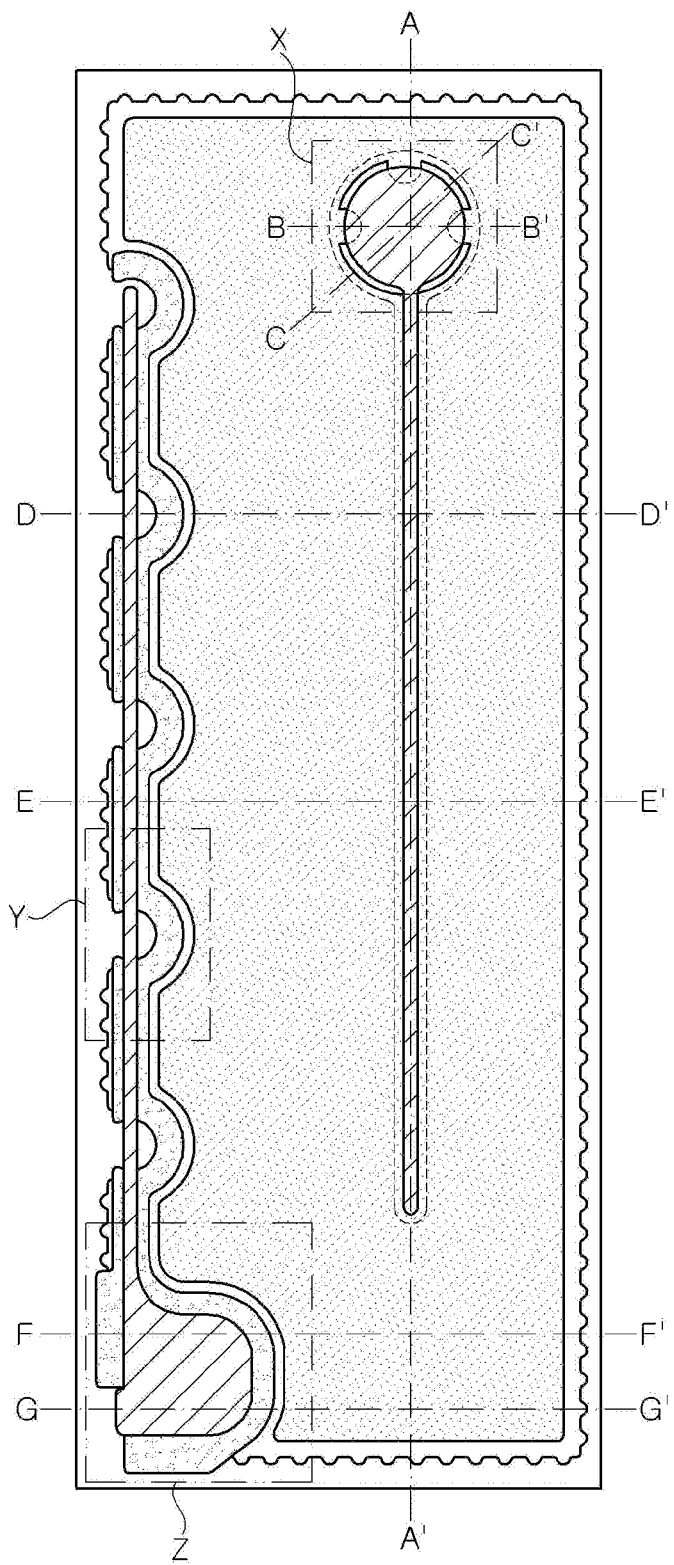
Figure 29A:
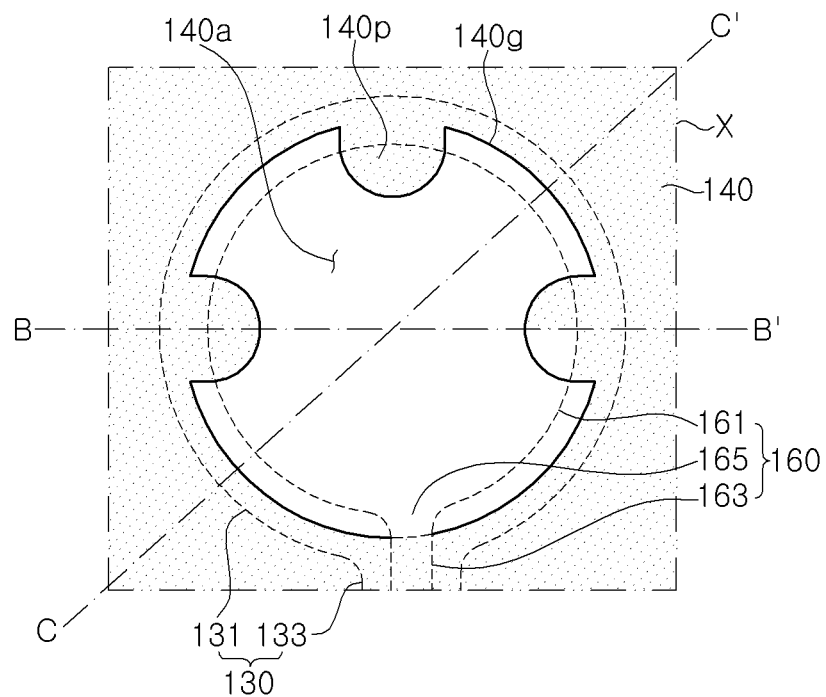
Figure 29B:
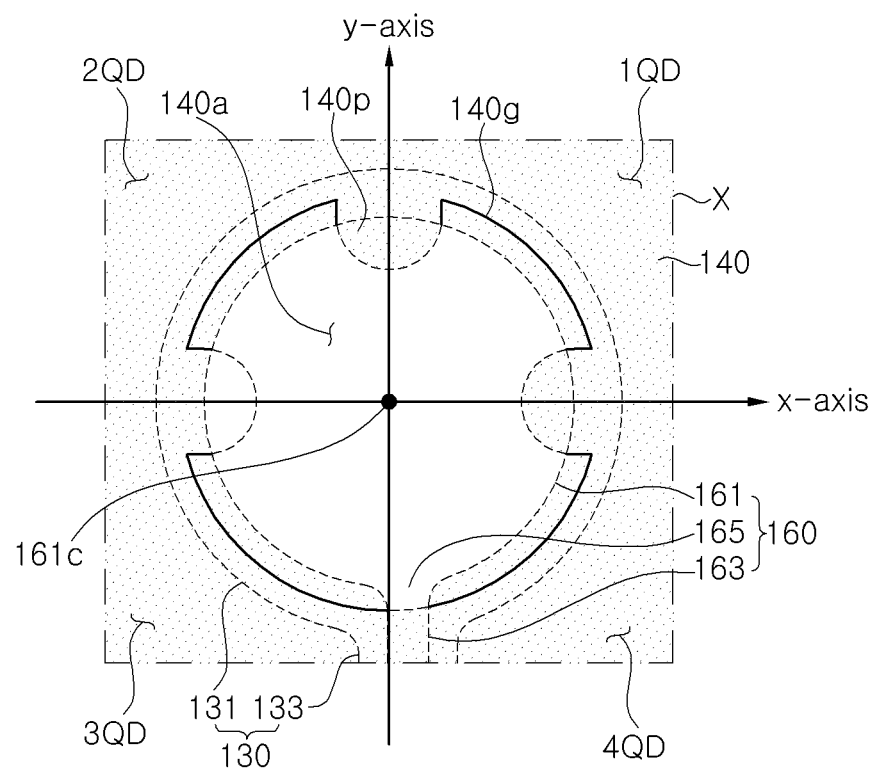
Figure 30:
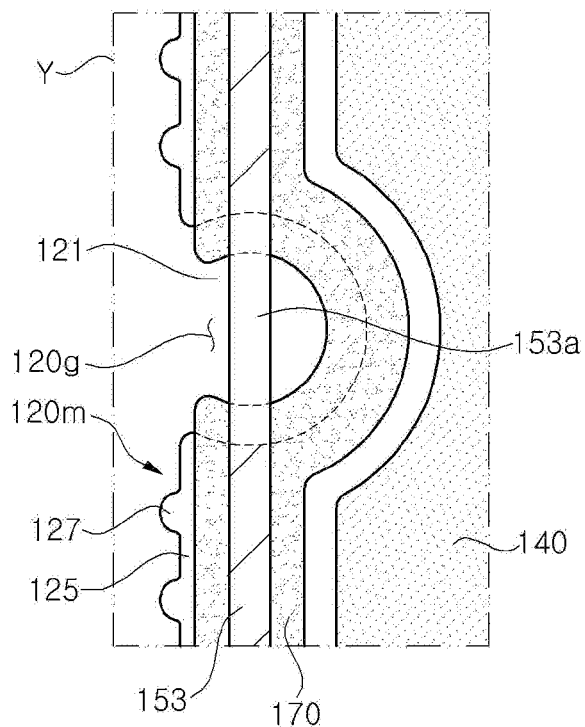
Figure 31:
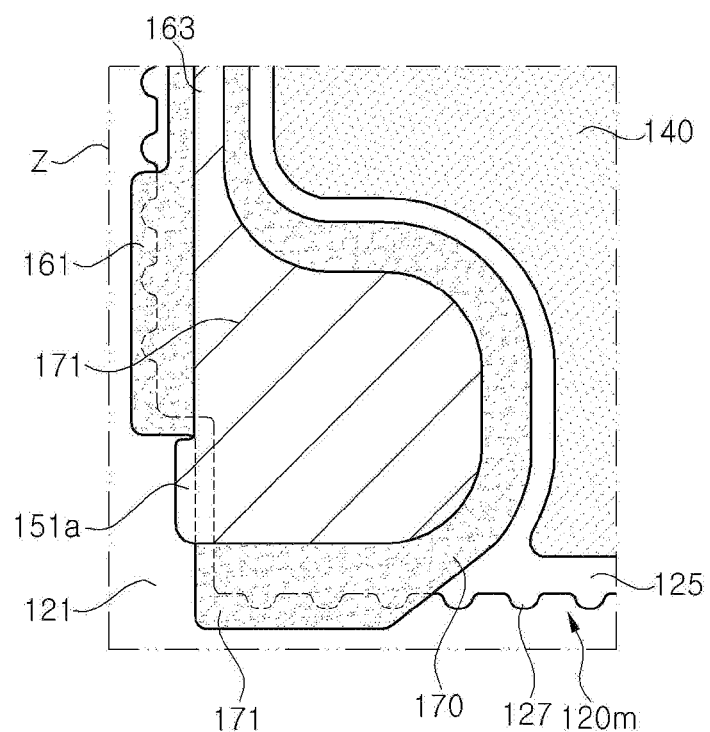
Figure 32:
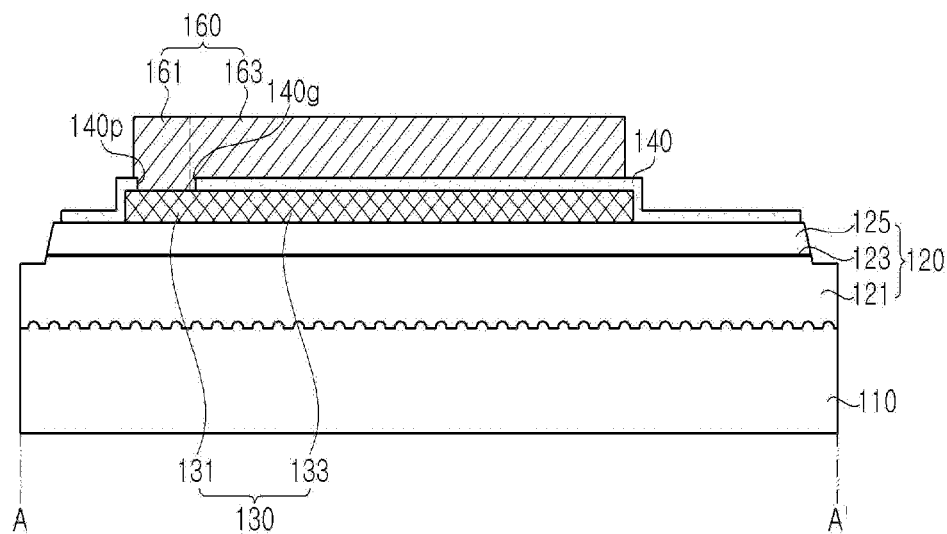
Figure 33:
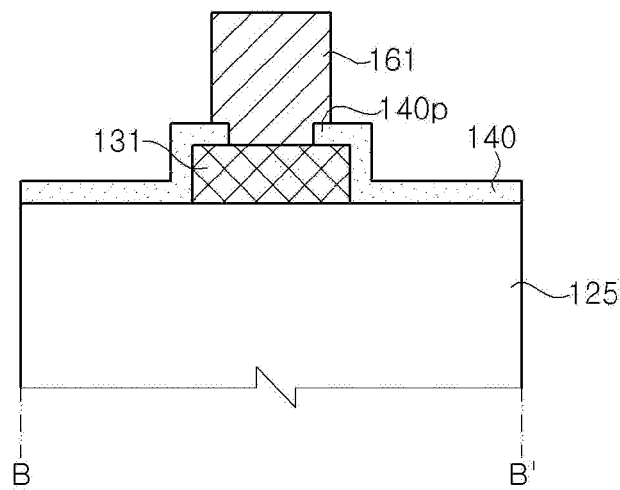
Figure 34:
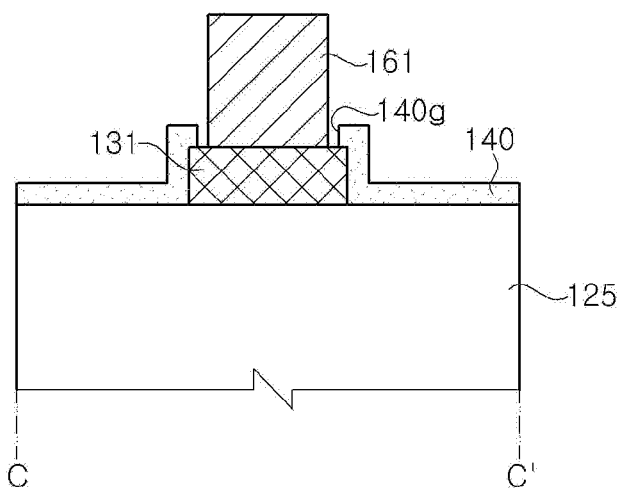
Figure 35:
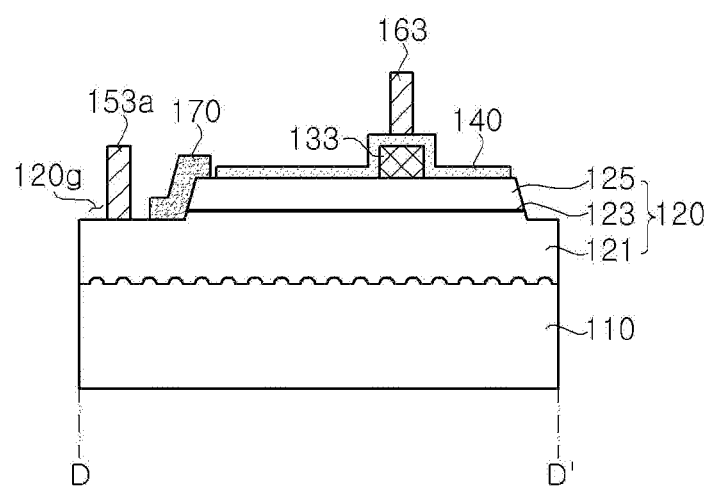
Figure 36:
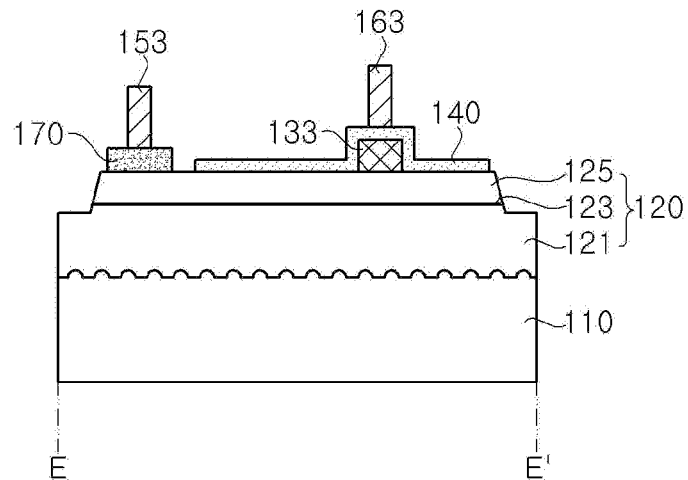
Figure 37:
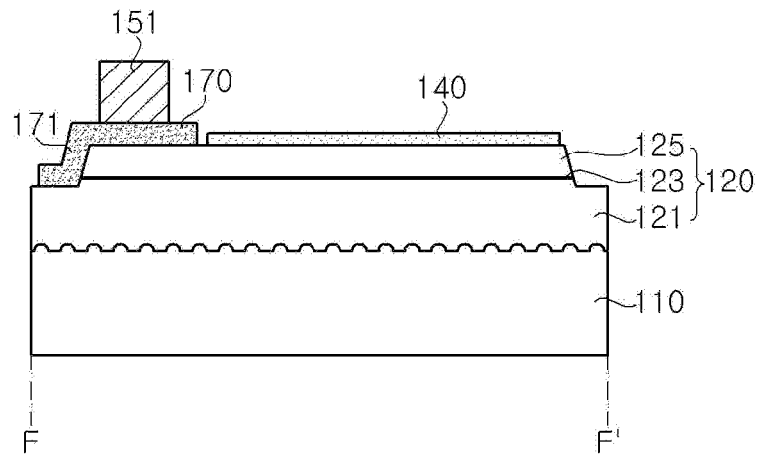
Figure 38:
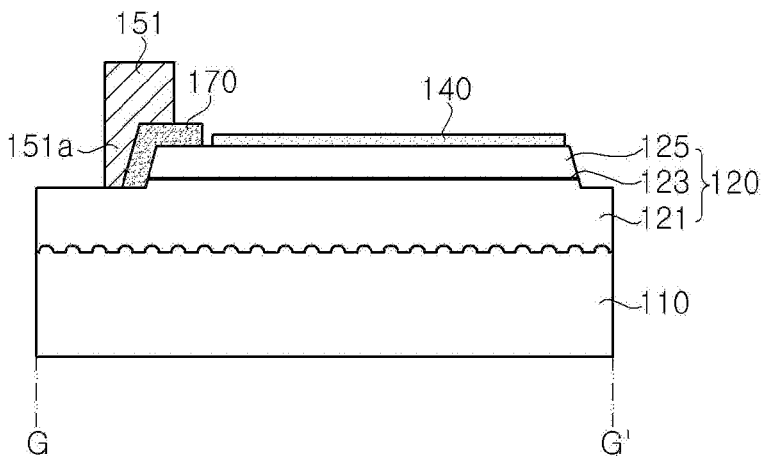

FIG. 28A to FIG. 38 are plan views, enlarged plan views, cross-sectional views, and enlarged cross-sectional views of a light emitting element according to some exemplary embodiments of the present disclosure. FIG. 28A is a plan view of the light emitting element and FIG. 28B is a plan view of the light emitting element, showing portions corresponding to the enlarged plan views, the cross-sectional views and the enlarged cross-sectional views of FIG. 29 to FIG. 38. FIGS. 29A and 29B are enlarged views of Region X of FIG. 28B, FIG. 30 is an enlarged view of Region Y of FIG. 28B, and FIG. 31 is an enlarged view of Region Z of FIG. 28B. FIGS. 32 to 38 are cross-sectional views taken along lines A-A', B-B', C-C', D-D', E-E', F-F' and G-G' of FIG. 28B, respectively.

Referring to FIGS. 28A to 38, the light emitting element includes a light emitting structure 120, a transparent electrode 140, a first electrode 150, and an insulation layer 170. In addition, the light emitting element may further include a substrate 110, a current blocking layer 130, a second electrode 160, and a passivation layer 230. Further, the light emitting element may include first to fourth sides 101, 102, 103, 104.

The substrate 110 may be or include an insulating or conductive substrate. In addition, the substrate 110 may be a growth substrate for growing the light emitting structure 120, and may include a sapphire substrate, a silicon carbide substrate, a silicon substrate, a gallium nitride substrate, an aluminum nitride substrate, or the like. For example, the substrate 110 may be a sapphire substrate, particularly, a patterned sapphire substrate (PSS) having a patterned upper surface. When the substrate 110 is a patterned sapphire substrate, the substrate 110 may include a plurality of protrusions 110p formed on the upper surface thereof. However, it should be understood that other implementations are also possible and the substrate 110 may be a secondary substrate for supporting the light emitting structure 120.

Although the first conductive type semiconductor layer 121 is described as being disposed on the substrate 110 in this exemplary embodiment, when the substrate 110 is a growth substrate capable of growing the semiconductor layers 121, 123, 125 thereon, the substrate 110 may be separated and removed by physical and/or chemical methods after growth of the semiconductor layers 121, 123, 125 thereon.

The light emitting structure 120 may include a first conductive type semiconductor layer 121, a second conductive type semiconductor layer 125 disposed on the first conductive type semiconductor layer 121, and an active layer 123 interposed between the first conductive type semiconductor layer 121 and the second conductive type semiconductor layer 125. In addition, the light emitting structure 120 may include a mesa 120m disposed on the first conductive type semiconductor layer 121 and including the active layer 123 and the second conductive type semiconductor layer 125.

The first conductive type semiconductor layer 121, the active layer 123 and the second conductive type semiconductor layer 125 may be grown in a chamber using a well-known method such as MOCVD. In addition, the first conductive type semiconductor layer 121, the active layer 123 and the second conductive type semiconductor layer 125 may include Group III-V based nitride semiconductors, for example, nitride semiconductors such as (Al, Ga, In)N. The first conductive type semiconductor layer 121 may include n-type dopants (for example, Si, Ge, Sn) and the second conductive type semiconductor layer 125 may include p-type dopants (for example, Mg, Sr, Ba), or vice versa. The active layer 123 may include a multiple quantum well (MQW) structure and the composition ratio of the nitride based semiconductors may be adjusted to emit light having a desired wavelength. In particular, in this exemplary embodiment, the second conductive type semiconductor layer 125 may be a p-type semiconductor layer.

The mesa 120m is disposed in some region of the first conductive type semiconductor layer 121 such that the surface of the first conductive type semiconductor layer 121 can be exposed in a region in which the mesa 120m is not formed. The mesa 120m may be formed by partially etching the second conductive type semiconductor layer 125 and the active layer 123. The mesa 120m may be formed, for example, along a side surface of the first conductive type semiconductor layer 121, as shown in the drawings, without being limited thereto. The mesa 120m may have an inclined side surface, or may have a side surface perpendicular to an upper surface of the first conductive type semiconductor layer 121.

Further, in this exemplary embodiment, the mesa 120*m* may include at least one groove 120*g* depressed from a side surface of the mesa 120*m*. As described below, the groove 120*g* may provide a region in which a first electrode 150 electrically contacts the first conductive type semiconductor layer 121. The groove 120*g* may be formed in plural and the plurality of grooves 120*g* may be arranged along one side of the light emitting element. As shown in the drawings, the plurality of grooves 120*g* may be disposed on the second side 102 of the light emitting element, which may have a relatively long length. The second side 102 may have a longer length than the first and third sides 101,103 adjacent to the second side 102. Further, the plurality of grooves 120*g* may be arranged at substantially constant intervals. The plurality of grooves 120*g* providing a contact region between the first electrode 150 and the first conductive type semiconductor layer 121 are disposed along the side surface having a relatively long length, whereby electric current can be uniformly supplied throughout the light emitting region of the light emitting element. In addition, since the plural grooves 120*g* are arranged at substantially constant intervals, electric current can be evenly spread throughout the light emitting region.

The grooves 120*g* may have a planar shape including at least part of a polygonal, circular or elliptical shape. For example, as shown in FIG. 30, the grooves 120*g* may have an arc shape in a plan view. As the grooves 120*g* are formed in an arc shape, it is possible to provide a sufficient contact area between the first conductive type semiconductor layer 121 and the first electrode 150 while minimizing reduction in the area of the light emitting region due to formation of the grooves 120*g* (the area of the active layer 123 to be removed due to formation of the grooves 120*g*). However, it should be understood that other implementations are also possible.

In addition, the mesa 120*m* may further include a concavo-convex pattern 127 formed on a side surface thereof. With this structure, the light emitting element can have improved light extraction efficiency.

The current blocking layer 130 is at least partially disposed on the second conductive type semiconductor layer 125. The current blocking layer 130 may be disposed on the second conductive type semiconductor layer 125 corresponding to the location of the second electrode 160. The current blocking layer 130 may include a pad current blocking layer 131 and an extension current blocking layer 133. The pad current blocking layer 131 and the extension current blocking layer 133 may be disposed corresponding to the locations of a second electrode pad 161 and a second electrode extension 163, respectively. Thus, as shown in the drawings, the pad current blocking layer 131 is disposed adjacent to the first side 101 of the light emitting element and the extension current blocking layer 133 extends from the first side 101 towards the third side 103.

The current blocking layer 130 can prevent electric current supplied to the second electrode 160 from being directly transmitted to the semiconductor layer, thereby preventing current crowding. Thus, the current blocking layer 130 may have insulating properties, may include an insulation material, and may be composed of a single layer or multiple layers. For example, the current blocking layer 130 may include $SiO_x$ or $SiN_x$, or may include a distributed Bragg reflector in which insulation material layers having different indices of refraction are stacked one above another. That is, the current blocking layer 130 may have light transmittance, light reflectivity, or selective light reflectivity. In addition, the current blocking layer 130 may have a larger area than the second electrode 160 formed on the current blocking layer 130. Thus, the second electrode 160 may be disposed within a region in which the current blocking layer 130 is formed. Furthermore, the current blocking layer 130 may have a larger area than the second electrode 160 and may have a planar shape substantially corresponding to the planar shape of the second electrode 160. Accordingly, the current blocking layer 130 can prevent electric current supplied to the second electrode 160 from being directly transmitted to the first conductive type semiconductor layer 121 through the transparent electrode 140, while minimizing decrease in luminous efficacy due to absorption or reflection of light by the current blocking layer 130.

The transparent electrode 140 may be disposed on the second conductive type semiconductor layer 125 and may cover a portion of an upper surface of the second conductive type semiconductor layer 125 and a portion of the current blocking layer 130. As shown in FIGS. 29A and 29B, the transparent electrode 140 may include an opening 140*a* that partially exposes the pad current blocking layer 131. In addition, the transparent electrode 140 includes a protrusion 140*p* protruding inwardly toward at least one of the second electrode pad 161 or the pad current blocking layer 131 from a side surface 140*g* of the opening 140*a*. The side surface 140*g* of the opening 140*a* may be disposed on a pad current blocking layer 131 and may be formed along an outer side of the pad current blocking layer 131. The protrusion 140*p* may protrude towards the center of the pad current blocking layer 131 and may be formed in plural. The transparent electrode 140 may include a material having light transmittance and electrical conductivity, and may include at least one of a conductive oxide, such as ITO, ZnO and IZO, and a light-transmitting metal layer, such as Ni/Au. In addition, the transparent electrode 140 may form ohmic contact with the second conductive type semiconductor layer 125. Since the second electrode 160 does not directly contact the second conductive type semiconductor layer 125, electric current can be more effectively spread through the transparent electrode 140.

The second electrode 160 is disposed on the second conductive type semiconductor layer 125 and at least part of the second electrode 160 is disposed on a region in which the current blocking layer 130 is disposed. The second electrode 160 includes a second electrode pad 161 and a second electrode extension 163, which may be disposed on the pad current blocking layer 131 and the extension current blocking layer 133, respectively. Thus, a portion of the transparent electrode 140 may be interposed between the second electrode 160 and the current blocking layer 130.

In particular, the second electrode pad 161 may be disposed on the opening 140*a* of the transparent electrode 140. The second electrode pad 161 may be spaced apart from the side surface 140*g* of the opening 140*a* and at least part of the protrusion 140*p* of the transparent electrode 140 may be interposed between the second electrode pad 161 and the pad current blocking layer 131. Thus, the second electrode pad 161 and the protrusion 140*p* of the transparent electrode 140 contact each other to be electrically connected to each other. The second electrode pad 161 may have, for example, a substantially circular shape, as shown in the drawings, but is not limited thereto. Accordingly, the pad current blocking layer 131 of the current blocking layer 130 may be formed in a circular shape similar to the shape of the second electrode pad 161, and the opening 140*a* of the transparent electrode 140 may be formed in a substantially similar circular shape. However, it should be understood that other implementations are also possible. Although not particularly limited, the location of the second electrode pad 161 may be determined so as to allow light to be emitted through the entire surface of the active layer 123 of the light emitting element by efficiently spreading electric current. For example, as shown in the drawings, the second electrode pad 153 may be disposed adjacent to the first side 101 opposite to the third side 103, adjacent to which the first electrode pad 151 is disposed.

The second electrode extension 163 extends from the second electrode pad 161. In this exemplary embodiment, the second electrode extension 163 may extend from the second electrode pad 161 toward the third side 103. In addition, the extension direction of the second electrode extension 163 may be changed. For example, a distal end of the second electrode extension 163 may be bent toward a portion between the third side 103 and the fourth side 104 of the light emitting element. This structure can be designed in various ways in consideration of the distance between the first electrode pad 151 and the second electrode extension 163. The transparent electrode 140 is interposed between at least part of the second electrode extension 163 and the extension current blocking layer 133 such that the second electrode extension 163 is electrically connected to the transparent electrode 140.

The arrangement of the second electrode 160 is not limited thereto and may be modified and changed in various ways according to the shape of the light emitting element.

The second electrode 160 may include a conductive material and may include a metallic material such as Ti, Pt, Au, Cr, Ni, Al, and Mg, and may be composed of a single layer or multiple layers. In the structure wherein the second electrode 160 is composed of multiple layers, the second electrode 160 may include at least one of metal stack structures of Ti/Au layers, Ti/Pt/Au layers, Cr/Au layers, Cr/Pt/Au layers, Ni/Au layers, Ni/Pt/Au layers, and Cr/Al/Cr/Ni/Au layers.

As described above, the transparent electrode 140 is interposed between a portion of the second electrode 160 and the current blocking layer 130 such that electric current can flow through a contact region between the second electrode 160 and the transparent electrode 140. Accordingly, the contact region between the second electrode 160 and the transparent electrode 140 can be adjusted so as to allow electric current to be effectively spread, and, with regard to this, the second electrode 160 according to this exemplary embodiment, particularly, the structure around the second electrode pad 161, will be described in more detail with reference to FIGS. 29A and 29B.

Hereinafter, the structure around the second electrode pad 161 according to this exemplary embodiment will be described with reference to FIGS. 29A and 29B. In enlarged views of FIGS. 29A and 29B, the transparent electrode 140 is indicated by a solid line and the current blocking layer 130 and the second electrode 160 are indicated by broken lines for convenience of description. According to this exemplary embodiment shown in FIGS. 29A and 29B, the opening 140a of the transparent electrode 140 includes a side surface 140g, which is disposed on the pad current blocking layer 131 and is spaced apart from the second electrode pad 161. The opening 140a of the transparent electrode 140 is formed along a side surface of the pad current blocking layer 131 and has a shape substantially corresponding to the side surface shape of the pad current blocking layer 131. In particular, since the side surface of the opening 140a is disposed on the pad current blocking layer 131, an upper surface of the second conductive type semiconductor layer 125 can be covered by the transparent electrode 140 instead of being exposed. Accordingly, the light emitting element can prevent static electricity generated around the second electrode pad 161 from being directly conducted to the second conductive type semiconductor layer 125, thereby more effectively preventing failure caused by electrostatic discharge.

The transparent electrode 140 includes at least one protrusion 140p, which protrudes from the side surface of the opening 140a. The protrusion 140p partially covers the side surface and an upper surface of the pad current blocking layer 131, as shown in FIGS. 29A and 29B, and is interposed between the pad current blocking layer 131 and the second electrode pad 161. Accordingly, the second electrode pad 161 and the protrusion 140p are electrically connected to each other such that electric current can flow through the second electrode pad 161 and the protrusion 140p. Thus, current injection into a region in which the protrusion 140p is disposed can be efficiently performed. Since the second electrode extension 163 of the second electrode 160 contacts the transparent electrode 140, current injection into the second conductive type semiconductor layer 125 is performed through the second electrode extension 163. Accordingly, the number and locations of the protrusions 140p can be adjusted according to the location of the second electrode extension 163.

As one embodiment, this structure will be described with reference to FIG. 29B. First, assuming an imaginary plane (imaginary coordinate system) having an x-axis and a y-axis with an origin at a central portion 161c of the second electrode pad 161. The intersecting x- and y-axis divide the plane into a first quadrant 1QD, a second quadrant 2QD, a third quadrant 3QD, and a fourth quadrant 4QD. With reference to the imaginary coordinate system, positions of some elements of the light emitting element are presented. The second electrode extension 163 extending from the second electrode pad 161 provides an interface 165 between the second electrode pad 161 and the second electrode extension 163. The interface 165 between the second electrode pad 161 and the second electrode extension 163 may be located in various positions including at least one of the x (+) axis, the x (−) axis, the y (+) axis, the y (−) axis, or the first to fourth quadrants 1QD, 2QD, 3QD, 4QD. The x(+) axis and the x(−) axis refer to positive x-axis and negative x-axis, respectively, and the y (+) axis and the y (−) axis refer to the positive x-axis and negative y-axis, respectively. In this case, at least one protrusion 140p may be located in different positions from where the interface 165 is located. The protrusions 140p may be located, for example, on at least one of the remaining portions including x (+), x (−), y (+) and y (−) axes or the first to fourth quadrants 1QD, 2QD, 3QD, 4QD except for the region in which the interface 165 is located. For example, in this exemplary embodiment as shown in FIGS. 29A and 29B, the interface 165 between the second electrode pad 161 and the second electrode extension 163 is located in the fourth quadrant 4QD and/or on the y (−) axis and three protrusions 140p are located on the x (+), x (−) and y (+) axes, respectively. Thus, electric current can be injected into regions corresponding to regions around the fourth quadrant 4QD and the y (−) axis through the second electrode extension 163 and can be injected into regions corresponding to regions around the x (+), x (−) and y (+) axes through the protrusions 140p.

On the other hand, a contact area between a lower surface of the second electrode pad 161 and the transparent electrode 140 may be 1% to 20% of the entire area of the lower surface of the second electrode pad 161, specifically 1.5% to 13%, more specifically 3% to 5%. Within this range of the contact area between the lower surface of the second electrode pad 161 and the transparent electrode 140, a contact area between the second electrode pad 161 and the pad current blocking layer 131 can be set to be relatively large. Therefore, peeling of the second electrode pad 161 can be effectively prevented at a contact portion between the second electrode pad 161 and the transparent electrode 140. In addition, the protrusions 140p may have various shapes and may have, for example, a circular arc shape or an elliptical arc shape, as shown in the drawings.

As in this exemplary embodiment, the transparent electrode 140 is disposed only in some region of the interface between the second electrode pad 161 and the pad current blocking layer 131, whereby the second electrode pad 161 can be effectively prevented from being peeled off the transparent electrode 140. Particularly, due to the structure of the second electrode pad 161 wherein most of the periphery of the lower surface of the second electrode pad 161 adjoins the current blocking layer 131 and only a small portion of the periphery thereof adjoins the transparent electrode 140, the second electrode pad 161 can be prevented from being peeled off and the light emitting element can have a high BST value. In addition, since the second electrode pad 161 contacts the protrusions 140p of the transparent electrode 140, the light emitting element can relieve current crowding that can occur due to separation of the second electrode pad 161 from the transparent electrode 140 while allowing electric current to be efficiently spread to regions in which the second electrode extension 163 is not disposed. The light emitting element allows efficient current spreading in the horizontal direction, thereby providing high power while lowering forward voltage Vf. Furthermore, since the second electrode pad 161 and the second conductive type semiconductor layer 125 are not directly connected to each other through the transparent electrode 140, the light emitting element can prevent failure or breakage due to static electricity, thereby securing high resistance to electrostatic discharge. In other words, the light emitting element according to this exemplary embodiment can prevent the second electrode pad 161 from being peeled off the transparent electrode to provide high reliability and high current spreading efficiency, and has high resistance to electrostatic discharge, thereby overcoming the problems of Comparative Examples 1 to 3.

Figure 39:
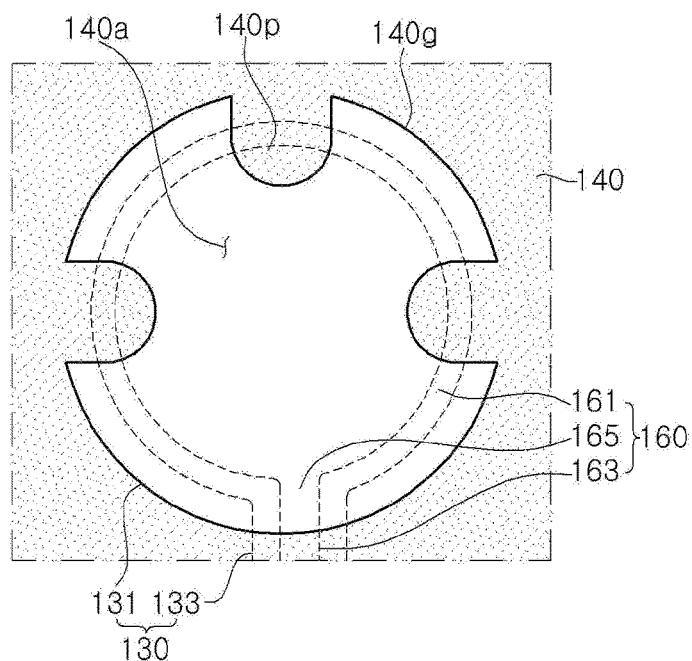
FIG. 39 is an enlarged plan view of a second electrode structure of a light emitting element according to other exemplary embodiments of the present disclosure.

In the light emitting element according to this exemplary embodiment, the shapes and locations of the first electrode 150, the second electrode 160 and the protrusions 140p may be changed in various ways, as needed. In addition, the side surface 140g of the opening 140a of the transparent electrode 140 may be separated from the pad current blocking layer 131. As shown in FIG. 39, the side surface 140g of the opening 140a may be spaced apart from the side surface of the pad current blocking layer 131. Accordingly, the second conductive type semiconductor layer 125 may be partially exposed between the side surface 140g of the opening 140a and the pad current blocking layer 131.

The first electrode 150 may be disposed on the first conductive type semiconductor layer 121 and may be electrically connected to the first conductive type semiconductor layer 121. The first electrode 150 may include a first electrode pad 151 and a first electrode extension 153. The first electrode 150 forms ohmic contact with a portion of the upper surface of the first conductive type semiconductor layer 121, which is exposed by partially removing the second conductive type semiconductor layer 125 and the active layer 123, and thus can be electrically connected to the first conductive type semiconductor layer 121. In this exemplary embodiment, the first electrode 150 is disposed on the mesa 120m and an insulation layer 170 may be interposed between the first electrode 150 and the mesa 120m. The insulation layer 170 may include an insulation material, for example, $SiO_2$ and $SiN_x$, or may include a distributed Bragg reflector in which insulation material layers having different indices of refraction are stacked one above another. In addition, a portion of the first electrode pad 151 and the first electrode extension 153 may contact the first conductive type semiconductor layer 121.

Next, the first electrode 150 will be described in more detail with reference to FIG. 28A, FIG. 30, FIG. 31, and FIGS. 35 to 38.

The first electrode extension 153 is disposed on the insulation layer 170. A portion of the first electrode extension 153 overlaps at least one groove 120g in the vertical or longitudinal direction or a side of the light emitting element. The first electrode extension 153 includes an extension contact portion 153a, which can form ohmic contact with the first conductive type semiconductor layer 121. The extension contact portion 153a forms electrical connection with the first conductive semiconductor layer 121 exposed through the at least one groove 120g and the remaining portion of the first electrode extension 153 is formed on the insulation layer 170 so as to be insulated from the first conductive type semiconductor layer 121, whereby electrons are moved to the first conductive type semiconductor layer 121 through the extension contact portion 153a (that is, electric current flows through the extension contact portion 153a) upon operation of the light emitting element.

When the first electrode 150 is an n-type electrode, electrons are moved from the first electrode 150 towards the second electrode 160. When the entirety of the first electrode extension 153 contacts the first conductive type semiconductor 121, the density of electrons injected into the first conductive type semiconductor layer 121 may vary according to the distance from the first electrode pad 151. That is, the density of electrons injected from a portion of the first electrode extension 153 disposed relatively close to the first electrode pad 151 is higher than the density of electrons injected from a portion of the first electrode extension 153 disposed relatively far from the first electrode pad 151. Thus, when the entirety of the first electrode extension 153 contacts the first conductive type semiconductor layer 121, current spreading performance can be reduced.

Conversely, according to this exemplary embodiment, the first electrode extension 153 contacts the first conductive semiconductor layer 121 through the extension contact portion 153a of the first electrode extension 153 and the remaining portions of the first electrode extension 153 are insulated from the first conductive type semiconductor layer 121 by the insulation layer 170. Thus, electrons are injected through the extension contact portion 153a, whereby a substantially similar electron injection density can be maintained in a plurality of extension contact portions 153a. Accordingly, electrons can be smoothly injected even through a portion of the first electrode extension 153 disposed far from the first electrode pad 151, thereby improving current spreading efficiency of the light emitting element.

Since the extension contact portions 153a may correspond to the number and locations of the grooves 120g, the distance between the extension contact portions 153a may be substantially the same and the extension contact portions 153a may be disposed along one side of the light emitting element. For example, the extension contact portions 153*a* may be disposed adjacent to the second side 102 of the light emitting element.

The insulation layer 170 disposed under the extension contact portions 153*a* may have a greater width than the line width of the first electrode extension 153, thereby more effectively preventing electrical conduction between the mesa 120*m* and the first electrode extension 153. Further, a portion of the insulation layer 170 disposed under the first electrode extension 153 may be disposed in a region defined by the side surface of the mesa 120*m*. Accordingly, as shown in FIG. 30, a portion of the upper surface of the mesa 120*m* may be exposed around the portion of the insulation layer 170 under the first electrode extension 153, and for example, the concavo-convex pattern 127 on the side surface of the mesa 120*m* is exposed instead of being covered by the insulation layer 170. However, it should be understood that other implementations are also possible.

In addition, the insulation layer 170 may at least partially cover the groove 120*g*. As discussed above, the groove 120 is formed along one side of the side surface of the groove 120*g*. In particular, the side surface of the active layer 123 exposed on the side surface of the groove 120*g* can be covered by the insulation layer 170. Since the extension contact portions 153*a* of the first electrode extension 153 contact the first conductive type semiconductor layer 121 exposed through the grooves 120*g*, the peripheral regions of the extension contact portions 153*a* are likely to generate static electricity. Discharge of the static electricity can damage the light emitting structure 120 around the extension contact portions 153*a*, and particularly, when the active layer 123 is damaged by electrostatic discharge, the light emitting area is reduced by the damaged portion. Accordingly, with the structure wherein the insulation layer 170 is formed to cover the side surface of the active layer 123 exposed on the side surface of the groove 120*g*, the light emitting element can prevent decrease in the light emitting area due to damage to the active layer 123 by electrostatic discharge.

Further, the insulation layer 170 may be formed to further cover the periphery of the upper portion of the groove 120*g*. As shown in FIG. 30, the insulation layer 170 may further cover the upper surface of the mesa 120*m* around the grooves 120*g*. With this structure, the light emitting element can prevent static electricity from being conducted to the second conductive type semiconductor layer 125 through the upper surface of the mesa 120*m* around the grooves 120*g*, thereby further improving resistance of the light emitting element to electrostatic discharge.

The first electrode pad 151 is disposed on the insulation layer 170 and is electrically insulated from the upper surface of the mesa 120*m* including the second conductive type semiconductor layer 125. The first electrode pad 151 may include a pad contact portion 151*a*, which can form ohmic contact with the first conductive semiconductor layer 121. A portion of the first electrode pad 151 may contact the first conductive type semiconductor layer 121 through the pad contact portion 151*a*. The pad contact portion 151*a* is disposed on the side surface of the mesa 120*m* and is insulated therefrom by the insulation layer 170. As the first electrode pad 151 includes the pad contact portion 151*a*, electron injection can be performed through the pad contact portion 151*a*. Therefore, the light emitting element can have further improved current spreading efficiency. The pad contact portion 151*a* and the extension contact portions 153*a* may be disposed along the same side surface of the light emitting element, for example, adjacent to the second side 102. However, it should be understood that other implementations are also possible and the pad contact portion 151*a* and the extension contact portions 153*a* may be formed adjacent to at least two different side surfaces in consideration of current spreading.

On the other hand, the insulation layer 170 may further include at least one enlarged portion 171, which protrudes from the side surface of the insulation layer 170 and may cover the side surface of the mesa 120*m* around the first electrode pad 151. For example, as shown in FIG. 31, the insulation layer 170 may include two enlarged portions 171, which may extend from the periphery of the first electrode pad 151 towards the second side 102 and the third side 103 of the light emitting element. The pad contact portion 151*a* may be interposed between the two enlarged portions 171. When electrically bonding (for example, ball bonding) is performed on the first electrode pad 151 in order to supply electric power to the light emitting element according to this exemplary embodiment, a conductive material can escape from the first electrode pad 151 and can be disposed on the side surface of the mesa 120*m*. In this case, electrical short can occur due to the conductive material. According to this exemplary embodiment, since the side surface of the mesa 120*m* around the first electrode pad 151 is covered by the enlarged portion 171, the conductive material can be insulated from the side surface of the mesa 120*m* through the enlarged portion 171 even in the case where the conductive material escapes from the first electrode pad 151. Accordingly, it is possible to prevent failure of the light emitting element and deterioration in production yield.

The insulation layer 170 may be spaced apart from the transparent electrode 140. The insulation layer 170 may be formed during the formation process or may have a possibility of conducting a minute current due to defects contained therein. When the insulation layer 170 contacts the transparent electrode 140 having relatively low electrical resistance, leakage current can flow between the transparent electrode 140 and the first electrode 150 through the insulation layer 170. Accordingly, the insulation layer 170 and the transparent electrode 140 are spaced apart from each other to prevent leakage current through the insulation layer 170, thereby improving electrical characteristics of the light emitting element.

The first electrode 150 may serve to supply external power to the first conductive semiconductor layer 121. The first electrode 150 may be formed of a metal such as Ti, Pt, Au, Cr, Ni, Al, and the like. In addition, the first electrode 150 may be composed of a single layer or multiple layers.

Figure 40:
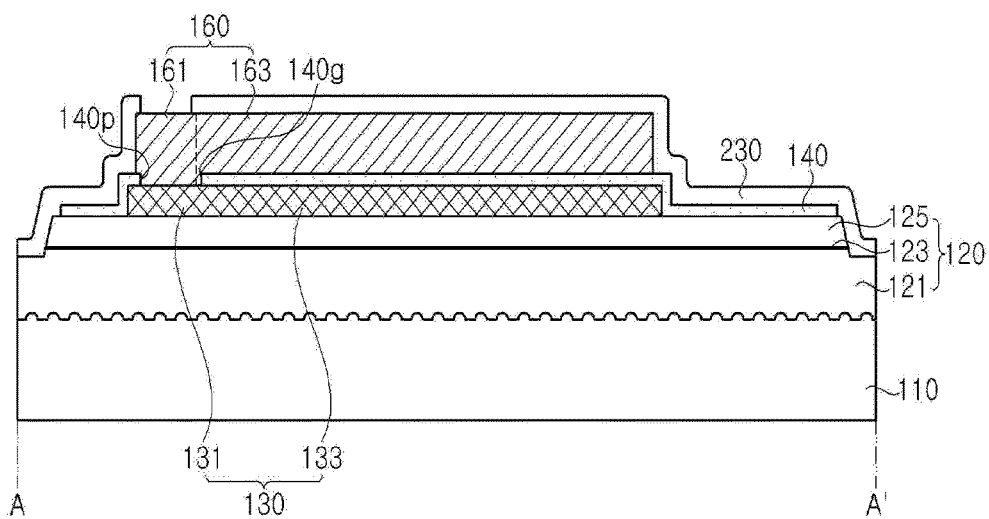
FIG. 40 is a cross-sectional view of a light emitting element according to other exemplary embodiments of the present disclosure.

The light emitting element according to some exemplary embodiments may further include a passivation layer 230 that at least partially covers the surface of the light emitting element. As shown in FIG. 40, the passivation layer 230 may at least partially cover the light emitting structure 120 and the transparent electrode 140, and may further cover the first electrode extension 153 and the second electrode extension 163. The passivation layer 230 may include openings that at least partially expose the first electrode pad 151 and the second electrode pad 161, and may form electrical connection to the first and second electrode pads 151, 161 through the openings.

The passivation layer 230 can protect the light emitting element from external moisture or toxic gas. The passivation layer 230 may be formed of an insulation material and may be composed of a single layer or multiple layers. For example, the passivation layer 230 may include $SiO_2$, $MgF_2$, SiN, or the like, or may include a distributed Bragg reflector in which different material layers such as $TiO_2$ and $SiO_2$ are repeatedly stacked one above another. Further, when the passivation layer 230 is composed of multiple layers, the uppermost layer may be formed of SiN, and in this case, the SiN layer has high moisture resistance so that the light emitting element can be effectively protected from external moisture.

Figure 41:
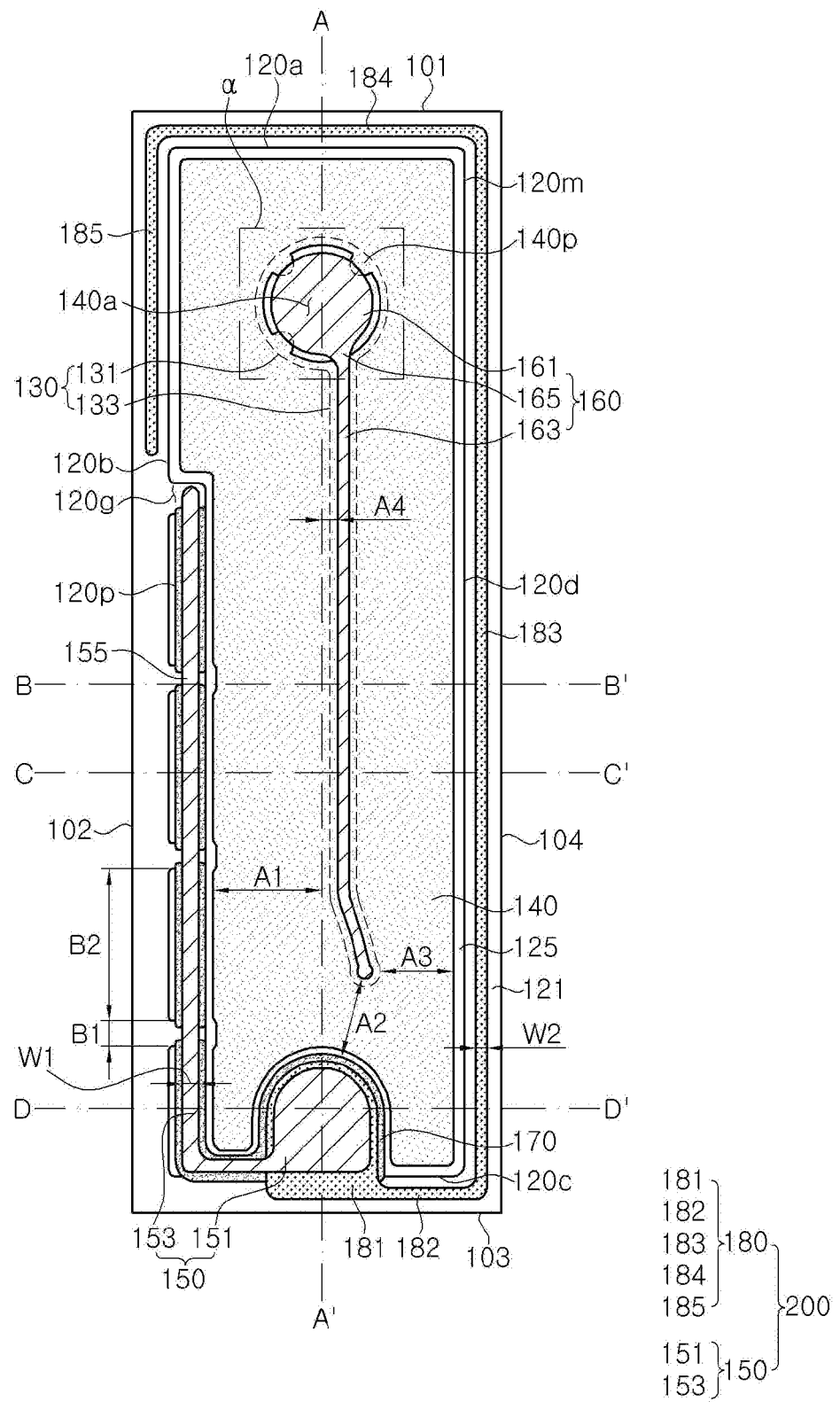
FIG. 41 is a plan view of a light emitting element according to other exemplary embodiments of the present disclosure.
Figure 42:
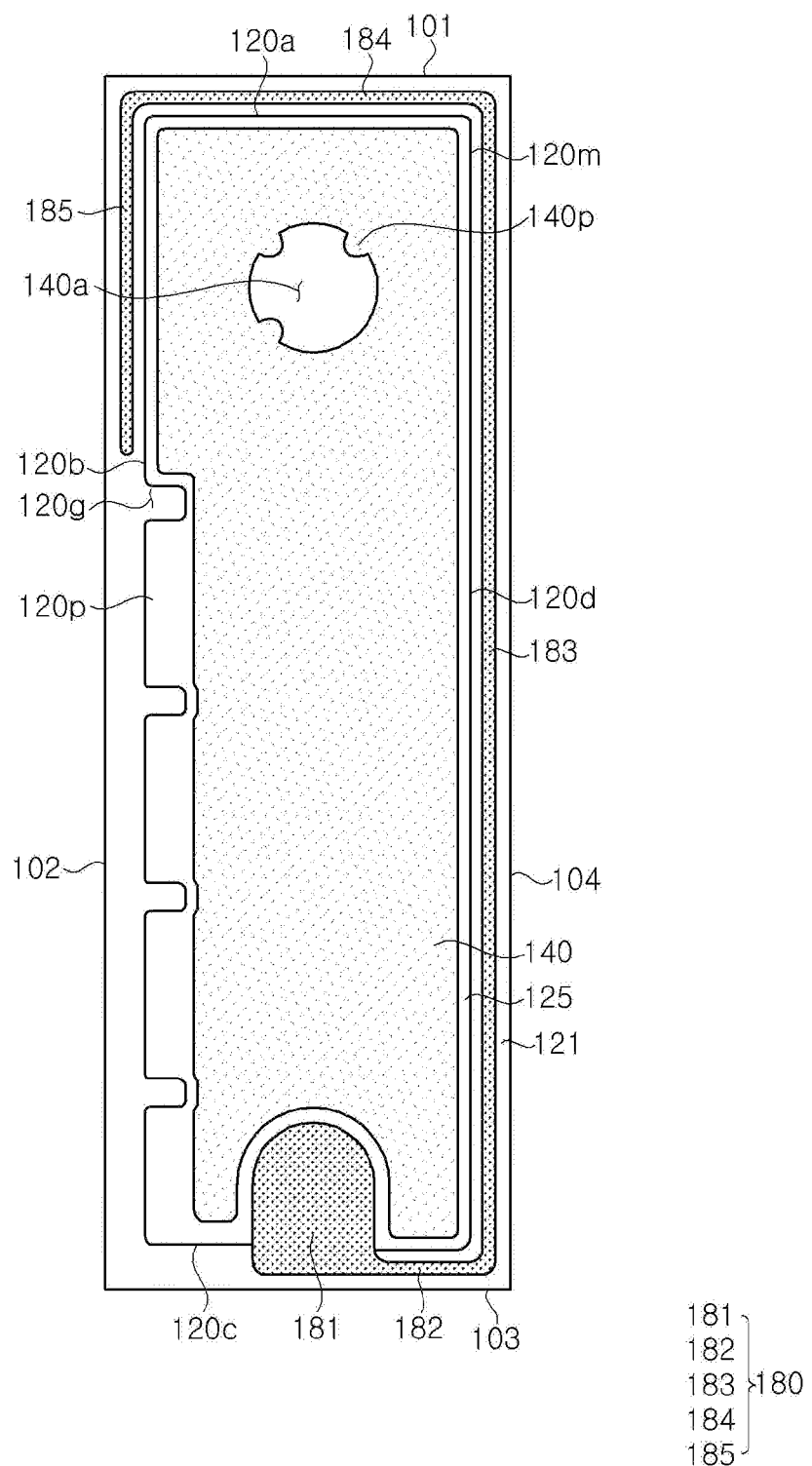
FIG. 42 is a plan view of a light-transmitting conductive layer of a light emitting element according to other exemplary embodiments of the present disclosure.
Figure 43:
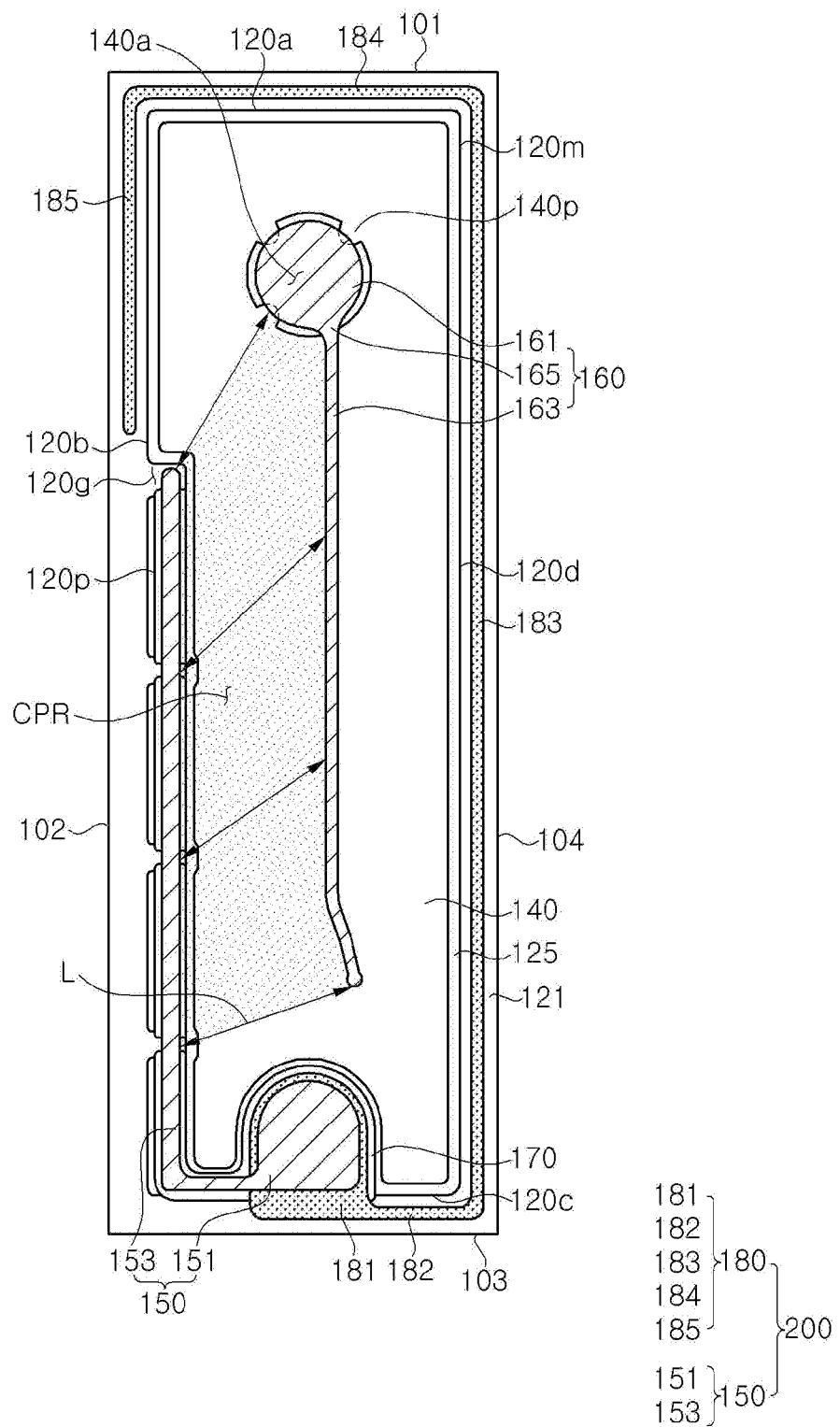
FIG. 43 is a plan view of a light-transmitting conductive layer of a light emitting element according to other exemplary embodiments of the present disclosure.
Figure 44:
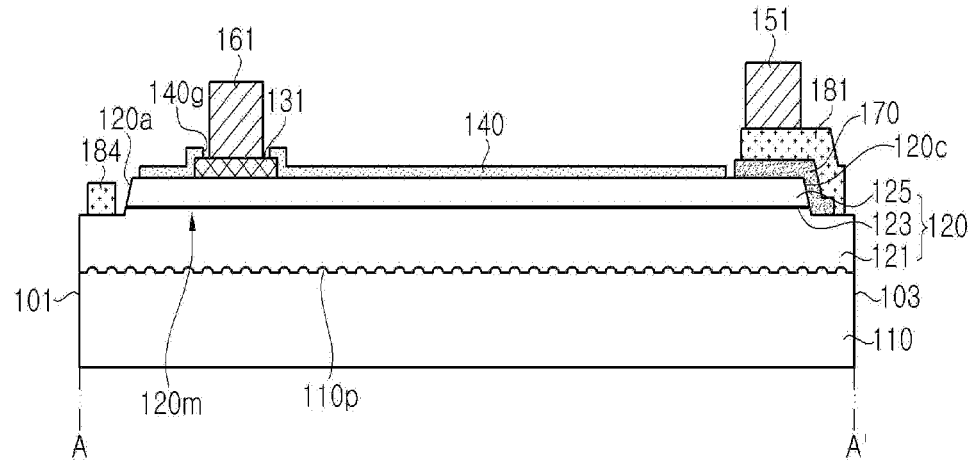
FIGS. 44 to 47 are sectional views of a light emitting element according to other exemplary embodiments of the present disclosure.
Figure 45:
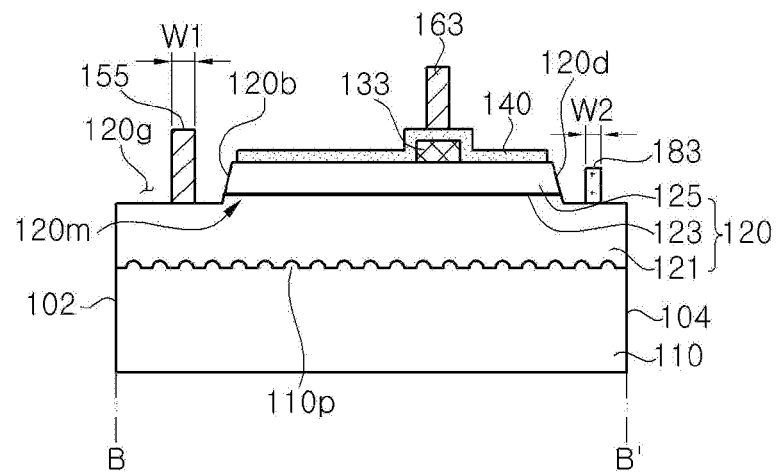
Figure 46:
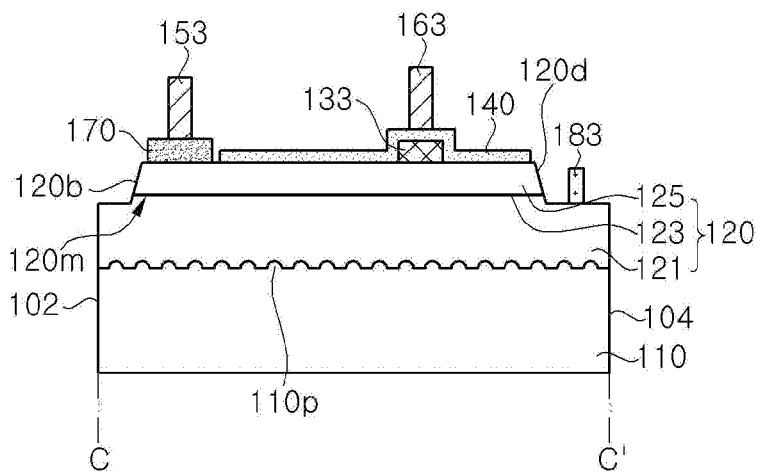
Figure 47:
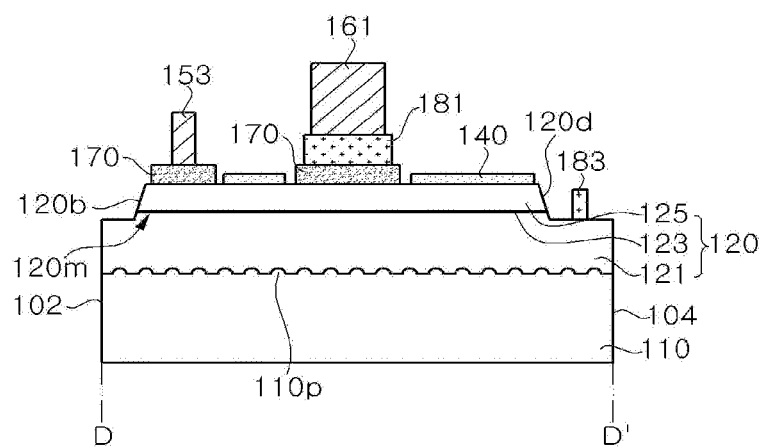
Figure 48A:
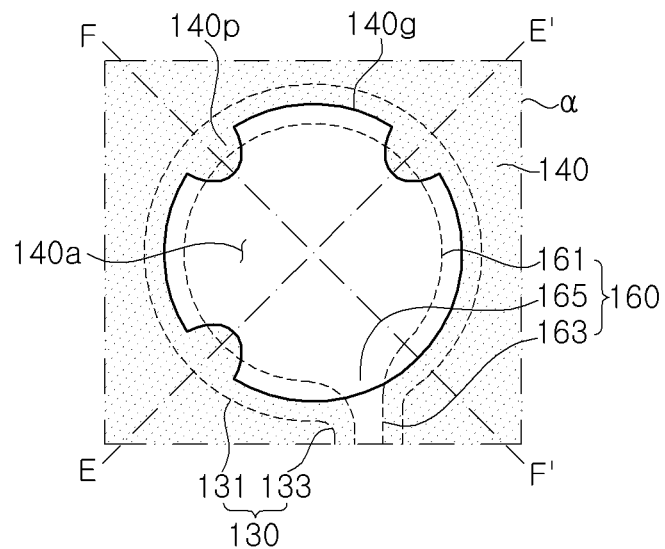
FIGS. 48A and 48B are enlarged plan views of a light emitting element according to other exemplary embodiments of the present disclosure.
Figure 48B:
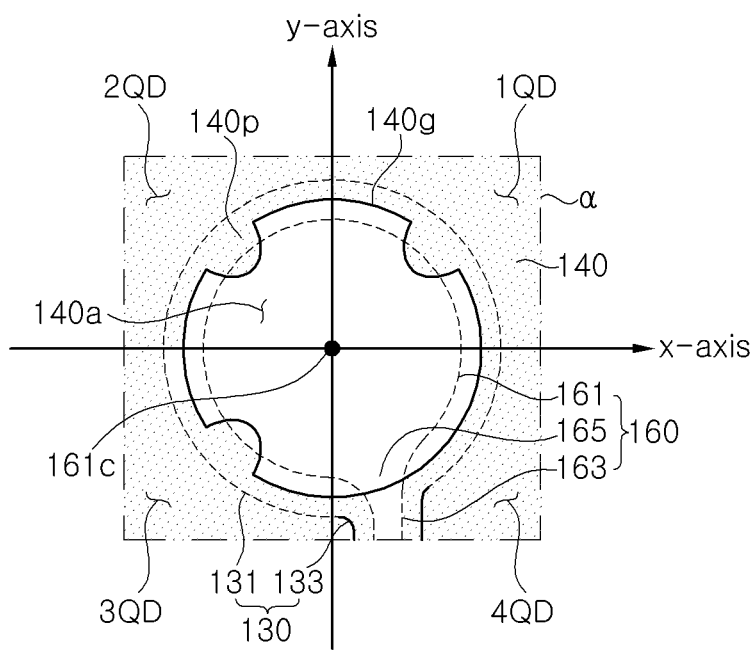
Figure 49A:
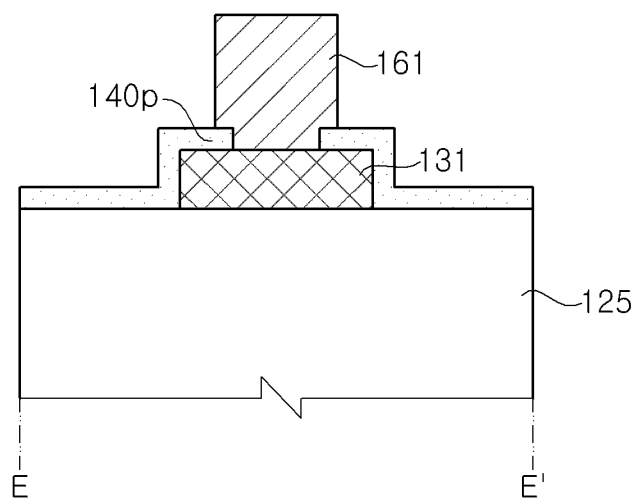
FIGS. 49A and 49B are enlarged cross-sectional views of a light emitting element according to other exemplary embodiments of the present disclosure.
Figure 49B:
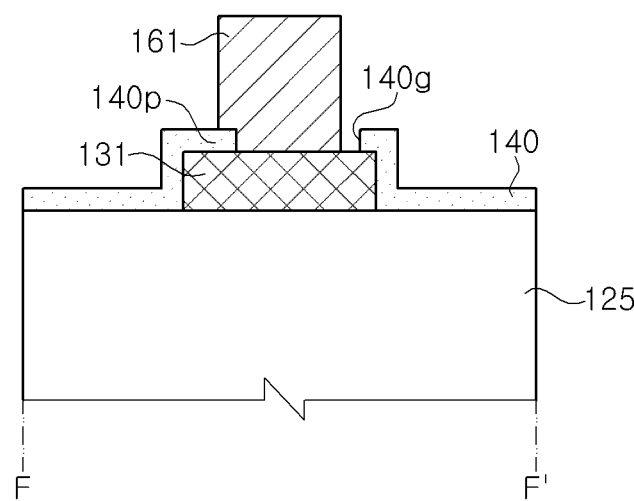

FIGS. 41 to 49B are plan views, cross-sectional views, enlarged plan views, and enlarged cross-sectional views of a light emitting element according to exemplary embodiments of the present disclosure. FIG. 41 is a plan view of the light emitting element; FIG. 42 is also a plan view of the light emitting element, with some components omitted in order to describe arrangement of a light transmitting conductive layer 180; and FIG. 43 is a plan view of the light emitting element, illustrating a predetermined current path region (CPR). FIGS. 44 to 47 are cross-sectional views taken along lines A-A', B-B', C-C', and D-D'. In addition, FIG. 48 is an enlarged plan view of Region α in FIG. 41 and FIGS. 49A and 49B are enlarged cross-sectional view taken along line E-E' and line F-F' of FIGS. 48A and 48B.

Referring to FIGS. 41 to 49B, the light emitting element includes a light emitting structure 120, a first electrode 200, and a second electrode 160. In addition, the light emitting element may further include a substrate 110, a current blocking layer 130, and a second conductive oxide electrode 140. Further, the light emitting element may include first to fourth sides 101, 102, 103, 104. The light emitting element may have a rectangular shape in plan view, as shown in the drawings, without being limited thereto.

The substrate 110 may be an insulating or conductive substrate. In addition, the substrate 110 may be a growth substrate for growing the light emitting structure 120, and may include a sapphire substrate, a silicon carbide substrate, a silicon substrate, a gallium nitride substrate, an aluminum nitride substrate, or the like. For example, the substrate 110 may be a sapphire substrate, particularly a patterned sapphire substrate (PSS) having a patterned upper surface. When the substrate 110 is a patterned sapphire substrate, the substrate 110 may include a plurality of protrusions 110p formed on the upper surface thereof. However, it should be understood that other implementations are also possible and the substrate 110 may be a secondary substrate for supporting the light emitting structure 120.

Although the first conductive type semiconductor layer 121 is described as being disposed on the substrate 110 in this exemplary embodiment, when the substrate 110 is a growth substrate capable of growing the semiconductor layers 121, 123, 125 thereon, the substrate 110 may be separated and removed by physical and/or chemical methods after growth of the semiconductor layers 121, 123, 125 thereon.

The light emitting structure 120 may include a first conductive type semiconductor layer 121, a second conductive type semiconductor layer 125 disposed on the first conductive type semiconductor layer 121, and an active layer 123 interposed between the first conductive type semiconductor layer 121 and the second conductive type semiconductor layer 125. In addition, the light emitting structure 120 may include a mesa 120m disposed on the first conductive type semiconductor layer 121 and including the active layer 123 and the second conductive type semiconductor layer 125.

The first conductive type semiconductor layer 121, the active layer 123 and the second conductive type semiconductor layer 125 may be grown in a chamber using a well-known method such as MOCVD. In addition, the first conductive type semiconductor layer 121, the active layer 123 and the second conductive type semiconductor layer 125 may include Group III-V based nitride semiconductors, for example, nitride semiconductors such as (Al, Ga, In)N. The first conductive type semiconductor layer 121 may include n-type dopants (for example, Si, Ge, Sn) and the second conductive type semiconductor layer 125 may include p-type dopants (for example, Mg, Sr, Ba), or vice versa. The active layer 123 may include a multiple quantum well (MQW) structure and the composition ratio of the nitride based semiconductors may be adjusted to emit light having a desired wavelength. In particular, in this exemplary embodiment, the second conductive type semiconductor layer 125 may be a p-type semiconductor layer.

The mesa 120m is disposed in some region of the first conductive type semiconductor layer 121 such that the surface of the first conductive type semiconductor layer 121 can be exposed in a region in which the mesa 120m is not formed. The mesa 120m may be formed by partially etching the second conductive type semiconductor layer 125 and the active layer 123. The mesa 120m may be formed, for example, along a side surface of the first conductive type semiconductor layer 121, as shown in the drawings, without being limited thereto. The mesa 120m may have an inclined side surface, or may have a side surface perpendicular to an upper surface of the first conductive type semiconductor layer 121.

Further, the mesa 120m may include at least one side surface having at least one groove 120g depressed therefrom. A portion of the first conductive type semiconductor layer 121 may be exposed through the groove 120g. Further, when the groove 120g is formed in plural, the mesa 120m may include at least one protrusion 120p disposed between the grooves 120g.

For example, as shown in the drawings, the mesa 120m may include first to fourth sides 120a, 120b, 120c, 120d. The first to fourth sides 120a, 120b, 120c, 120d of the mesa 120m may be disposed adjacent to the first to fourth sides 101, 102, 103, 104 of the light emitting element, respectively. For example, the first side surface 120a of the mesa 120m may be located adjacent to the first side 101 of the light emitting element and may be generally formed along the first side 101 of the light emitting element. Here, at least one of the side surfaces of the mesa 120m may include at least one groove 120g. In this exemplary embodiment, the second side surface 120b of the mesa 120m may include a plurality of grooves 120g. The first conductive type semiconductor layer 121 is exposed through the plurality of grooves 120g and the first conductive type semiconductor layer 121 exposed through the grooves 120g may electrically contact a metal extension contact portion 155 described below. Further, a plurality of protrusions 120p is formed between the grooves 120g. The grooves 120g may be arranged at substantially constant intervals, but is not limited thereto. In various exemplary embodiments, the grooves 120g may be formed on two or more side surfaces of the mesa 120m. For example, the grooves 120g may be formed on the second and third side surfaces 120b, 120c of the mesa 120m.

In addition, the mesa 120m may further include a concavo-convex pattern (not shown) formed on the side surface thereof. The concavo-convex pattern serves to scatter light therethrough, thereby improving light extraction efficiency of the light emitting element.

The current blocking layer 130 is at least partially disposed on the second conductive type semiconductor layer 125. The current blocking layer 130 may be disposed on the second conductive type semiconductor layer 125 corresponding to a region in which the second electrode 160 is disposed. The current blocking layer 130 may include a pad current blocking layer 131 and an extension current blocking layer 133. The pad current blocking layer 131 and the extension current blocking layer 133 may be disposed corresponding to the second electrode pad 161 and the second electrode extension 163, respectively. Therefore, as shown in the drawings, the pad current blocking layer 131 is disposed adjacent to the first side 101 of the light emitting element and the extension current blocking layer 133 extends from the first side 101 towards the third side 103.

The current blocking layer 130 can prevent electric current supplied to the second electrode 160 from being directly transmitted to the semiconductor layer, thereby preventing current crowding. Thus, the current blocking layer 130 may have insulating properties, may include an insulation material, and may be composed of a single layer or multiple layers. For example, the current blocking layer 130 may include $SiO_x$ or $SiN_x$, or may include a distributed Bragg reflector in which insulation material layers having different indices of refraction are stacked one above another. That is, the current blocking layer 130 may have light transmittance, light reflectivity, or selective light reflectivity.

In addition, the current blocking layer 130 may have a larger area than the second electrode 160 formed on the current blocking layer 130. Thus, the second electrode 160 may be disposed within a region in which the current blocking layer 130 is formed.

The second conductive oxide electrode 140 may be disposed on the second conductive type semiconductor layer 125 and may cover a portion of an upper surface of the second conductive type semiconductor layer 125 and a portion of the current blocking layer 130. The second conductive oxide electrode 140 may include an opening 140a that partially exposes the pad current blocking layer 131. The second conductive oxide electrode 140 includes a protrusion 140p projecting from a side surface 140g of the opening 140a. The side surface 140g of the opening 140a may be disposed on the pad current blocking layer 131 and may be generally formed along a side surface of the pad current blocking layer 131. On the other hand, the protrusion 140p may protrude from the side surface 140g of the opening 140a. The protrusion 140p may protrude toward a central portion of the pad current blocking layer 131. The protrusion 140p may be formed in plural.

The second conductive oxide electrode 140 may include a material having light transmittance and electrical conductivity, and may include at least one of a conductive oxide, such as ITO, RuOx, RuOx/ITO, MgO and ZnO, and a light-transmitting metal layer, such as Ni/Au. In addition, the second conductive oxide electrode 140 may form ohmic contact with the second conductive semiconductor layer 125. Since the second electrode 160 does not directly contact the second conductive type semiconductor layer 125, electric current can be more effectively spread through the second conductive oxide electrode 140. When the second conductive oxide electrode 140 includes ZnO, the second conductive oxide electrode 140 may include various dopants. The dopant may include at least one of Ag, In, Sn, Cd, Ga, Al, Mg, Ti, Mo, Ni, Cu, Au, Pt, Rh, Ir, Ru, and Pd.

In this exemplary embodiment, the second conductive oxide electrode 140 may include at least one of GZO, ZnO, and ITO including Ga dopants. In addition, the second conductive oxide electrode 140 may include substantially the same material as the first conductive oxide electrode 180 described below, or may be formed of substantially the same material. In another exemplary embodiment, the second conductive oxide electrode 140 and the first conductive oxide electrode 180 may be formed of different materials. For example, the second conductive oxide electrode 140 may be formed of ITO and the first conductive oxide electrode 180 may be formed of ZnO including Ga dopants.

The second electrode 160 is disposed on the second conductive type semiconductor layer 125 and at least part of the second electrode 160 is disposed on a region in which the current blocking layer 130 is disposed. The second electrode 160 includes a second electrode pad 161 and a second electrode extension 163, which may be disposed on the pad current blocking layer 131 and the extension current blocking layer 133, respectively. Thus, a portion of the second conductive oxide electrode 140 may be interposed between the second electrode 160 and the current blocking layer 130.

In particular, the second electrode pad 161 may be disposed on the opening 140a of the transparent electrode 140. The second electrode pad 161 may be spaced apart from the side surface 140g of the opening 140a and at least part of the protrusion 140p of the transparent electrode 140 may be interposed between the second electrode pad 161 and the pad current blocking layer 131. Thus, the second electrode pad 161 and the protrusion 140p of the transparent electrode 140 contact each other to be electrically connected to each other. The second electrode pad 161 may have, for example, a substantially circular shape, as shown in the drawings, but is not limited thereto. Accordingly, the pad current blocking layer 131 of the current blocking layer 130 may be formed in a circular shape similar to the shape of the second electrode pad 161, and the opening 140a of the transparent electrode 140 may be formed in a substantially similar circular shape. However, it should be understood that other implementations are also possible. Although not particularly limited, the location of the second electrode pad 161 may be determined so as to allow light to be emitted through the entire surface of the active layer 123 of the light emitting element by efficiently spreading electric current. For example, as shown in the drawings, the second electrode pad 153 may be disposed adjacent to the first side 101 opposite to the third side 103, adjacent to which the first electrode pad 151 is disposed.

The second electrode extension 163 extends from the second electrode pad 161. In this exemplary embodiment, the second electrode extension 163 may extend from the second electrode pad 161 toward the third side 103. In addition, the extension direction of the second electrode extension 163 may be changed. For example, a distal end of the second electrode extension 163 may be bent toward a portion between the third side 103 and the fourth side 104 of the light emitting element. This structure can be designed in various ways in consideration of the distance between the first electrode pad 151 and the second electrode extension 163. The transparent electrode 140 is interposed between at least part of the second electrode extension 163 and the extension current blocking layer 133 such that the second electrode extension 163 is electrically connected to the transparent electrode 140.

In addition, the distal end of the second electrode extension 163 may include a portion having a greater width than an average width of the second electrode extension 163. For example, the distal end of the second electrode extension 163 may be formed in a circular shape having a larger diameter than the width of the second electrode extension 163. The diameter of the distal end may be about 0.5 to 5 μm larger than the width of the second electrode extension 163. However, it should be understood that other implementations are also possible and the shape of the distal end of the second electrode extension 163 may be modified into various shapes, such as a polygonal shape, an elliptical shape, an arc shape, and the like.

The arrangement of the second electrode 160 is not limited thereto and may be modified and changed in various ways according to the shape of the light emitting element.

The second electrode 160 may include a conductive material, for example, a metallic material such as Ti, Pt, Au, Cr, Ni, Al, and Mg, and may be composed of a single layer or multiple layers. In the structure wherein the second electrode 160 is composed of multiple layers, the second electrode 160 may include at least one of metal stack structures of Ti/Au layers, Ti/Pt/Au layers, Cr/Au layers, Cr/Pt/Au layers, Ni/Au layers, Ni/Pt/Au layers, and Cr/Al/Cr/Ni/Au layers.

As described above, the second conductive oxide electrode 140 is interposed between a portion of the second electrode 160 and the current blocking layer 130 such that electric current can flow through a contact region between the second electrode 160 and the second conductive oxide electrode 140. Accordingly, the contact region between the second electrode 160 and the second conductive oxide electrode 140 may be adjusted so as to allow electric current to be effectively spread, and, with regard to this, the second electrode 160 according to this exemplary embodiment, particularly, the structure around the second electrode pad 161, will be described in more detail with reference to FIGS. 48A to 49B. FIGS. 48A and 48B show enlarged views of Region α of FIG. 41 and FIGS. 49A and 49B are cross-sectional views taken along line E-E' and line F-F' of FIG. 48A.

In the enlarged views of FIGS. 48A and 48B, the second conductive oxide electrode 140 is indicated by a solid line and the current blocking layer 130 and the second electrode 160 are indicated by broken lines for convenience of description. According to this exemplary embodiment, the opening 140a of the second conductive oxide electrode 140 includes a side surface 140g, which is disposed on the pad current blocking layer 131 and is spaced apart from the second electrode pad 161. The opening 140a of the second conductive oxide electrode 140 is formed along the side surface of the pad current blocking layer 131 and has a shape substantially corresponding to the side surface shape of the pad current blocking layer 131. In particular, since the side surface of the opening 140a is disposed on the pad current blocking layer 131, an upper surface of the second conductive type semiconductor layer 125 can be covered by the second conductive oxide electrode 140 instead of being exposed. Accordingly, the light emitting element can prevent static electricity generated around the second electrode pad 161 from being directly conducted to the second conductive type semiconductor layer 125, thereby more effectively preventing failure caused by electrostatic discharge.

The second conductive oxide electrode 140 includes at least one protrusion 140p, which protrudes from the side surface of the opening 140a. The protrusion 140p partially covers the side surface and an upper surface of the pad current blocking layer 131, as shown in FIGS. 48A and 48B and FIGS. 49A and 49B, and is interposed between the pad current blocking layer 131 and the second electrode pad 161. Accordingly, the second electrode pad 161 and the protrusion 140p are electrically connected to each other such that electric current can flow through the second electrode pad 161 and the protrusion 140p. Thus, current injection into a region in which the protrusion 140p is disposed can be efficiently performed. Since the second electrode extension 163 of the second electrode 160 contacts the second conductive oxide electrode 140, current injection into the second conductive type semiconductor layer 125 is performed through the second electrode extension 163. Accordingly, the number and locations of the protrusions 140p can be adjusted according to the location of the second electrode extension 163.

Specifically, this structure will be described with reference to FIG. 48B. First, assuming an imaginary plane (imaginary coordinate system) having an x-axis and a y-axis with a central portion 161c of the second electrode pad 161 defined as the origin. The imaginary plane includes a first quadrant 1QD, a second quadrant 2QD, a third quadrant 3QD, and a fourth quadrant 4QD. With reference to the imaginary coordinate system, a portion of the second electrode extension 163 extending from the second electrode pad 161, that is, an interface 165 between the second electrode pad 161 and the second electrode extension 163, is located on at least one of the x (+) axis, the x (−) axis, the y (+) axis, the y (−) axis, and the first to fourth quadrants 1QD, 2QD, 3QD, 4QD. At least one protrusion 140p may be located on at least one of the remaining x (+), x (−), y (+) and y (−) axes and the first to fourth quadrants 1QD, 2QD, 3QD, 4QD except for the region in which the interface 165 is located. For example, in this exemplary embodiment, the interface 165 between the second electrode pad 161 and the second electrode extension 163 is located in the fourth quadrant 4QD or on the y (−) axis and three protrusions 140p are located on the x (+), x (−) and y (+) axes, respectively. Thus, electric current can be injected into a region corresponding to a region around the fourth quadrant 4QD or the y (−) axis through the second electrode extension 163 and can be injected into regions corresponding to regions around the x (+), x (−) and y (+) axes through the protrusions 140p.

Figure 65A:
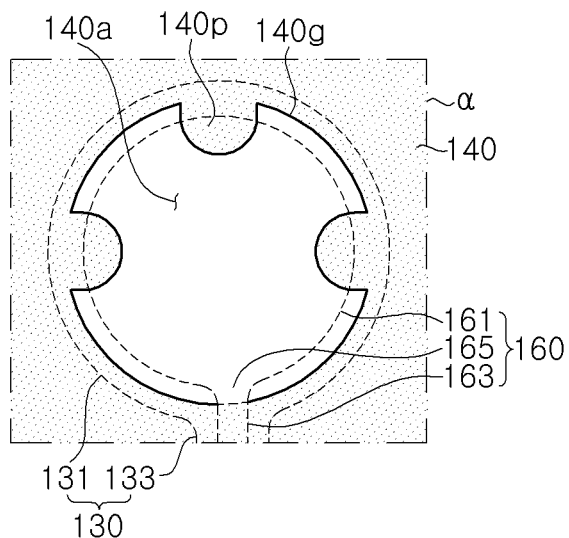
FIGS. 65A and 65B are enlarged plan views of a light emitting element according to other exemplary embodiments of the present disclosure.
Figure 65B:
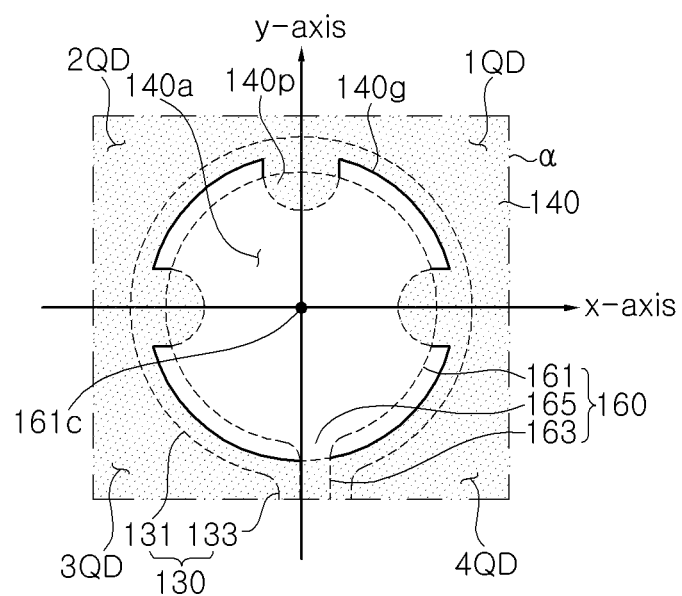

In various other exemplary embodiments, the locations of the protrusions 140p and the location of the interface 165 between the second electrode pad 161 and the second electrode extension 163 may be changed in various ways. FIGS. 65A and 65B are enlarged plan views of a light emitting element according to exemplary embodiments of the present disclosure. Referring to FIGS. 65A and 65B, assuming an imaginary plane (imaginary coordinate system) having an x-axis and a y-axis with a central portion 161c of the second electrode pad 161 defined as the origin. The imaginary plane includes a first quadrant 1QD, a second quadrant 2QD, a third quadrant 3QD, and a fourth quadrant 4QD. With reference to the imaginary coordinate system, a portion of the second electrode extension 163 extending from the second electrode pad 161, that is, an interface 165 between the second electrode pad 161 and the second electrode extension 163, is located on at least one of the x (+) axis, the x (−) axis, the y (+) axis, the y (−) axis, and the first to fourth quadrants 1QD, 2QD, 3QD, 4QD. At least one protrusion 140p may be located on at least one of the remaining x (+), x (−), y (+) and y (−) axes and the first to fourth quadrants 1QD, 2QD, 3QD, 4QD except for the region in which the interface 165 is located. For example, in this exemplary embodiment, the interface 165 between the second electrode pad 161 and the second electrode extension 163 is located in the fourth quadrant 4QD or on the y (−) axis and three protrusions 140p are located on the x (+), x (−) and y (+) axes, respectively. Thus, electric current can be injected into a region corresponding to a region around the fourth quadrant 4QD or the y (−) axis through the second electrode extension 163 and can be injected into regions corresponding to regions around the x (+), x (−) and y (+) axes through the protrusions 140p.

On the other hand, a contact area between a lower surface of the second electrode pad 161 and the second conductive oxide electrode 140 may be 1% to 20% of the entire area of the lower surface of the second electrode pad 161, specifically 1.5% to 13%, more specifically 3% to 5%. Within this range of the contact area between the lower surface of the second electrode pad 161 and the second conductive oxide electrode 140, a contact area between the second electrode pad 161 and the pad current blocking layer 131 can be set to be relatively large. Therefore, peeling of the second electrode pad 161 can be effectively prevented at a contact portion between the second electrode pad 161 and the transparent electrode 140. In addition, the protrusions 140p may have various shapes and may have, for example, a circular arc shape or an elliptical arc shape, as shown in the drawings.

As in this exemplary embodiment, the second conductive oxide electrode 140 is disposed only in some region of the interface between the second electrode pad 161 and the pad current blocking layer 131, whereby the second electrode pad 161 can be effectively prevented from being peeled off. In addition, since the second electrode pad 161 contacts the protrusions 140p of the second conductive oxide electrode 140, the light emitting element can relieve current crowding that can occur due to separation of the second electrode pad 161 from the second conductive oxide electrode 140 while allowing electric current to be efficiently spread to regions in which the second electrode extension 163 is not disposed. The light emitting element allows efficient current spreading in the horizontal direction, thereby providing high power while lowering forward voltage Vf. Furthermore, since the second electrode pad 161 and the second conductive type semiconductor layer 125 are not directly connected to each other through the second conductive oxide electrode 140, the light emitting element can prevent failure or breakage due to static electricity, thereby securing high resistance to electrostatic discharge.

The first electrode 200 is electrically connected to the first conductive type semiconductor layer 121. The first electrode 200 forms ohmic contact with a portion of the upper surface of the first conductive type semiconductor layer 121, which is exposed by partially removing the second conductive type semiconductor layer 125 and the active layer 123, and thus can be electrically connected to the first conductive type semiconductor layer 121. The first electrode 200 is disposed on the light emitting structure 120. For example, at least part of the first electrode 200 may be disposed on the first conductive type semiconductor layer 121, or may be disposed on the mesa 120m.

The first electrode 200 may include first electrode pads 151, 181 and first electrode extensions 153, 182, 183, 184, 185. In addition, the first electrode 200 includes a metal electrode 150 and a first conductive oxide electrode 180. The metal electrode 150 may include a metal electrode pad 151 and a metal electrode extension 153, and the first conductive oxide electrode 180 may include first conductive oxide electrode extensions 182, 183, 184, 185, and may further include a first conductive oxide electrode pad 181. In addition, the first electrode pads 151, 181 may include a metal electrode pad 151 and may further include a first conductive oxide electrode pad 181. The first electrode extensions 153,182,183,184, 185 include at least one metal electrode extension 153 and at least one first conductive oxide electrode extension 182,183,184 or 185.

The at least one metal electrode extension 153 and the at least one first conductive oxide electrode extension 182, 183, 184 or 185 extend from the first electrode pads 151, 181, respectively. The metal electrode extension 153 may extend from one side of the first electrode pads 151, 181 and the first conductive oxide electrode extensions 182, 183, 184, 185 may extend from the other side of the first electrode pads 151, 181 opposite the one side thereof. For example, the first conductive oxide electrode extensions 182, 183, 184, 185 and the metal electrode extension 153 may extend in opposite directions. In addition, the first conductive oxide electrode extensions 182, 183, 184, 185 are disposed in the exposed region of the first conductive type semiconductor layer 121 of the light emitting structure 120 and electrically contact the first conductive type semiconductor layer 121. In particular, the first conductive oxide electrode extensions 182, 183, 184, 185 may be disposed in at least some region around the mesa 120m and may be disposed along at least part of the side surfaces of the mesa 120m. Thus, the first conductive oxide electrode extensions 182, 183, 184, 185 may at least partially surround the mesa 120m, and in various exemplary embodiments, the first conductive oxide electrode extensions 182, 183, 184, 185 may form a closed curve surrounding the mesa 120m. The first conductive oxide electrode extensions 182, 183, 184, 185 are disposed around the mesa 120m, thereby improving current spreading efficiency of the light emitting element.

Further, in some exemplary embodiments, the first conductive oxide electrode extensions 182, 183, 184, 185 may extend from the first conductive oxide electrode pad 181. The first conductive oxide electrode pad 181 may be electrically connected to the metal electrode pad 151. The metal electrode pad 151 may be disposed on the first conductive oxide electrode pad 181. Further, the area of the metal electrode pad 151 may be smaller than the area of the first conductive oxide electrode pad 181.

Hereinafter, the structure of the first electrode 200 in the light emitting element according to this exemplary embodiment will be described in more detail with reference to FIGS. 41 to 47. However, it should be understood that the structure of the first electrode 200 according to this exemplary embodiment is provided by way of example and the first electrode 200 is not limited to the structure of the light emitting element shown in the drawings.

First, the metal first electrode 200 including the metal electrode extension 153 and the metal electrode pad 151 will be described. In this exemplary embodiment, the metal first electrode 200 is disposed on the mesa 120m and an insulation layer 170 may be interposed between the metal first electrode 200 and the mesa 120m. The insulation layer 170 may include an insulation material, for example, $SiO_2$, SiNx, or a distributed Bragg reflector in which layers having different indices of refraction are repeatedly stacked, and the like. At this time, the insulation layer 170 may cover a portion of the side surface of the mesa 120m. The insulation layer 170 may include at least one opening that at least partially exposes the upper surface of the first conductive type semiconductor layer 121 exposed through the grooves 120g of the mesa 120m.

In addition, a portion of the metal electrode extension 153 may contact the first conductive type semiconductor layer 121. The metal electrode extension 153 includes an extension contact portion 155 and may form ohmic contact with the first conductive semiconductor layer 121 through the extension contact portion 155. The metal electrode pad 151 is disposed on the insulation layer 170 and may not contact the first conductive type semiconductor layer 121. However, it should be understood that other implementations are also possible and, in various exemplary embodiments, a portion of the metal electrode pad 151 may be formed to form ohmic contact with the first conductive semiconductor layer 121.

The metal electrode extension 153 is disposed on the insulation layer 170 such that a portion of the metal electrode extension 153 overlaps at least one groove 120g in the vertical direction. The metal electrode extension 153 includes an extension contact portion 155, which can form ohmic contact with the first conductive type semiconductor layer 121. The extension contact portion 155 forms electrical connection with the first conductive semiconductor layer 121 exposed through the at least one groove 120g and the remaining portion of the metal electrode extension 153 is formed on the insulation layer 170 so as to be insulated from the first conductive type semiconductor layer 121, whereby electrons are moved to the first conductive type semiconductor layer 121 through the extension contact portion 155 upon operation of the light emitting element. That is, electric current flows through the extension contact portion 155.

When the first electrode 200 is an n-type electrode, electrons are moved from the first electrode 200 towards the second electrode 160. When the entirety of the first electrode extension 153 contacts the first conductive type semiconductor 121, the density of electrons injected into the first conductive type semiconductor layer 121 may vary according to the distance from the first electrode pad 151. That is, the density of electrons injected from a portion of the first electrode extension 153 disposed relatively close to the first electrode pad 151 is higher than the density of electrons injected from a portion of the first electrode extension 153 disposed relatively far from the first electrode pad 151. Thus, when the entirety of the first electrode extension 153 contacts the first conductive type semiconductor layer 121, current spreading performance can be reduced.

Conversely, according to this exemplary embodiment, the metal electrode extension 153 contacts the first conductive semiconductor layer 121 through the extension contact portion 155 of the first electrode extension 153 and the remaining portion of the metal electrode extension 153 is insulated from the first conductive type semiconductor layer 121 by the insulation layer 170. Thus, electrons are injected through the extension contact portion 155, so that a substantially similar electron injection density can be maintained in a plurality of extension contact portions 155. Accordingly, electrons can be smoothly injected even through a portion the metal electrode extension 153 disposed far from the first electrode pad 151, thereby improving current spreading efficiency of the light emitting element.

Since the extension contact portions 155 may correspond to the number and locations of the grooves 120g, the distance between the extension contact portions 155 may be substantially the same and the extension contact portions 155 may be disposed along one side of the light emitting element. For example, the extension contact portions 155 may be disposed adjacent to the second side 102 of the light emitting element. However, it should be understood that other implementations are also possible and the extension contact portions 155 may be formed along at least two sides of the light emitting element.

On the other hand, the insulation layer 170 disposed under the extension contact portions 155 may have a greater width than the line width of the metal electrode extension 153, thereby more effectively preventing electrical conduction between the mesa 120m and the metal electrode extension 153. Further, a portion of the insulation layer 170 disposed under the metal electrode extension 153 may be disposed in a region defined by the side surface of the mesa 120m. Accordingly, as shown in the drawings, a portion of the upper surface of the mesa 120m may be exposed around the portion of the insulation layer 170 under the metal electrode extension 153. When the mesa 120m includes a concavo-convex pattern (not shown) formed on the side surface thereof, the concavo-convex pattern 127 is exposed instead of being covered by the insulation layer 170. However, it should be understood that other implementations are also possible.

In addition, the insulation layer 170 may at least partially cover at least of a portion the groove 120g. As discussed, at least one groove 120g is formed at one side surface of the mesa 120m and the insulation layer 170 may cover the side surface of the mesa 120m at which the at least one groove 120 is formed. Further, the insulation layer 170 may be formed to further cover the periphery of the upper portion of the groove 120g. The insulation layer 170 covering the side surface of the mesa 120m may be extend to cover a portion of the upper surface of the groove 120g and to cover a portion of the upper surface of the mesa 120m. As shown in the drawings, the insulation layer 170 may further cover the upper surface of the mesa 120m around the grooves 120g. With this structure, the light emitting element can prevent static electricity from being conducted to the second conductive type semiconductor layer 125 through the upper surface of the mesa 120m around the grooves 120g, thereby improving resistance of the light emitting element to electrostatic discharge.

Further, the insulation layer 170 may be spaced apart from the second conductive oxide electrode 140. As shown in the drawings, the insulation layer 170 disposed on the mesa 120m may be spaced apart from the second conductive oxide electrode 140. The insulation layer 170 may be formed during the formation process or may have a possibility of conducting a minute current due to defects contained therein. When the insulation layer 170 contacts the second conductive oxide electrode 140 having relatively low electrical resistance, leakage current can flow between the second conductive oxide electrode 140 and the first electrode 200 through the insulation layer 170. Accordingly, the insulation layer 170 and the second conductive oxide electrode 140 are spaced apart from each other to prevent the leakage current from being generated through the insulation layer 170, thereby improving electrical characteristics of the light emitting element The metal electrode 150 may serve to supply external power to the first conductive type semiconductor layer 121 and may include a metal material such as Ti, Pt, Au, Cr, Ni, Al, and the like. In addition, the metal electrode 150 may be composed of a single layer or multiple layers. The metal electrode pad 151 may be connected to a wire (not shown) such that external power can be supplied to the light emitting element through the wire.

The first conductive oxide electrode 180 may include first conductive oxide electrode extensions 182, 183, 184, 185 extending from the first electrode pads 151, 181. The first conductive oxide electrode extension 180 may further include a first conductive oxide electrode pad 181. In this case, the first conductive oxide electrode extensions 182, 183, 184, 185 may extend from the first oxide electrode pad 181.

The first conductive oxide electrode 180 may include a conductive material having light transmittance. In this exemplary embodiment, the first conductive oxide electrode 180 may include a light transmitting conductive oxide, and may include, for example, ZnO containing a dopant. The dopant may include at least one selected from among, for example, silver (Ag), indium (In), tin (Sn), zinc (Zn), cadmium (Cd), gallium (Ga), aluminum (Al), magnesium (Mg), titanium (Ti), molybdenum (Mo), nickel (Ni), copper (Cu), gold (Au), platinum (Pt), rhodium (Rh), iridium (Ir), ruthenium (Ru), and palladium (Pd). In one exemplary embodiment, the first conductive oxide electrode 180 may be formed of Ga-doped ZnO, i.e. GZO.

ZnO or GZO included in the first conductive oxide electrode 180 may be formed by various methods. The ZnO or GZO may be formed through various methods known in the art, for example, by sputtering, atomic layer deposition, vacuum deposition, electrochemical deposition, pulsed laser deposition, and the like. The first conductive oxide electrode 180 may include at least one of single crystal ZnO, single crystal GZO, polycrystalline ZnO, polycrystalline GZO, amorphous ZnO, and amorphous GZO. In addition, the first conductive oxide electrode 180 may be composed of a single layer or multiple layers. For example, the first conductive oxide electrode 180 may be composed of multiple layers including an undoped ZnO layer and a doped ZnO (for example, GZO) layer.

The first conductive oxide electrode extensions 182, 183, 184, 185 may at least partially electrically contact the first conductive type semiconductor layer 121 and may form ohmic contact with the first conductive type semiconductor layer 121. The first conductive oxide electrode extensions 182, 183, 184, 185 may be disposed in the exposed region of the first conductive type semiconductor layer 121 of the light emitting structure 120 to contact the first conductive type semiconductor layer 121. For example, the first conductive oxide electrode extensions 182, 183, 184, 185 are disposed on the upper surface of the first conductive type semiconductor layer 121 exposed around the mesa 120*m* so as to at least partially surround the mesa 120*m*. The first conductive oxide electrode extensions 182, 183, 184, 185 are spaced apart from the side surfaces of the mesa 120*m*. In addition, the first conductive oxide electrode extensions 182, 183, 184, 185 may be spaced apart from the side surfaces of the first conductive type semiconductor layer 121, but are not limited thereto. In some exemplary embodiments, sides surfaces of the first conductive oxide electrode extensions 182, 183, 184, 185 may be generally flush with the side surfaces of the first conductive type semiconductor layer 121.

In one exemplary embodiment, the first conductive oxide electrode extensions 182, 183, 184, 185 may include a first portion 182, a second portion 183, a third portion 184, and a fourth portion 185, as shown in FIGS. 41 to 43.

The first portion 182 extends from the first electrode pads 151, 181 toward the fourth side 104 of the light emitting element so as to be interposed between the third side surface 120*c* of the mesa 120*m* and the third side 103 of the light emitting element. The first portion 182 may extend in a direction different from the direction in which the metal electrode extension 153 extends from the metal electrode pad 151, for example, in an opposite direction to the direction in which the metal electrode extension 153 extends. The first portion 182 is connected to the first conductive oxide electrode pad 181, which is disposed under the metal electrode pad 151 and is electrically connected to the metal electrode pad 151. The first conductive oxide electrode pad 181 is formed to have a larger area than the metal electrode pad 151 such that the metal electrode pad 151 can be stably formed. The insulation layer 170 may be interposed between the first conductive oxide electrode pad 181 and the second conductive type semiconductor layer 125. A portion of the first conductive oxide electrode pad 181 may extend along the side surface of the mesa 120*m* and thus may electrically contact the first conductive type semiconductor layer 121 exposed around the mesa 120*m*. However, the first conductive oxide electrode pad 181 can be omitted. In this case, the first portion 182 contacts the metal electrode pad 151 so as to be electrically connected thereto.

The second portion 183 may extend from the first portion 182 along the fourth side 104 of the light emitting element. The second portion 183 may be interposed between the fourth side surface 120*d* of the mesa 120*m* and the fourth side 104 of the light emitting element. The third portion 184 may extend from the second portion 183 along the first side 101 of the light emitting element. The third portion 184 may be disposed between the first side surface 120*a* of the mesa 120*m* and the first side 101 of the light emitting element. The fourth portion 185 may also extend from the third portion 184 along the second side 102 of the light emitting element. The fourth portion 185 may be disposed between the second side surface 120*b* of the mesa 120*m* and the second side 102 of the light emitting element. In this exemplary embodiment, the fourth portion 185 does not extend to the region in which the metal electrode extension 153 is disposed. That is, the fourth portion 185 may be formed along a portion of the second side 102 of the light emitting element so as not to reach the periphery of the region in which the groove 120*g* of the mesa 120*m* is formed.

As such, the first conductive oxide electrode extensions 182, 183, 184, 185 are formed to be electrically connected to the first conductive type semiconductor layer 121 exposed around the mesa 120*m*, thereby enabling smooth current spreading around an outer periphery of the mesa 120*m*. More specifically, referring to FIG. 43, electric current applied upon operation of the light emitting element is mainly supplied through the first electrode 200 and the second electrode 160. This structure increases the probability that electric current is concentrated in a current path region CPR, which is composed of a set of lines L corresponding to a linear path between the first electrode 200 and the second electrode 160, and thus the remaining region excluding the current path region CPR has a low probability of spreading electric current. In this exemplary embodiment, since the first electrode 200 is electrically connected to the first conductive type semiconductor layer 121 through the extension contact portion 155, as shown in FIG. 43, electric current can be relatively inefficiently supplied to regions around the side 101, the third side 103, and the fourth side 104. According to this exemplary embodiment, the first conductive oxide electrode extensions 182, 183, 184, 185 are formed to at least partially surround the mesa 120*m*, whereby a current path can be smoothly formed even in a region composed of a set of lines corresponding to the linear path between the first conductive oxide electrode extensions 182, 183, 184, 185 and the second electrode 160. Accordingly, the light emitting element can have improved current spreading efficiency, whereby light emission efficiency of the light emitting element can be improved by minimizing a non-luminous region in the active layer 123. In addition, the light emitting element enables uniform spreading of electric current in the horizontal direction, thereby reducing the forward voltage Vf thereof.

Furthermore, the first conductive oxide electrode extensions 182, 183, 184, 185 have light transmittance such that light emitted from the light emitting structure 120 can be prevented from being absorbed by and lost in the first conductive oxide electrode extensions 182, 183, 184, 185. In a light emitting element according to one comparative example, wherein the first electrode has a metal electrode extension, which is disposed like the first conductive oxide electrode extensions 182, 183, 184, 185 according to this exemplary embodiment, the metal electrode extension causes light loss, thereby causing reduction in light output despite increase in current dispersion efficiency. On the other hand, the light emitting element according to this exemplary embodiment includes the first conductive oxide electrode extensions 182, 183, 184, 185 and thus can improve electrical characteristics while preventing light loss, thereby improving light output.

In particular, the first conductive oxide electrode extensions 182, 183, 184, 185 may include ZnO or GZO having high light transmittance or may be formed of ZnO or GZO, and thus, even when the first conductive oxide electrode extensions 182, 183, 184, 185 are formed to a relatively large thickness, it is possible to minimize light absorption and optical loss by the first conductive oxide electrode extensions 182, 183, 184, 185. For example, even though the first conductive oxide electrode extensions 182, 183, 184, 185 have a thickness of 200 nm or more, or 800 nm or more, the first conductive oxide electrode extensions 182, 183, 184, 185 may have a light transmittance of 90% or more, thereby minimizing optical loss. Furthermore, since the first conductive oxide electrode extensions 182, 183, 184, 185 can be formed to a relatively large thickness, the first conductive oxide electrode extensions 182, 183, 184, 185 have low electrical resistance, thereby enabling smoother current spreading. That is, according to this exemplary embodiment, the light emitting element has improved electrical characteristics and optical characteristics through the first conductive oxide electrode extensions 182, 183, 184, 185 including ZnO or GZO.

Referring again to FIGS. 41 to 47, the first conductive oxide electrode extensions 182, 183, 184, 185 may have a different line width than the metal electrode extension 151. A line width W1 of the metal electrode extension 151 may be larger than a line width W2 of each of the first conductive oxide electrode extensions 182, 183, 184, 185. However, since the metal electrode extension 151 is generally patterned through a lift-off process, there can be a limit in reduction of the line width W1 in consideration of process margin and the like. Since the first conductive oxide electrode extensions 182, 183, 184, 185 are patterned through etching, the first conductive oxide electrode extensions 182, 183, 184, 185 may have a line width W2 smaller than the line width W1 of the metal electrode extension 151. Therefore, the area of the first conductive type semiconductor layer 121 exposed around the mesa 120*m* for forming the first conductive oxide electrode extensions 182, 183, 184, 185 can be minimized, thereby minimizing reduction in area of the light emitting region caused by reduction in area of the mesa 120*m*. However, it should be understood that other implementations are also possible.

In various exemplary embodiments, the location of the first conductive oxide electrode 180 may be modified in various ways. FIGS. 50 to 64 are views of a first conductive oxide electrode 180 in a light emitting element according to various exemplary embodiments.

Figure 50:
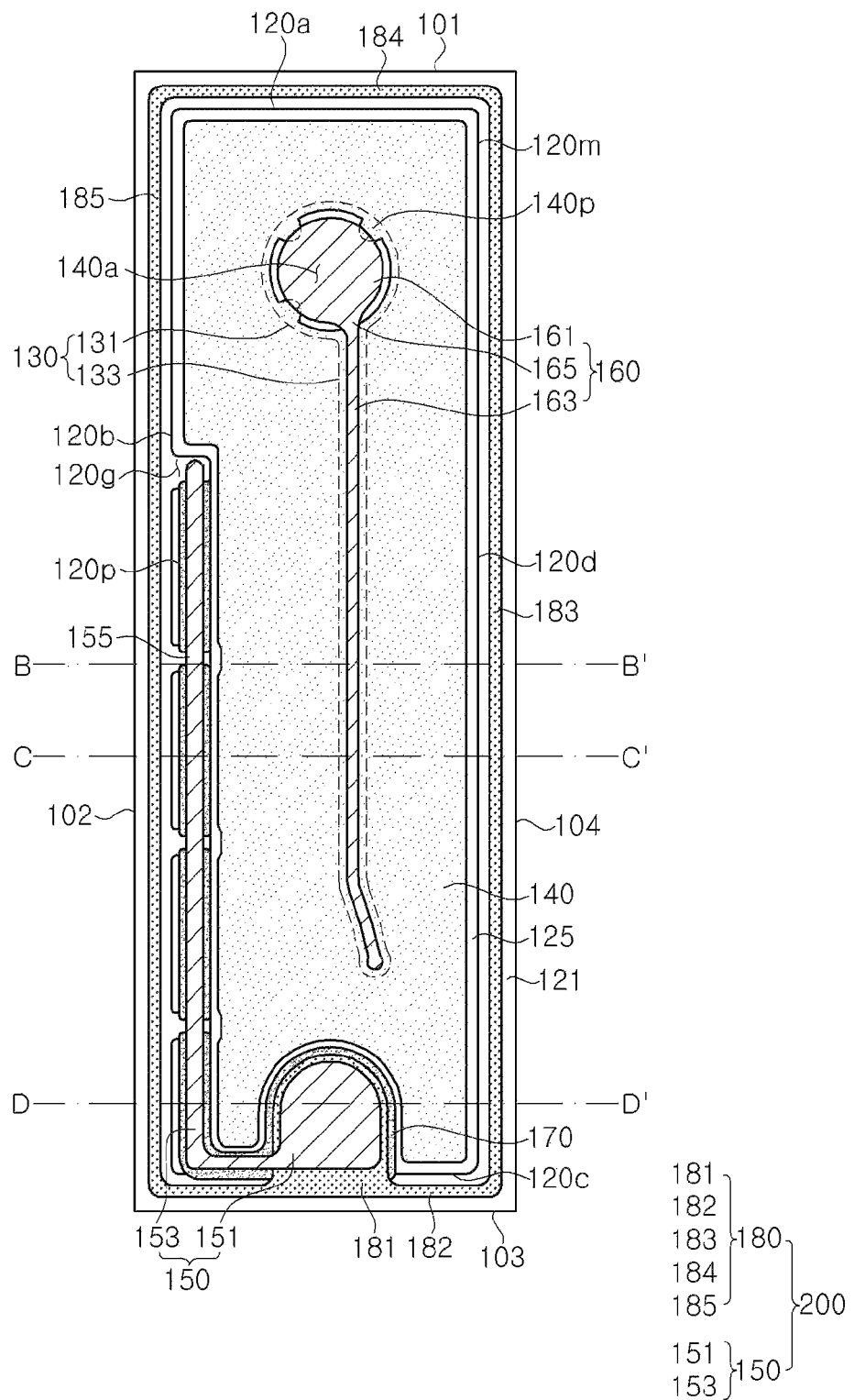
FIGS. 50 and 51 are plan views of a light emitting element according to other exemplary embodiments of the present disclosure.
Figure 51:
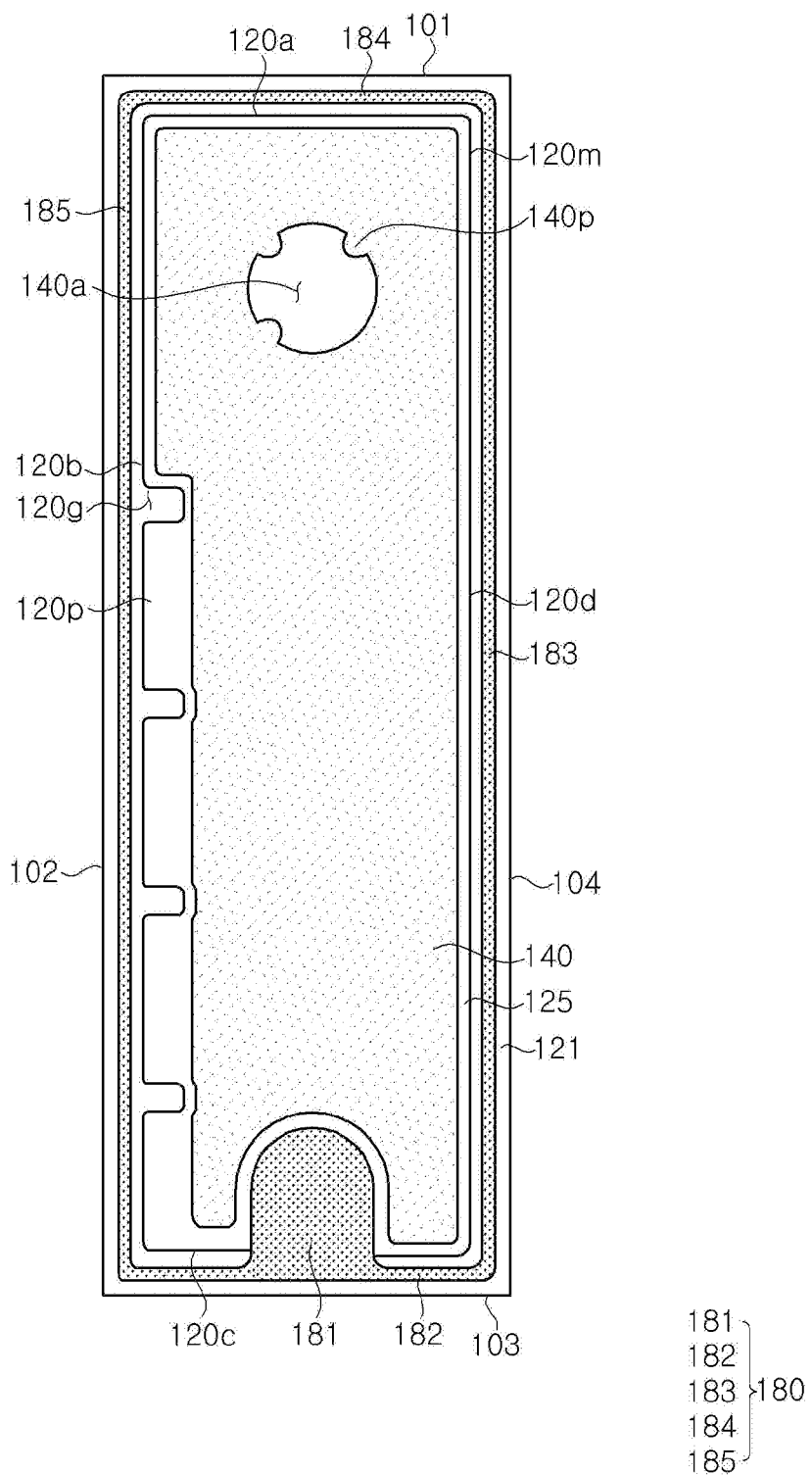
Figure 52:
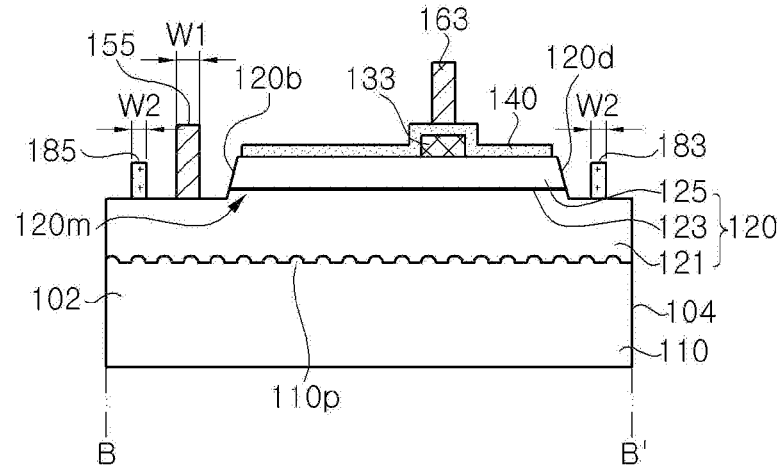
FIGS. 52 to 54 are cross-sectional views of a light emitting element according to other exemplary embodiments of the present disclosure.
Figure 53:
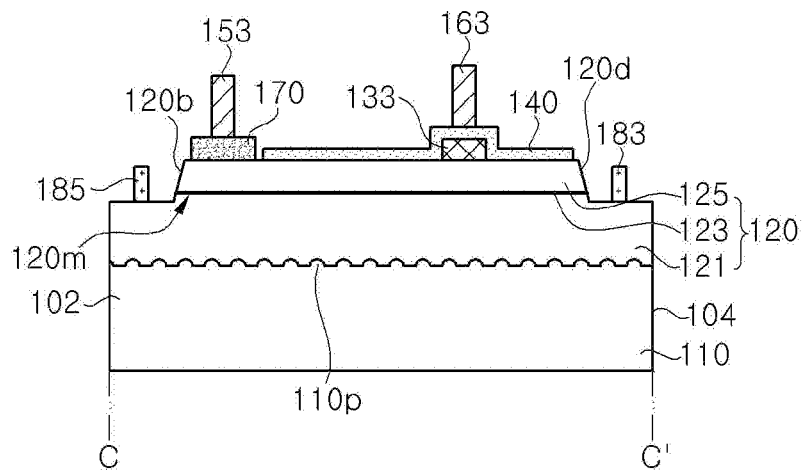
Figure 54:
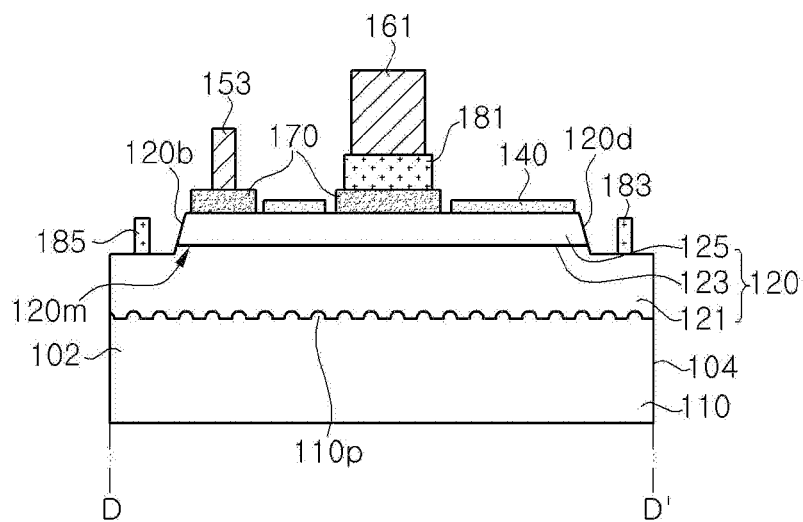
Figure 55:
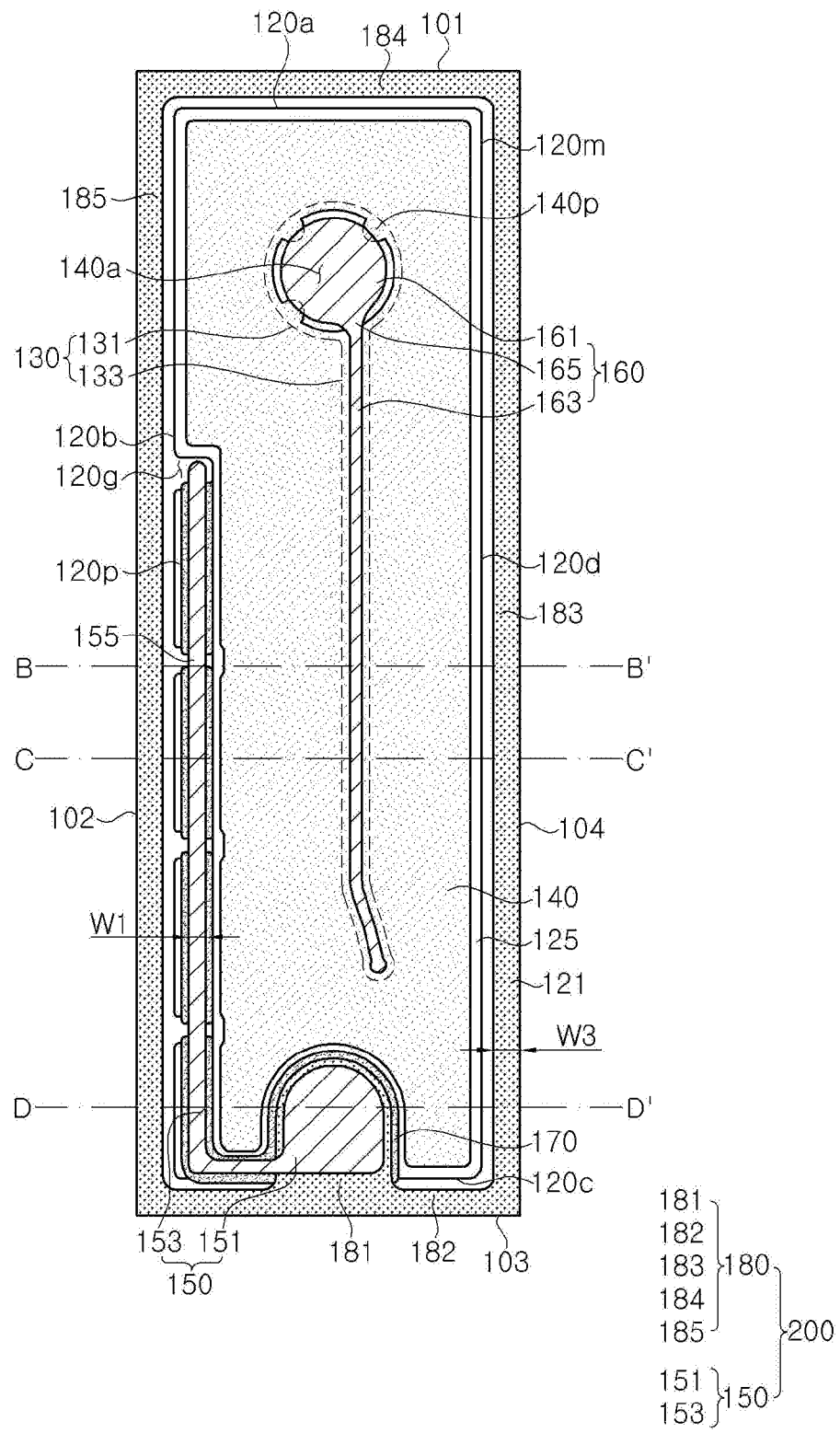
FIGS. 55 and 56 are plan views of a light emitting element according to other exemplary embodiments of the present disclosure.
Figure 56:
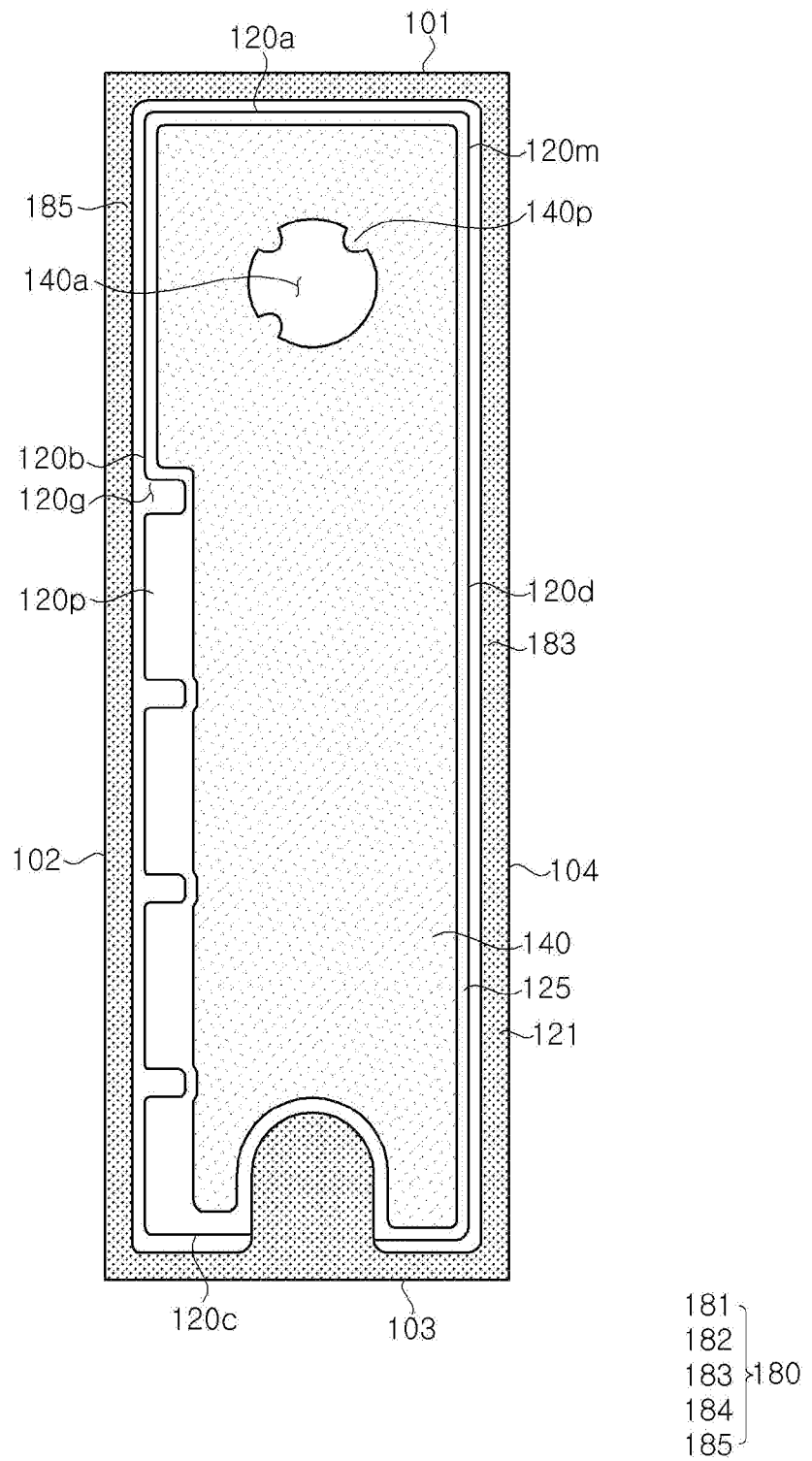
Figure 57:
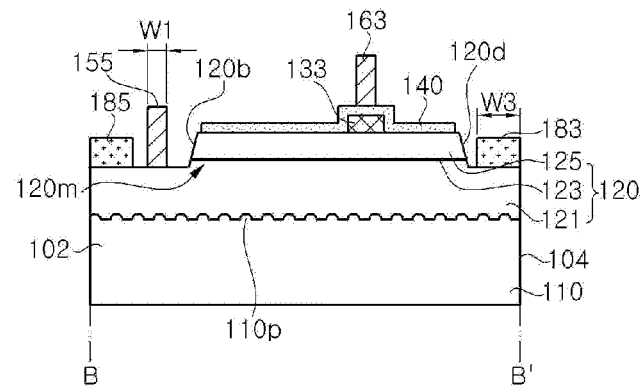
FIGS. 57 to 59 are cross-sectional views of a light emitting element according to other exemplary embodiments of the present disclosure.
Figure 58:
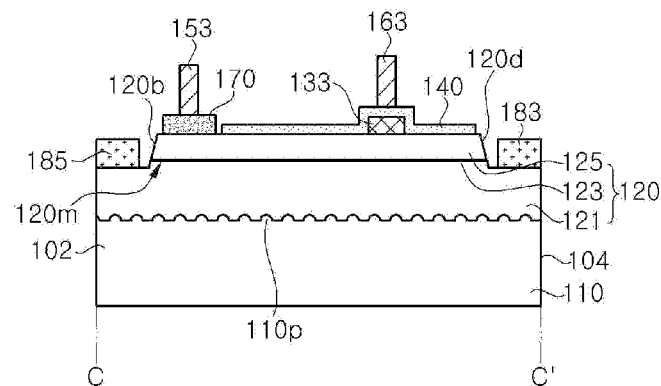
Figure 59:
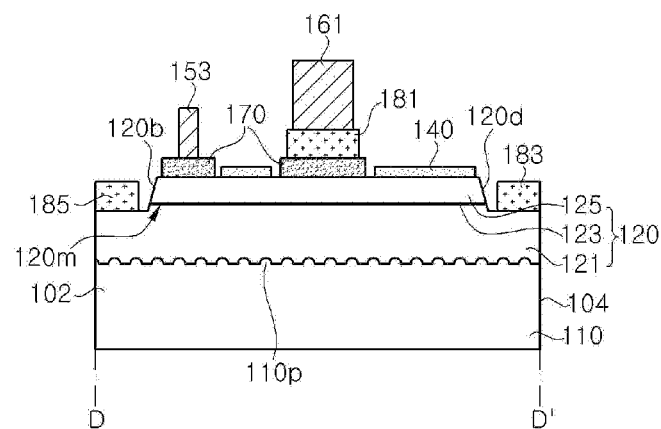
Figure 60:
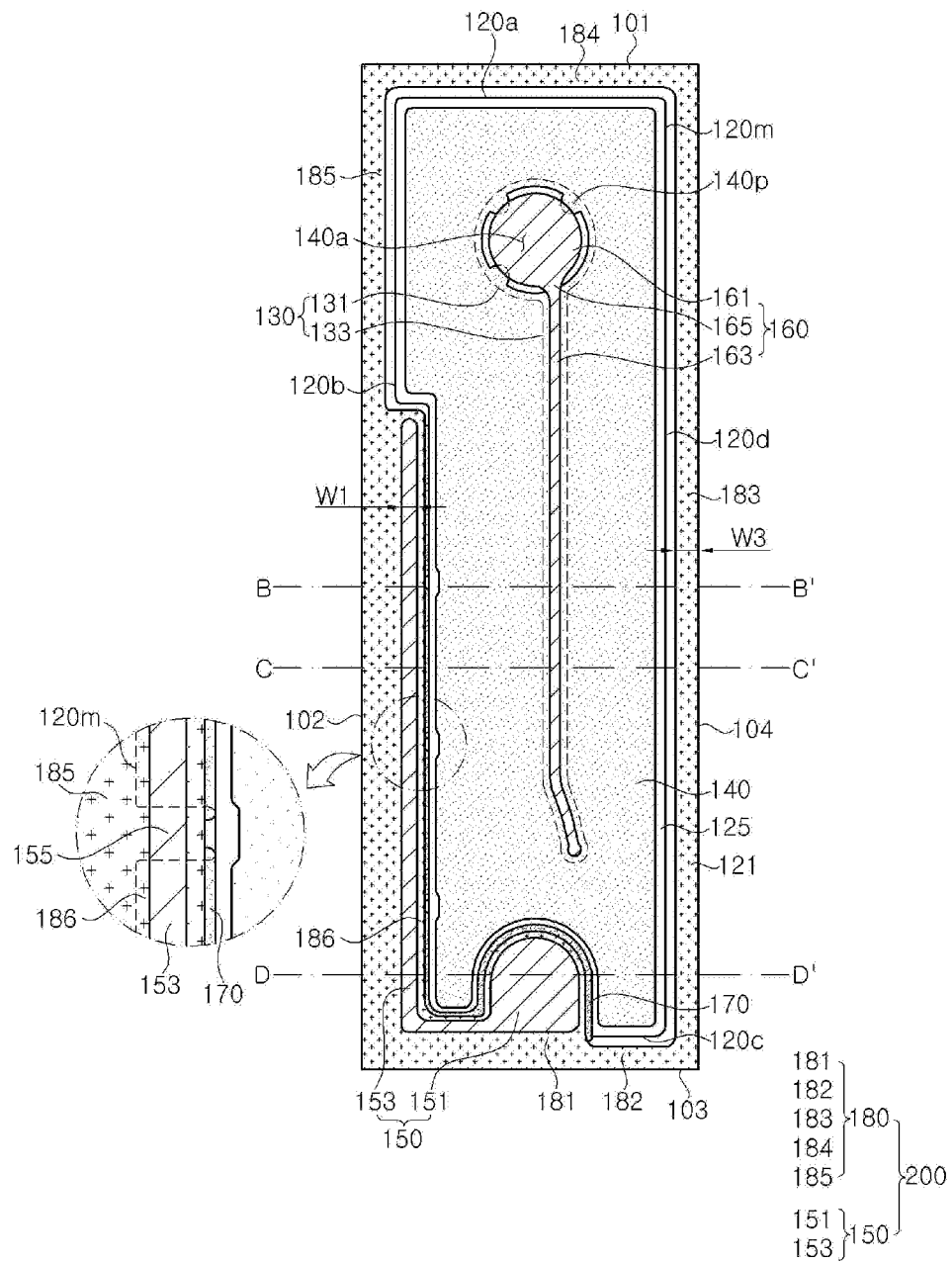
FIGS. 60 and 61 are plan views of a light emitting element according to other exemplary embodiments of the present disclosure.
Figure 61:
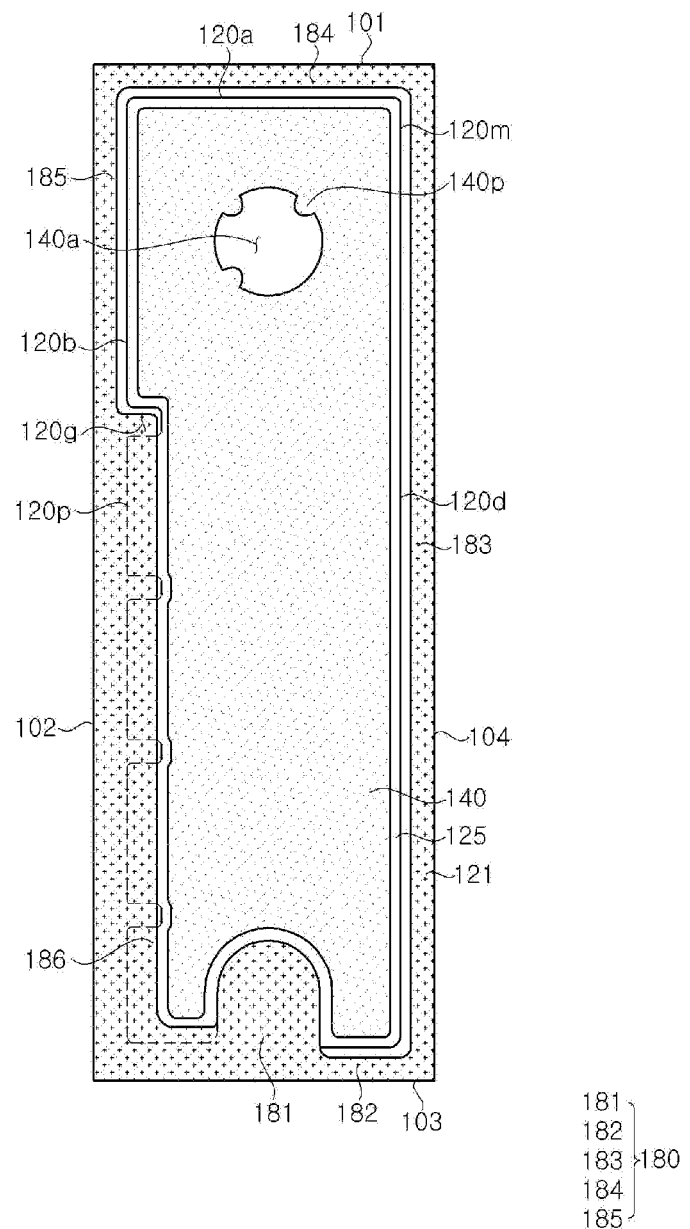

First, referring to FIGS. 50 to 54, the first conductive oxide electrode extensions 182, 183, 184, 185 of the first conductive oxide electrode 180 may be formed to surround the mesa 120*m*. Thus, the first conductive oxide electrode extensions 182, 183, 184, 185 may form a closed curve surrounding the mesa 120*m*. As shown in FIGS. 50 and 51, the fourth portion 185 may also be formed on the upper surface of the first conductive type semiconductor layer 121 exposed around the grooves 120*g* of the mesa 120*m*. The fourth portion 185 extends to the third side 103 of the light emitting element along the second side 102 thereof. The light emitting element according to this exemplary embodiment includes a plurality of first portions 182, in which two first portions 182 may extend from the first electrode pad 151, 181 towards the second side 102 and the fourth side 104, respectively. Accordingly, a direction in which at least one of the plural first portions 182 extends may be substantially the same as the direction in which the metal electrode extension 153 extends. The first portion 182 may be connected to the fourth portion 185, whereby the first conductive oxide electrode extension 182,183,184, 185 can be formed as a closed curve surrounding the mesa 120*m*.

According to this exemplary embodiment, since the first conductive oxide electrode extensions 182, 183, 184, 185 form a closed curve, the first conductive oxide electrode extensions 182, 183, 184, 185 do not include disconnected ends. Since the first conductive oxide electrode extensions 182, 183, 184, 185 are formed of a conductive oxide such as ZnO or GZO, the first conductive oxide electrode extensions 182, 183, 184, 185 can be peeled off at the ends thereof if they include the disconnected ends. In this exemplary embodiment, the first conductive oxide electrode extensions 182, 183, 184 185 do not include such ends, thereby preventing deterioration in reliability of the light emitting element due to damage to the first conductive oxide electrode extensions 182, 183, 184, 185.

In other exemplary embodiments, referring to FIGS. 55 to 59, the first conductive oxide electrode extensions 182, 183, 184, 185 of the first conductive oxide electrode 180 may be formed such that a side surface of each of the first conductive oxide electrode extensions 182, 183, 184, 185 is substantially coplanar, that is, flush, with the side surface of the first conductive type semiconductor layer 121. Accordingly, a line width W3 of each of the first conductive oxide electrode extensions 182, 183, 184, 185 according to this exemplary embodiment may be larger than the line width W2 of each of the first conductive oxide electrode extensions 182, 183, 184 according to the exemplary embodiments shown in FIGS. 41 to 54. Further, the line width W3 of each of the first conductive oxide electrode extensions 182, 183, 184, 185 may be larger than the line width W1 of the metal electrode extension 153.

According to this exemplary embodiment, the first conductive oxide electrode extensions 182, 183, 184, 185 may be formed to have a relatively large line width W3, thereby increasing a contact area between the first conductive oxide electrode extensions 182, 183, 184, 185 and the conductive type semiconductor layer 121. Accordingly, current supply through the first conductive oxide electrode extensions 182, 183, 184, 185 is further facilitated, thereby further improving current spreading efficiency. In addition, the first conductive oxide electrode extensions 182, 183, 184, 185 have a relatively larger line width W3, thereby reducing a probability of disconnection failure of the first conductive oxide electrode extensions 182, 183, 184, 185 during manufacture of the light emitting element.

In other exemplary embodiments, at least part of the first conductive oxide electrode extensions 182, 183, 184, 185, 186 may contact at least part of the metal electrode extension 153. The light emitting element according to this exemplary embodiment may include first conductive oxide electrode extensions 182, 183, 184, 185, 186 that further include a fifth portion 186. The fifth portion 186 is disposed under the metal electrode extension 153 and may contact the metal electrode extension 153. A portion of the fifth portion 186 may be interposed between the insulation layer 170 and the metal electrode extension 153. In addition, at least part of the fifth portion 186 may be interposed between the extension contact portion 155 and the first conductive type semiconductor layer 121 exposed through the groove 120g. Accordingly, the extension contact portion 155 does not form direct ohmic contact with the first conductive type semiconductor layer 121 and the fifth portion 186 forms ohmic contact with the first conductive type semiconductor layer 121, whereby electric current can flow to the metal electrode extension 153 through the fifth portion 186.

According to this exemplary embodiment, the metal electrode extension 153 is disposed on the first conductive oxide electrode extensions 182, 183, 184, 185, 186, particularly on the fifth portion 186. When the metal electrode extension 153 is disposed on the surface of the first conductive oxide electrode extensions 182, 183, 184, 185 and 186 formed of a conductive oxide, bonding properties are better than the case where the metal electrode extension 153 is disposed on the surface of the insulation layer 170 or the light emitting structure 120. Therefore, the metal electrode extension 153 can be stably formed and the probability of peeling is reduced, thereby improving stability and reliability of the light emitting element. In addition, ohmic contact characteristics with the first conductive type semiconductor layer 121 can vary depending upon a material forming the metal electrode extension 153 and a material forming the first conductive oxide electrode extensions 182, 183, 184, 185, 186. In some exemplary embodiments, contact resistance between the metal electrode extension 153 and the first conductive type semiconductor layer 121 is higher than contact resistance between the first conductive oxide electrode extensions 182, 183, 184, 185, 186 and the first conductive type semiconductor layer 121. Thus, in this case, with the structure wherein the first conductive oxide electrode extensions 182, 183, 184, 185, 186 are interposed between the first conductive type semiconductor layer 121 and the metal electrode extension 153, particularly the extension contact portion 155, electrical contact characteristics between the first electrode 200 and the first conductive type semiconductor layer 121 can be improved.

Referring again to FIGS. 41 to 47, the arrangement of the second electrode extension 163 and the size and locations of the grooves 120g of the mesa 120m may be controlled by taking current spreading efficiency of the light emitting element into account. For example, a distance A1 from the metal electrode extension 153 extending along the second side 102 of the light emitting element to the second electrode extension 163 is greater than a distance A2 from a distal end of the second electrode extension 163 to the first electrode pads 151, 181. The second electrode extension 163 extends toward the first electrode pads 151, 181 such that the distance from the second electrode extension 163 to the metal electrode extension 153 extending along the second side 102 can be kept substantially constant, thereby improving current spreading efficiency. In addition, with the structure wherein the distance A2 is smaller than the distance A1, the light emitting element can prevent deterioration in current spreading efficiency due to reduction in current density around the distal end of the second electrode extension 163. Further, a distance A3 from the distal end of the second electrode extension 163 to an outer periphery of the second conductive oxide electrode 140 (periphery disposed along the fourth side 104) may be substantially the same as the distance from a side surface of the second electrode pad 161 to the outer periphery of the second conductive oxide electrode 140 (periphery disposed along the fourth side 104). Here, the distance A3 may be about 50 µm to 60 µm. Further, the second electrode extension 163 may be further biased towards the fourth side 104 of the light emitting element than the second side 102 thereof. As shown in the drawings, the second electrode extension 163 is disposed closer to the fourth side 104 of the light emitting element than the second side 102 thereof and is separated a predetermined distance A4 from a longitudinal centerline (corresponding to line A-A') passing through the center of the light emitting element. The distance A4 may be about 14 µm to 18 µm. Since the metal electrode extension 153 is disposed adjacent to the second side 102, the second electrode extension 163 is disposed so as to be closer to the fourth side 104 than the second side 102, thereby improving current spreading efficiency.

Further, a width of a portion of the extension contact portion 155s of the metal electrode extension 153 contacting the first conductive type semiconductor layer 121, that is, a width B1 of the opening of the insulation layer 170, may be smaller than an interval B2 between the openings of the first electrode 170. The interval B2 may be adjusted so as to be at least three times the width B1 and, in this case, dispersibility of electric current injected through the extension contact portion 155 can be further improved.

Figure 66:
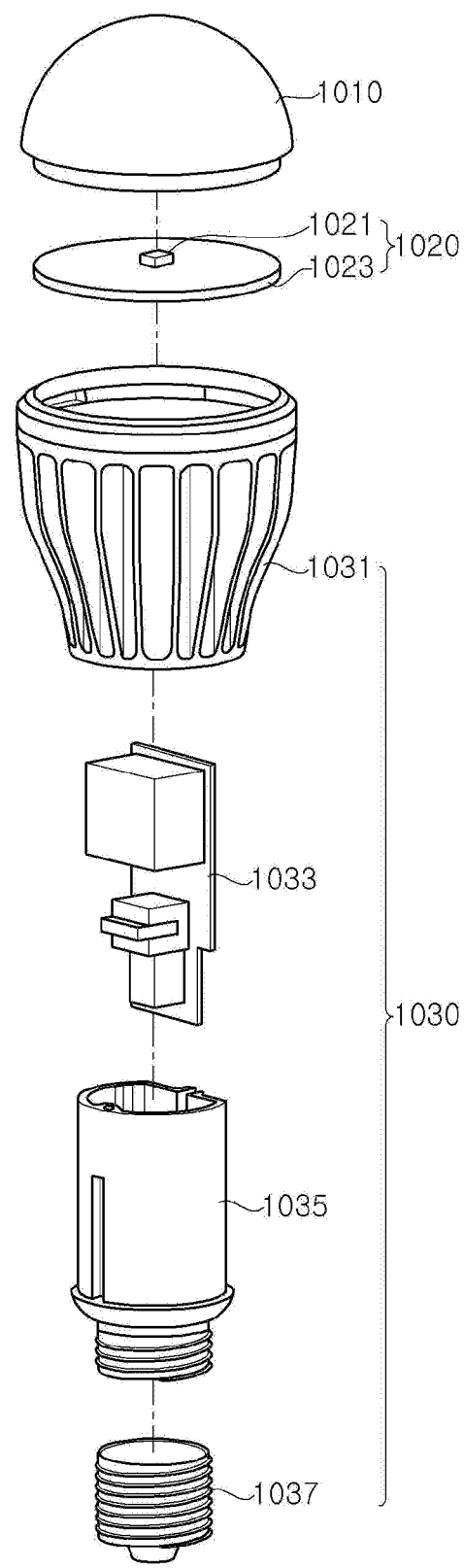
FIG. 66 is an exploded perspective view of an example in which a light emitting element according to exemplary embodiments of the present disclosure is applied to a lighting apparatus.

FIG. 66 is an exploded perspective view of an example in which a light emitting element according to exemplary embodiments of the present disclosure is applied to a lighting apparatus.

Referring to FIG. 66, the lighting apparatus according to this embodiment includes a diffusive cover 1010, a light emitting element module 1020, and a body 1030. The body 1030 may receive the light emitting element module 1020 and the diffusive cover 1010 may be disposed on the body 1030 to cover an upper side of the light emitting element module 1020.

The body 1030 may have any shape so long as the body can supply electric power to the light emitting element module 1020 while receiving and supporting the light emitting element module 1020. For example, as shown in the drawing, the body 1030 may include a body case 1031, a power supply 1033, a power supply case 1035, and a power source connection 1037.

The power supply 1033 is received in the power supply case 1035 to be electrically connected to the light emitting element module 1020, and may include at least one IC chip. The IC chip may regulate, change or control electric power supplied to the light emitting element module 1020. The power supply case 1035 may receive and support the power supply 1033, and the power supply case 1035 having the power supply 1033 secured therein may be disposed within the body case 1031. The power source connection 115 is disposed at a lower end of the power supply case 1035 and is coupled thereto. Accordingly, the power source connection 1037 is electrically connected to the power supply 1033 within the power supply case 1035 and can serve as a passage through which power can be supplied from an external power source to the power supply 1033.

The light emitting element module 1020 includes a substrate 1023 and a light emitting element 1021 disposed on the substrate 1023. The light emitting element module 1020 may be disposed at an upper portion of the body case 1031 and electrically connected to the power supply 1033.

As the substrate 1023, any substrate capable of supporting the light emitting element 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031.

The light emitting element 1021 may include at least one of the light emitting elements according to the exemplary embodiments described above.

The diffusive cover 1010 is disposed on the light emitting element 1021 and may be secured to the body case 1031 to cover the light emitting element 1021. The diffusive cover 1010 may be formed of a light-transmitting material and light orientation of the lighting apparatus may be adjusted through regulation of the shape and optical transmissivity of the diffusive cover 1010. Thus, the diffusive cover 1010 may be modified in various shapes depending on usage and applications of the lighting apparatus.

Figure 67:
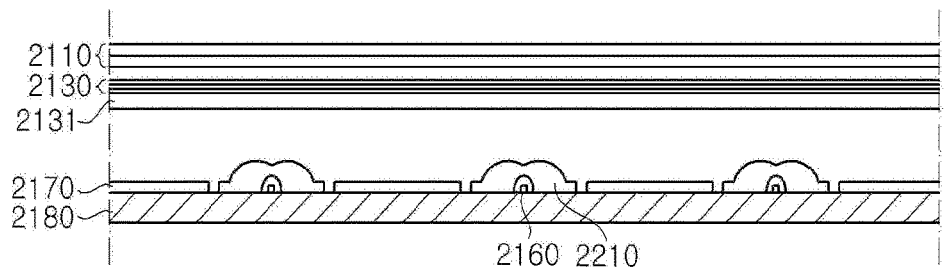
FIG. 67 is a cross-sectional view of one example of a display to which a light emitting element according to exemplary embodiments of the present disclosure is applied.

FIG. 67 is a cross-sectional view of one example of a display to which a light emitting element according to exemplary embodiments of the present disclosure is applied.

The display according to this embodiment includes a display panel 2110, a backlight unit supplying light to the display panel 2110, and a panel guide 2100 supporting a lower edge of the display panel 2110.

The display panel 2110 is not particularly limited and may be, for example, a liquid crystal panel including a liquid crystal layer. Gate driving PCBs may be further disposed at the periphery of the display panel 2110 to supply driving signals to a gate line. Here, the gate driving PCBs may be formed on a thin film transistor substrate instead of being formed on separate PCBs.

The backlight unit includes a light source module, which includes at least one substrate and a plurality of light emitting elements 2160. The backlight unit may further include a bottom cover 2180, a reflective sheet 2170, a diffusive plate 2131, and optical sheets 2130.

The bottom cover 2180 may be open at an upper side thereof to receive the substrate 2150, the light emitting elements 2160, the reflective sheet 2170, the diffusive plate 2131, and the optical sheets 2130. In addition, the bottom cover 2180 may be coupled to the panel guide. The substrate may be disposed under the reflective sheet 2170 to be surrounded by the reflective sheet 2170. Alternatively, when a reflective material is coated on a surface thereof, the substrate may be disposed on the reflective sheet 2170. Further, a plurality of substrates may be arranged parallel to one another, without being limited thereto. However, it should be understood that the light source module may include a single substrate.

The light emitting elements 2160 may include at least one of the light emitting elements according to the exemplary embodiments described above. The light emitting elements 2160 may be regularly arranged in a predetermined pattern on the substrate. In addition, a lens 2210 may be disposed on each of the light emitting elements 2160 to improve uniformity of light emitted from the plurality of light emitting elements 2160.

The diffusive plate 2131 and the optical sheets 2130 are disposed on the light emitting elements 2160. Light emitted from the light emitting elements 2160 may be supplied in the form of sheet light to the display panel 2110 through the diffusive plate 2131 and the optical sheets 2130.

In this way, the light emitting element according to the exemplary embodiments may be applied to direct type displays like the display according to this embodiment.

Figure 68:
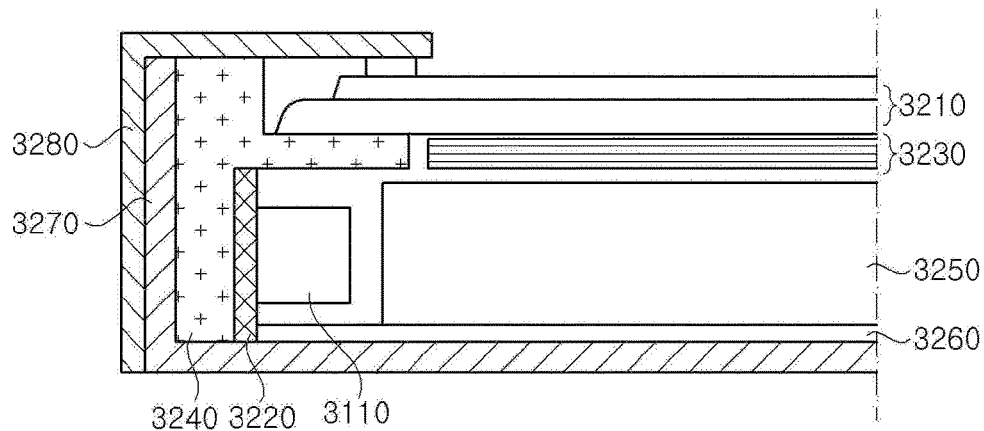
FIG. 68 is a cross-sectional view of another example of a display to which a light emitting element according to exemplary embodiments of the present disclosure is applied.

FIG. 68 is a cross-sectional view of one example of a display to which a light emitting element according to exemplary embodiments of the present disclosure is applied.

The display according to this exemplary embodiment includes a display panel 3210 on which an image is displayed, and a backlight unit disposed at a rear side of the display panel 3210 and emitting light thereto. Further, the display includes a frame 240 supporting the display panel 3210 and receiving the backlight unit, and covers 3240, 3280 surrounding the display panel 3210.

The display panel 3210 is not particularly limited and may be, for example, a liquid crystal panel including a liquid crystal layer. A gate driving PCB may be further disposed at the periphery of the display panel 3210 to supply driving signals to a gate line. Here, the gate driving PCB may be formed on a thin film transistor substrate instead of being formed on a separate PCB. The display panel 3210 is secured by the covers 3240, 3280 disposed at upper and lower sides thereof, and the cover 3280 disposed at the lower side of the display panel 3210 may be coupled to the backlight unit.

The backlight unit supplying light to the display panel 3210 includes a lower cover 3270 partially open at an upper side thereof, a light source module disposed at one side inside the lower cover 3270, and a light guide plate 3250 disposed parallel to the light source module and converting spot light into sheet light. In addition, the backlight unit according to this exemplary embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting elements 3110 arranged at constant intervals on one surface of the substrate 3220. As the substrate 3220, any substrate capable of supporting the light emitting elements 3110 and being electrically connected thereto may be used without limitation. For example, the substrate 3220 may include a printed circuit board. The light emitting elements 3110 may include at least one of the light emitting elements according to the exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting elements 3110 into sheet light.

In this way, the light emitting elements according to the exemplary embodiments may be applied to edge type displays like the display according to this exemplary embodiment.

Figure 69:
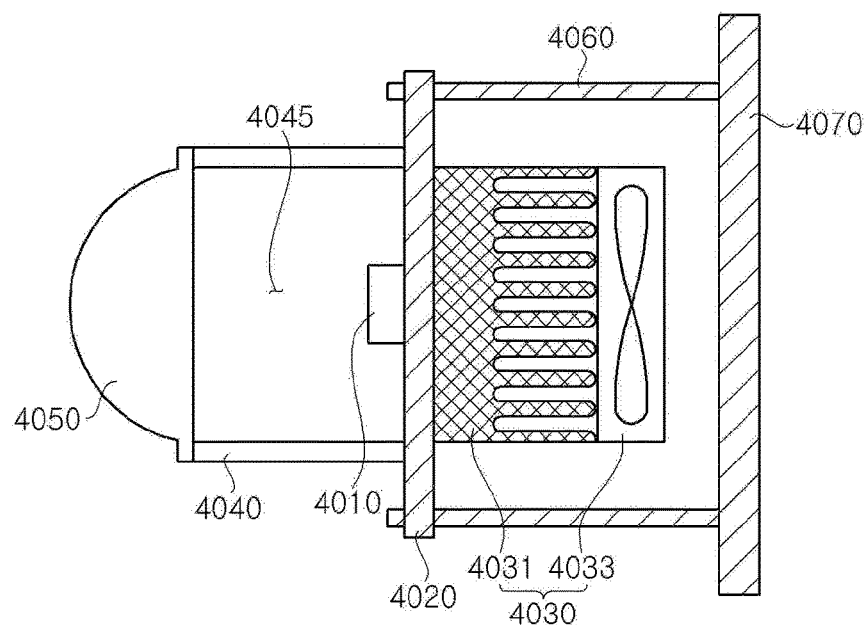
FIG. 69 is a cross-sectional view of a headlight to which a light emitting element according to exemplary embodiments of the present disclosure is applied.

FIG. 69 is a cross-sectional view of a headlight to which a light emitting element according to exemplary embodiments of the present disclosure is applied.

Referring to FIG. 69, the headlight according to this exemplary embodiment includes a lamp body 4070, a substrate 4020, a light emitting element 4010, and a cover lens 4050. The headlight may further include a heat dissipation unit 4030, a support rack 4060, and a connection member 4040.

The substrate 4020 is secured by the support rack 4060 and is disposed above the lamp body 4070. As the substrate 4020, any member capable of supporting the light emitting element 4010 may be used without limitation. For example, the substrate 4020 may include a substrate having a conductive pattern, such as a printed circuit board. The light emitting element 4010 is disposed on the substrate 4020 and may be supported and secured by the substrate 4020. In addition, the light emitting element 4010 may be electrically connected to an external power source through the conductive pattern of the substrate 4020. Further, the light emitting element 4010 may include at least one of the light emitting elements according to the exemplary embodiments described above.

The cover lens 4050 is disposed on a path of light emitted from the light emitting element 4010. For example, as shown in the drawing, the cover lens 4050 may be spaced apart from the light emitting element 4010 by the connection member 4040 and may be disposed in a direction of supplying light emitted from the light emitting element 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting element 4010, and thus can act as a light guide that provides a luminous path 4045. The connection member 4040 may be formed of a light reflective material or coated therewith. On the other hand, the heat dissipation unit 4030 may include heat dissipation fins 4031 and/or a heat dissipation fan 4033 to dissipate heat generated upon operation of the light emitting element 4010.

In this way, the light emitting elements according to the exemplary embodiments may be applied to headlights, particularly, headlights for vehicles, like the headlight according to this embodiment.

Although some exemplary embodiments have been described herein, it should be understood by those skilled in the art that these embodiments are given by way of illustration only, and that various modifications, variations and alterations can be made without departing from the spirit and scope of the present disclosure.

The invention claimed is:

1. A light emitting element comprising:
   a first conductive type semiconductor layer;
   a mesa disposed on the first conductive type semiconductor layer and comprising an active layer and a second conductive type semiconductor layer disposed on the active layer;
   a current blocking layer partially disposed on the mesa;
   a transparent electrode including a first region located on the current blocking layer to cover the current blocking layer and a second region located on the top surface of the mesa to cover the second conductive type semiconductor layer, the transparent electrode comprising an opening at least partially exposing the current blocking layer;
   an insulation layer partially disposed on the mesa;
   a first electrode disposed on the insulation layer to be insulated from the second conductive type semiconductor layer and comprising a first electrode pad and a first electrode extension extending from the first electrode pad; and
   a second electrode disposed on the current blocking layer and comprising a second electrode pad disposed on the opening of the transparent electrode and a second electrode extension extending from the second electrode pad,
   wherein the transparent electrode comprises a non-protrusion portion located on the mesa and separated from the current blocking layer and a protrusion portion protruding inwardly from a side surface of the opening as compared to the non-protrusion portion of the transparent electrode, at least part of the protrusion portion being interposed between the second electrode pad and the current blocking layer;
   wherein the mesa comprises at least one groove formed on a side surface thereof such that the first conductive type semiconductor layer is partially exposed through the groove;
   wherein the insulation layer at least partially covers a side surface of the groove; and
   wherein the first electrode extension comprises an extension contact portion contacting the first conductive type semiconductor layer through the groove.

2. The light emitting element according to claim 1, wherein the insulation layer covers a side surface of the active layer exposed through the groove.

3. The light emitting element according to claim 2, wherein the insulation layer further covers a top surface of the active layer exposed through the groove.

4. The light emitting element according to claim 1, wherein the insulation layer is spaced apart from the transparent electrode.

5. The light emitting element according to claim 1, wherein the at least one groove comprises a plurality of grooves separated from one another, the plurality of grooves being disposed on one side surface of the light emitting element.

6. The light emitting element according to claim 1, wherein the first electrode pad comprises a pad contact portion contacting the first conductive type semiconductor layer.

7. The light emitting element according to claim 6, wherein the pad contact portion and the at least one extension contact portion are disposed on one side surface of the light emitting element.

8. The light emitting element according to claim 1, wherein the insulation layer comprises at least one enlarged portion covering a side surface of the mesa around the first electrode pad.

9. The light emitting element according to claim 8, wherein a portion of the insulation layer disposed under the first electrode extension is disposed within a region defined by the side surface of the mesa.

10. The light emitting element according to claim 8, wherein the first electrode pad comprises a pad contact portion contacting the first conductive type semiconductor layer, the at least one enlarged portion comprises a plurality of enlarged portions that are spaced apart from one another, and the pad contact portion is disposed in a region between the plurality of enlarged portions.

11. The light emitting element according to claim 1, wherein the at least one groove has an arc shape in a plan view.

12. The light emitting element according to claim 1, wherein the current blocking layer comprises a pad current blocking layer disposed under the second electrode pad and an extension current blocking layer disposed under the second electrode extension, and the pad current blocking layer is at least partially exposed through the opening of the transparent electrode.

13. The light emitting element according to claim 12, wherein the side surface of the opening of the transparent electrode is disposed on the pad current blocking layer.

14. The light emitting element according to claim 12, wherein the side surface of the opening of the transparent electrode is spaced apart from the pad current blocking layer.

15. The light emitting element according to claim 12, wherein the transparent electrode is interposed between the second electrode extension and the extension current blocking layer.

16. The light emitting element according to claim 12, wherein an interface between the second electrode pad and the second electrode extension is located in a first portion on at least one of x (+), x (−), y (+) and y(−) axes or first to fourth quadrants in a coordinate system having an origin at a central portion of the pad current blocking layer and an x-axis and an y-axis that are perpendicular to each other, and the protrusion is located in a different portion that is different from the first portion, the different portion being on the at least one of the x (+), x (−),y (+) and y (−) axes or the first to fourth quadrants excluding the first portion.

17. The light emitting element according to claim 16, wherein the first electrode pad is disposed adjacent to one side of the light emitting element and the first electrode extension extends from the first electrode pad toward the other side of the light emitting element, and wherein the second electrode pad is disposed adjacent to the other side of the light emitting element and the second electrode extension extends from the second electrode pad toward the one side of the light emitting element.

18. A light emitting element comprising:
a first conductive type semiconductor layer;
a mesa disposed on the first conductive type semiconductor layer and comprising an active layer and a second conductive type semiconductor layer disposed on the active layer;
a current blocking layer disposed on the top surface of the mesa;
a transparent electrode including a first region located on the current blocking layer positioned to cover the current blocking layer and a second region located on the mesa to cover the second conductive type semiconductor layer, the transparent electrode comprising an opening at least partially exposing the current blocking layer;
an insulation layer partially disposed on the mesa;
a first electrode disposed on the insulation layer to be insulated from the second conductive type semiconductor layer and comprising a first electrode pad and a first electrode extension extending from the first electrode pad; and
a second electrode disposed on the current blocking layer and comprising a second electrode pad disposed on the opening of the transparent electrode and a second electrode extension extending from the second electrode pad, and
wherein the mesa comprises a groove formed on a side surface of the mesa such that the first conductive type semiconductor layer is partially exposed through the groove, the groove
wherein the first electrode extension comprises an extension contact portion contacting the first conductive type semiconductor layer through the groove; and
wherein the mesa has two different portions that have different widths from each other.

19. The light emitting element of claim 18, wherein the mesa has an edge along a longitudinal direction of the light emitting device, the edge having recessed portions that have a width less than that of non-recessed portions.

20. The light emitting element of claim 19, wherein at least one of the recessed portions has a non-curved boundary.

21. The light emitting element of claim 19, wherein at least one of the recessed portions has a curved boundary.

22. The light emitting element of claim 19, wherein the mesa is located inwardly from the first electrode extension in the recessed portions and the mesa is located outwardly from the first electrode extension in the non-recessed portions.

23. The light emitting element of claim 18, wherein the transparent electrode has two different portions that have different widths from each other.

* * * * *